United States Patent
Sato et al.

(10) Patent No.: US 6,313,392 B1
(45) Date of Patent: Nov. 6, 2001

(54) THERMOELECTRIC SEMICONDUCTOR MATERIAL, THERMOELECTRIC ELEMENT, METHOD OF MANUFACTURING THESE AND METHOD OF MANUFACTURING THERMOELECTRIC MODULE AND DEVICE FOR MANUFACTURING THERMOELECTRIC SEMICONDUCTOR MATERIAL

(75) Inventors: Yasunori Sato; Katsushi Fukuda, both of Hiratsuka; Keisuke Ikeda, Sendai; Kenichi Tomita, Hiratsuka; Takeshi Kajihara, Hiratsuka; Akio Konishi, Hiratsuka; Kiyoharu Sasaki, Hiratsuka, all of (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/414,509

(22) Filed: Oct. 8, 1999

(30) Foreign Application Priority Data

Oct. 12, 1998 (JP) .................................... 10-304757
Jun. 15, 1999 (JP) .................................... 11-168390

(51) Int. Cl.$^7$ .................................... H01L 35/34
(52) U.S. Cl. .................... 136/201; 136/203; 136/205
(58) Field of Search ................... 136/201, 203, 136/205, 239, 240

(56) References Cited

U.S. PATENT DOCUMENTS 6,043,424 * 3/2000 Horio et al. .................... 136/236.1

FOREIGN PATENT DOCUMENTS 4-293276 * 10/1992 (JP).

* cited by examiner

Primary Examiner—Bruce F. Bell
Assistant Examiner—Thomas H Parsons
(74) Attorney, Agent, or Firm—Varndell & Varndell, P

(57) ABSTRACT

Powder of a semiconductor material and solvent are packed into a rubber tube and both ends of the rubber tube are fixed by fixing rings in a condition with sealing in the vertical direction effected by an upper cover and a lower cover. After this, the rubber tube is immersed in an oil bath and pressure is applied uniformly from the side faces to the semiconductor material within the rubber tube, using hydraulic pressure. An extrusion molding of rectangular shape and of smaller cross sectional area than before molding is formed by extrusion from an extrusion port of rectangular solid shape of a die (extrusion mold) in which pressure is applied in an extrusion direction D by a punch to a rectangular solid sintered body of thermoelectric semiconductor material.

28 Claims, 32 Drawing Sheets

ERECTION AXIS
OF C FACES

MAGNIFIED VIEW

ERECTION AXIS
OF C FACES

MAGNIFIED VIEW

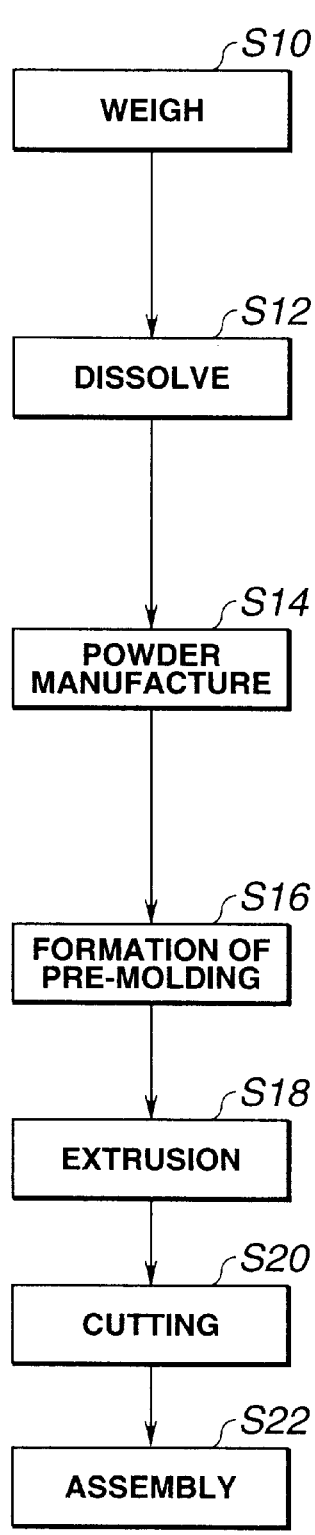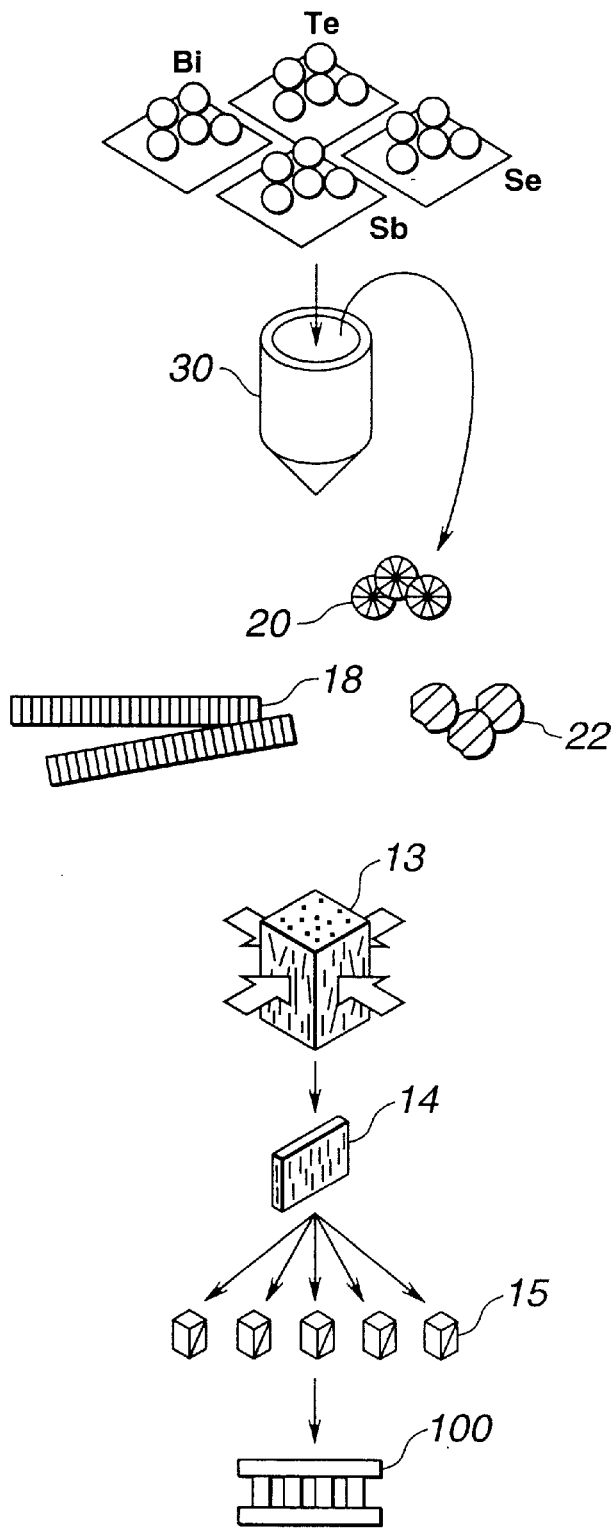
FIG.14

SINTERING STEP

SINTERED BODY 90° INVERTED

EXTRUSION STEP

CROSS-SECTIONAL AREA $A_1 = 17.5 \times 7.5$
CROSS-SECTIONAL AREA $A_0 = 30 \times 17.5$
EXTRUSION RATIO $A_0/A_1 = 4$

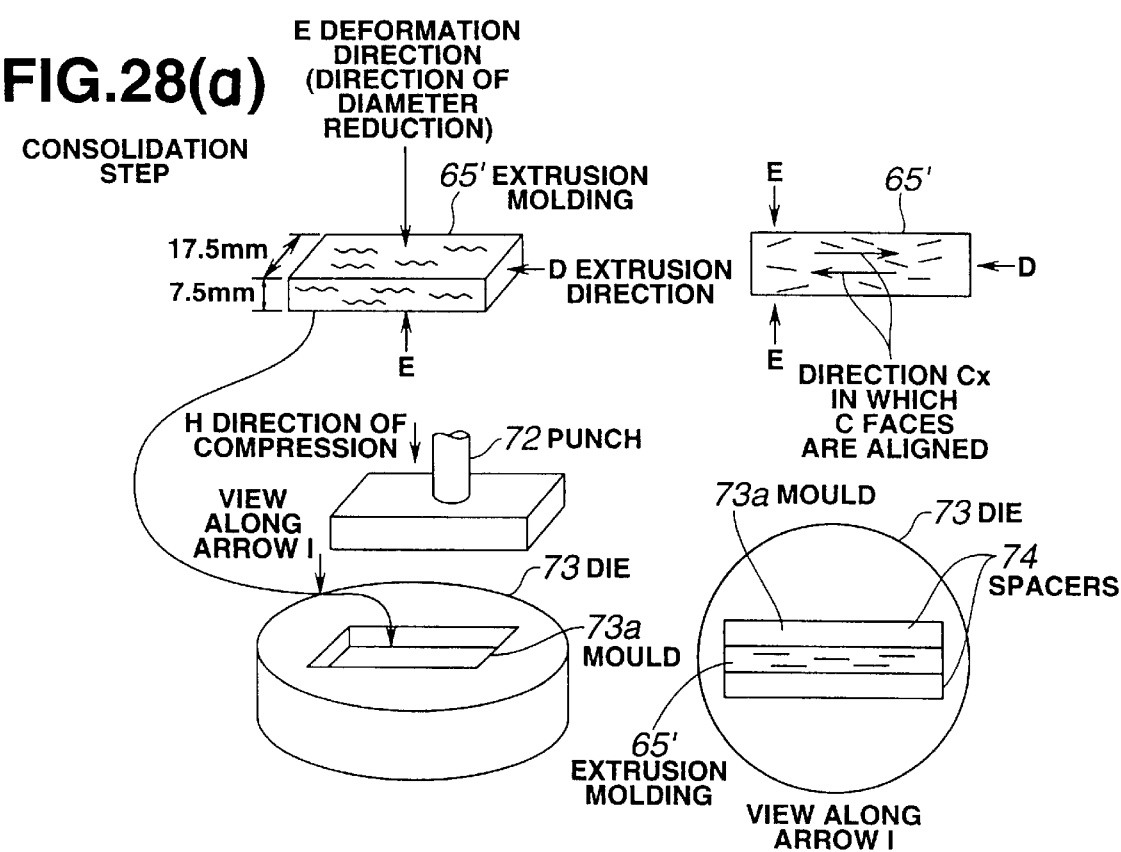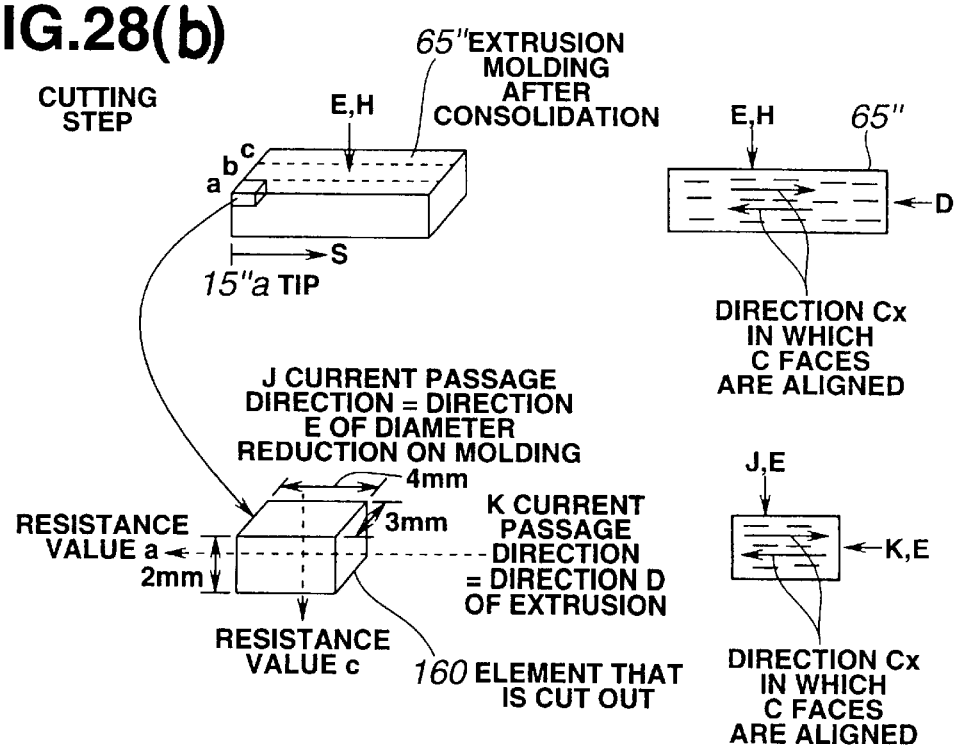

SINTERING STEP

EXTRUSION STEP

THERMOELECTRIC SEMICONDUCTOR MATERIAL, THERMOELECTRIC ELEMENT, METHOD OF MANUFACTURING THESE AND METHOD OF MANUFACTURING THERMOELECTRIC MODULE AND DEVICE FOR MANUFACTURING THERMOELECTRIC SEMICONDUCTOR MATERIAL

BACKGROUND OF THE INVENTION

1. Field of the Invention

The present invention relates to a thermoelectric semiconductor material, a thermoelectric element, a method of manufacturing these and a method of manufacturing a thermoelectric module and a device for manufacturing a thermoelectric semiconductor material, and, in particular, relates to a material, a method of manufacture, and a manufacturing device that effectively contribute to improvement of thermoelectric performance.

2. Description of the Related Art

Thermoelectric elements making use of the thermoelectric phenomenon have conventionally been utilized in heat exchangers and/or temperature sensors. The thermoelectric phenomenon is a general term for the Peltier effect, Thomson effect and Seebeck effect. These will be described as follows.

The Peltier effect is the phenomenon whereby, when current flows to a junction of different metals, heat is generated or absorbed at this junction; the Thomson effect is the phenomenon whereby when current is passed to metal having a temperature gradient, generation or absorption of heat occurs within this metal. A Peltier element which is used as an electronic cooler is a thermoelectric element utilizing the above Peltier effect.

The Seebeck effect is a phenomenon whereby an electromagnetic force is generated at the high-temperature side and low-temperature side of a sample when a junction of different metals is maintained at different temperatures; thermocouples that are employed as temperature sensors are thermoelectric elements utilizing this Seebeck effect. Since such thermoelectric elements are easy to handle and have a simple construction and stable characteristics, research and development is proceeding in many places aimed at applying these to temperature regulation of semiconductor lasers and small freezers.

As the material for forming such thermoelectric elements, alloys are currently employed comprising one or two selected from the group consisting of bismuth (Bi) and antimony (Sb) and one or more selected from the group consisting of tellurium (Te) and selenium (Se). These compounds are laminar structure compounds and constitute semiconductor materials having anisotropy in their thermoelectric characteristics produced by their crystal structure.

Various techniques such as unidirectional solidification, hot pressing, or extrusion are known in order to process the semiconductor material consisting of such a laminar structure compound in order to increase fineness of the crystal grains and the degree of their alignment.

Unidirectional solidification is a method of forming an ingot in which the direction of crystal growth is controlled; by this method, polycrystalline material of excellent alignment is obtained. As a specific example of the uniaxial solidification method, the Bridgeman method is known. However, polycrystalline materials produced by such uniaxial solidification methods are subject to the problem of poor material strength. The polycrystalline materials obtained by this method are therefore undesirable for use as thermoelectric semiconductor elements without modification.

Hot pressing is a method of producing polycrystalline material wherein improvement in the material strength is sought to be achieved by uniaxial compression of powder etc. of an ingot. The reason for applying uniaxial pressure is to forcibly align the crystal orientations by external pressure. By means of such methods, the problem referred to above of the material strength of the uniaxial method being weak is solved, and polycrystalline material of excellent alignment is obtained.

The extrusion method is a method wherein powder or material formed of this powder is introduced into a die and pressure molding is performed whilst extruding the material in this die using a punch. Prior art references disclosing this method of extrusion include Japanese patent application laid-open No. 138789/1988, Japanese patent application laid-open No. 186299/1996, and Japanese patent application laid-open No. 56210/1998. By means of this method, since a strong force is applied to the material as a whole, finer crystal grains can be obtained and material strength is also improved.

Consequently, hot pressing, cold pressing, and the extrusion method are currently widely employed as methods of manufacturing thermoelectric semiconductor elements, for reasons of alignment of the crystals and material strength.

However, in recent years, thermoelectric elements having even better thermoelectric properties are being demanded, and a novel technique in which the prior art described above is further developed is therefore sought.

A first object of the present invention is therefore to provide a thermoelectric semiconductor material or method of manufacturing an element and method of manufacturing a thermoelectric module which should be effective for improving thermoelectric performance.

Also, a thermoelectric element (thermoelectric module) employed in electronic cooling and thermoelectric power generation, as shown in FIG. 29, is constituted by forming PN element pairs by joining P-type semiconductors 110 and N-type semiconductors 120 through metallic electrodes 130, and arranging a plurality of these PN element pairs in straight rows; depending on the direction of the current flowing through the junction, heat is generated at one end while the other is cooled. For the material of such thermoelectric elements, materials are employed of large figure of merit Z ($=\alpha^2/\rho\kappa$) expressed by the Seebeck coefficient $\alpha$, resistivity $\rho$ and thermal conductivity $\kappa$, which are specific characteristics of the substance, in the temperature range of its utilization.

Most thermoelectric semiconductor materials possess anisotropy of thermoelectric performance due to their crystalline structure. Specifically, the figure of merit Z is different depending on crystal orientation. Single-crystal materials are therefore employed by passing current in a crystal orientation which gives large thermoelectric performance. In general, anisotropic crystals possess a tendency to cleavage and are of low material strength, so, as members for practical use, rather than single-crystal materials, polycrystalline materials wherein the crystal orientations are aligned to give large thermoelectric performance by uniaxial solidification using the Bridgeman method etc.

However, polycrystalline materials are still brittle in material strength albeit not to the degree of single-crystals, and so suffer from the problems of cracking or chipping of the elements during element processing.

Specifically, a polycrystalline material that is typically used for thermoelectric cooling elements is $Bi_2Te_3$ based thermoelectric material, which consists of a mixed crystal system of bismuth telluride ($Bi_2Te_3$), antimony telluride ($Sb_2Te_3$), and bismuth selenide ($Bi_2Se_3$). This $Bi_2Te_3$ based thermoelectric material is of hexagonal crystal structure, having a structure in which layers of Bi and layers of Te are laminated perpendicular to the hexagonal crystal C axis. Due to this crystalline structure, it possesses electrical and thermal isotropy, the thermoelectric performance being better in the direction of the C plane than in the direction of the C axis. Thermoelectric elements are therefore employed produced by ingots in which the direction of crystal growth is controlled to be the orientation which gives best thermoelectric performance, by a uniaxial solidification method. However, since, in regions where adjacent Te layers are laminated in the crystalline structure, the Te atoms are mutually coupled by Van der Waals forces, they are subject to severe cleavage. There were therefore the problems that yield was very poor due to occurrence of cracking or chipping in the-cutting step etc. to obtain the thermoelectric elements from this brittle crystalline material and that the thermoelectric elements (thermoelectric modules) did not possess durability.

There have therefore previously been attempts to obtain elements of improved material strength by sintering material obtained by crushing and pulverizing ingots (solidified material).

An enormous improvement in material strength is obtained as sintered materials have in fact no tendency to cleavage when compared with ingots, but, as compensation for this material strength, the alignment of crystal orientation is random or crystal orientation has only a gently sloping distribution so the degree of alignment is low, with the problem that thermoelectric performance (figure of merit Z) is inferior to that of ingots.

Thus, no thermoelectric semiconductor material previously existed possessing both fully satisfactory strength and thermoelectric performance. Accordingly, the present applicants have already applied for patents (Japanese patent application No. 2110624/1997, Japanese patent application No. 269389/1997) for inventions whereby thermoelectric semiconductor materials combining both fully satisfactory strength and thermoelectric performance are produced by undergoing a hot upset forging processing step, which is a kind of plastic deformation processing. Specifically, both strength and thermoelectric performance are improved compared with the conventional ingots or sintered materials by lining up the directions of the C planes by compressive external force by hot (upset) forging of a sintered body.

In recent years however, thermoelectric elements are being demanded having a finer structure with even better strength and close crystal alignment without necessarily being single crystals. Specifically, elements are being demanded wherein:

1) By conferring higher strength on the thermoelectric element, chipping and cracking are reduced and manufacturing yield is raised;
2) The directions of the crystals of the thermoelectric element are brought closer to a single direction and anisotropy of the thermoelectric performance is raised, thereby improving thermoelectric performance; and
3) By making the crystal grains even finer, the thermal conductivity κ is lowered, so improving thermoelectric performance (the figure of merit Z becomes larger as the thermal conductivity κ becomes smaller).

It should be noted that it is said that when the fineness of the crystalline structure is increased, the thermal conductivity κ falls.

Accordingly, as a method of processing having the capability to satisfy these demands, extrusion molding processing, which is a type of plastic deformation processing, may be considered. FIG. 30 shows a conceptual diagram of a prior art extrusion molding process. Inventions in which a thermoelectric element is manufactured by extrusion molding processing are disclosed in Japanese patent application laid-open No. 138789/1988, Japanese patent application laid-open No. 186299/1996, and Japanese patent application laid-open No. 56210/1998.

As shown in FIG. 30 in the extrusion processing described in these publications, by extruding from a cylindrical extrusion port 140a of a die (extrusion mold) 140 by applying a pressing force by means of a punch in the extrusion direction D on to a cylindrical sintered body 150 of thermoelectric semiconductor material, a cylindrical extrusion molding 150' of smaller diameter than before molding is formed.

In the extrusion molding process, plastic deformation is performed whilst subjecting the cylindrical sintered body 150 to external force from the entire peripheral direction L of the circumference in extrusion mold 140 (whilst compressing uniformly in the circumferential direction). As a result, the external force acting on the material within the metal mold is greater than in the case of hot forging, and force can more easily be applied to the entire material.

Consequently, destruction of crystals due to plastic deformation and dynamic recrystallization during molding occur very satisfactorily, resulting in increased fineness of the crystal grains compared with hot forging. Due to the increased fineness of the crystal grains, the thermal conductivity κ is lowered and thermoelectric performance is improved.

Also, since the degree to which external force is applied is better than in the case of hot forging, it is easier to align the C faces, increasing anisotropy and enabling thermoelectric performance to be improved.

Also, whereas, in the case of hot forging, the state of deformation is different at all the locations within the molding, resulting in scatter of the distribution of the thermoelectric characteristic, in the case of extrusion molding, there is little scatter of the distribution of the thermoelectric characteristic within the molding. Concomitantly with this reduction in scatter of the thermoelectric characteristic, the strength of the material is improved, thereby enabling the yield during manufacture to be increased.

By such extrusion processing, the above demands 1) to 3) can be met.

However, the conventional extrusion molding processing involves forming a cylindrical extrusion molding 150'. When a cylindrical extrusion molding 150' is formed, the following problems arise, which made it impossible to adopt the conventional extrusion molding process.

Specifically, with the conventional method, it is a presumption that the cylindrical extrusion molding 150' obtained by extrusion molding is further cut up into disc shapes, and the thermoelectric module is assembled from the disc-shaped thermoelectric elements obtained.

However, although of course the disc-shaped thermoelectric elements described above are sometimes used, in recent years thermoelectric elements cut into rectangular prism shape are mostly used for the thermoelectric modules that are manufactured. Since when rectangular solid thermoelectric elements are cut from a cylindrical extrusion molding 650' the remaining portions that are cut away from the rectangular prisms must be discarded yield is greatly lowered.

Also, during extrusion molding, impurities may adhere to the side face of the cylindrical extrusion molding 150', minute cracks may be formed therein, or lubricant may adhere thereto. These are also factors that increase the resistance and lead to a lowering in thermoelectric performance. They are also factors that cause a drop in strength.

It is therefore necessary to remove the cracks etc. or impurities adhering to the surface of cylindrical extrusion molding 150', and to clean it, in order to raise its strength and improve thermoelectric performance.

However, grinding by mechanical processing such as cutting of cylindrical material 90' involves considerable problems. Specifically, there is a risk in the number of steps being, multiplied, as, since cylindrical material 150', is used, the material must be mounted on a lathe and cut whilst the material is rotated so as to grind its surface. Furthermore, although strength is said to be improved, the material is still brittle, so when cutting processing is performed using a lathe there is a risk of the material being destroyed.

In practice therefore it was impossible to grind the surface of cylindrical extrusion molding 150' by mechanical processing.

Also, as described above, in the surface of an extrusion molding 150' obtained by conventional extrusion processing, minute cracks were formed. In order to eliminate the cracks, a step of raising the density of extrusion molding 150' is necessary. Specifically, a step of consolidating after the step of extrusion may be considered. A consolidation step is a step in which density is increased by compressing the extrusion molding by sealed forging by inserting the extrusion molding into a metal mold.

However, consolidating cylindrical extrusion molding 150' without disturbing the ordered alignment obtained by the extrusion is impossible with current technology.

Thus, if extrusion molding 150' is of cylindrical shape, there are the problems that the yield on cutting out rectangular solid thermoelectric elements is low, a surface grinding step is impossible in practice, and a consolidation step is also impossible in practice; it was therefore not possible to adopt the conventional extrusion molding processing method.

The present invention was made in view of the above and a second object thereof is to raise the yield of the step of cutting out rectangular solid thermoelectric elements and to make possible a surface grinding step and a consolidation step.

Incidentally, in the conventional extrusion molding processing method, an extrusion molding 150' of cylindrical shape of smaller diameter can be formed by drawing with uniform compression in the entire circumferential direction L of the circumference of a cylindrical sintered body 150.

The thermoelectric performance of a thermoelectric element is a maximum when the electric current or heat current flows in a direction in which the C planes at the basal face of the crystal (hexagonal crystalline structure) are lined up (horizontal direction to C planes) If the thermoelectric performance of the thermoelectric element is raised, the maximum temperature difference can be made large, enabling a thermoelectric module of good cooling to be efficiency obtained.

Lining up and aligning the C faces of the crystals constituting the structure in a specific direction during extrusion molding is therefore important.

However, as described above, the present inventors discovered that if the method of drawing while compressing uniformly a cylindrical sintered body 150 in the entire circumferential direction L of its circumference is adopted, it is difficult to get the C faces lined up in a specific direction.

Furthermore, if the method of drawing while uniformly compressing cylindrical sintered body 150 in the entire circumferential direction L of its circumference is adopted, impurities adhere to the surface of the side faces of cylindrical extrusion molding 150', fine cracks are formed, and lubricant can easily adhere thereto. These are factors that tend to cause increase in resistance and cause lowering of thermoelectric performance. They are also factors that cause lowered strength.

The present invention was made in view of the above circumstances and, in addition to solving the second object mentioned above, has a third object making it easy to line up the C faces in a specific direction and enabling cracks etc. of the extrusion molding surface to be reduced.

Incidentally, in the prior art extrusion molding processing method, a method may be adopted of forming an extrusion molding 150' by sintering the powder that constitutes the raw material of the thermoelectric semiconductor material, introducing this sintered body 150 into an extrusion mold 140, and extruding this to form an extrusion molding 150'.

In this case, the sintering step and extrusion step are as shown in FIG. 31.

Now, in the sintering step as shown in FIG. 31(a), the thermoelectric semiconductor material is inserted into a cylindrical mold and the material is compressed by applying pressure from the cylinder head in the direction of arrow B. Heating is simultaneously conducted so that the material is sintered to form a sintered body 150. In this process, C faces, which are the basal face of the crystals of hexagonal structure, are aligned in the perpendicular direction Cx with respect to the direction of compression B.

Next, in the extrusion step as shown in FIG. 31(b), pressurizing force is applied in the direction of arrow D to the cylinder head of cylindrical sintered body 150, causing sintered body 150 to undergo plastic deformation within extrusion mold 140 by being subjected to external force from its entire circumferential direction L of its circumference. As a result, extrusion molding 150' is formed. The basal faces constituting the C faces of the hexagonal crystal structure are then aligned in the horizontal direction Cx with respect to the extrusion direction D.

Consequently, the direction of lining up of the C faces differs by 90° as between the sintering step and the extrusion step and this makes lining up of the C faces difficult to achieve. As a result, even if current flows in the same direction as the extrusion direction with respect to extrusion molding 150', the demanded thermoelectric performance is not obtained.

The present invention was made in view of the above circumstances. In addition to the above second object and third object, it has a fourth object of improving thermoelectric performance by achieving coincidence of the direction of current flow and the direction in which the C faces are most strongly aligned by improving the degree of alignment of the C faces, by making the direction of pressure application in the pressurization step (sintering step) prior to the extrusion step coincide with the direction of pressure application during the extrusion step.

SUMMARY OF THE INVENTION

First of all, as the means for achieving the first object, the approach indicated below as adopted and is described herein.

First of all, the crystalline structure of the laminar structure compound which is the basic subject of the first invention of the present invention is described. A knowledge concerning crystalline structure is useful in understanding the present invention, so a detailed explanation thereof will now be given.

FIG. 1 is a diagrammatic perspective view illustrating the crystalline structure of a laminar structure chemical compound. This Figure illustrates the crystalline structure of a laminar structure chemical compound containing group V elements and group VI elements in two to three constituent ratio. Also, the crystalline structure shown in this Figure assumes, as group V elements, bismuth (Bi) and antimony (Sb) and, as VI group elements, selenium (Se) and tellurium (Te).

As shown in this Figure, a chemical compound of a group V element and a group VI element has a hexagonal crystal structure, the portion indicated by the hexagonal shape in the drawing being the basal face of the laminar structure chemical compound i.e. the crystal face called the C face. The laminar structure chemical compound has a structure in which a large number of these C faces are laminated in the C axis direction and which extends in the direction of the A axis and B axis.

Since carriers flow most easily in the direction parallel to these C faces, a single crystal of a laminar structure chemical compound can be said to be a material providing the highest electrical anisotropy. However, as described, since, in a laminar structure chemical compound, the bonding force between layers is weaker than the bonding force within a layer, the use of a single crystal in unmodified form as a thermoelectric material is undesirable from the point of view of material strength.

For example, in the case of a laminar structure chemical compound of the bismuth-tellurium type, since only the weak van de Waals coupling exist between the tellurium atoms, it has a marked tendency to cleavage and, in a condition close to a single crystal, its durability as a thermoelectric element is insufficient. Usually, therefore, polycrystals of laminar structure chemical compounds are employed as thermoelectric semiconductor materials.

FIG. 2 is a diagrammatic perspective view showing the structure of a polycrystal of a laminar structure chemical compound As shown in this Figure, a polycrystal of a laminar structure chemical compound is an assembly of minute crystal grains 10 and can have a material strength much superior to that of a single crystal.

Since phonons are scattered at the boundaries of the polycrystalline grains 10 (hereinbelow called "crystal grain boundaries"), a thermoelectric element formed of a polycrystal consisting of a plurality of crystal grains 10 tends to have a low thermal conductivity. Consequently, a polycrystal is a desirable structure from the point of view of thermoelectric performance also.

Furthermore, as described above, since carriers have the property of flowing more readily along the C faces of a laminar structure chemical compound, as shown in FIG. 2, the electrical resistivity is lowest in the condition (hereinbelow called "erect alignment") in which the C faces of the individual crystal grains 10 are all erect along the path of advancement of the carriers. Consequently, when a polycrystalline material is employed, it is important for improving the thermoelectric performance to achieve erect alignment of the crystal grains 10.

In this connection, the thermoelectric performance of a thermoelectric element is represented by the following equation:

$$Z = \alpha^2 \sigma / \kappa = \alpha^2 \rho / \kappa \quad (1)$$

where Z=figure of merit×10$^{-3}$ (1/K); a=Seebeck coefficient ($\mu$V/K); α=conductivity ($\mu\Omega^{-1} \cdot cm^{-1}$); κ=thermal conductivity (mW/cmK); and ρ=electrical resistivity ($\mu\Omega \cdot cm$).

By referring to the above equation, it can be seen that making the crystal grains 10 fine lowers the thermal conductivity κ and an erect alignment of crystal grains 10 lowers the resistivity ρ, these being associated with improved thermoelectric performance.

A type of erect alignment condition is realized by compressing a semiconductor material in a uniaxial direction by a uniaxial press such as a conventional hot press or cold press and, as a result, a lowering in resistivity ρ can be achieved.

FIG. 3 is a diagrammatic perspective view showing the general tendency of alignment of crystal grains produced by uniaxial pressing. The hexagonal objects shown in this Figure represent a simplification of the crystal grains 10 shown in FIG. 2; the hexagonal faces of these objects represent the C faces of crystal grains 10. As shown in this Figure, when pressure is applied in a uniaxial direction to the polycrystalline material, due to the pressure applied by external force, the crystal grains 10 contained in this polycrystalline material attempt to align themselves uniaxially in a certain direction.

The direction in which the crystal grains 10 are then aligned is a direction in which the C faces are orthogonal to the pressing direction. In fact, perfect alignment as shown in this Figure is not obtained, but polycrystalline material processed by a uniaxial press does tend to approach this condition.

Conventionally, lowering of the resistivity ρ was aimed at by setting the alignment direction of the C faces as shown in this Figure to the direction of current passage. However, the resistivity ρ of thermoelectric semiconductor elements manufactured by uniaxial pressing is much lower than anticipated, from which it is presumed that the alignment condition is quite far from the completely aligned condition shown in this Figure.

Accordingly, in a change of concept, instead of lining up the C faces in a fixed direction, consideration was given to the following condition, focusing on erecting the C faces relative to the direction of advance of the carriers.

FIG. 4 is a diagrammatic perspective view showing the condition of crystal grains aligned by free erection. As shown in this Figure, if the direction of advance of the carriers is taken to be the Z axis, if the C faces are in a condition in which they are erect along the Z axis (hereinbelow called "freely erected alignment"), irrespective of how the C faces of the crystal grains 10 are arranged with respect to the X axis and Y axis, the resistivity ρ can be lowered.

In this freely erected alignment, unlike the alignment in a fixed direction as shown in FIG. 3, there is a degree of freedom in that it does not matter how the C faces of crystal grains 10 are arranged with respect to the X axis and Y axis. Allowing such a degree of freedom makes possible application of steps departing from the rigid concept of the conventional uniaxial press.

When the creative activity was repeated adopting this viewpoint, the concept of "application of pressure from at least three directions orthogonal with respect to a single axis (i.e. the current passage direction)" was obtained. That is, since the C faces of the crystal grains have the property of facing the direction orthogonal to the direction of pressure application, if pressure is applied from a direction orthogonal to the direction of current passage, the C faces of the crystal grains will become lined up parallel to the direction of current passage.

That is, regarding the point "application of pressure from a direction orthogonal to the direction of current passage"

the same can be said as was stated in regard to conventional uniaxial pressing. However, the foregoing concept includes the specific concept of "application of pressure from at least three directions", which is different from a conventional uniaxial press. This concept of application of pressure from three directions is a concept that can only be applied by allowing the degree of freedom described above and could not easily have been thought of from a conventional uniaxial press.

Next, with the object of yet further improving the performance of thermoelectric semiconductor elements, the method of extrusion was further studied, and the results obtained are described below.

As mentioned above, the method of extrusion is an effective technique in improving fineness and alignment of the crystal grains. However, with the conventional extrusion method, although indeed increased fineness could be achieved, it was found that improvement in alignment was not achieved to the extent promised. The cause of this is thought to lie in the alignment characteristic of the extrusion material.

Specifically, the extrusion material employed in the extrusion method, as described above, is generally a material obtained by molding powder (hereinbelow referred to as a "pre-molding"). Since the crystal alignments of the powder are random, even if simply extruded, it is believed that these are in an unsatisfactory condition when molding takes place.

Accordingly, arrangements were studied in which extrusion was effected after lining up the crystal alignments of the pre-molding. The important factor in this respect is the relationship between the direction of alignment of the pre-molding and the direction of extrusion. Specifically, this is because, no matter how excellent the alignment characteristics of the pre-molding, if the pressure that is applied to the pre-molding during extrusion does not make use of the alignment characteristics of this pre-molding, it will on the contrary cause loss of crystal alignment.

Consequently, in order to define the relationship between the direction of alignment of the pre-molding and the extrusion direction, it is necessary to thoroughly understand the characteristics of the extrusion method.

As described above, the extrusion method is a method in which a polycrystalline material is introduced into a die and then extruded using a punch. Since the die that is employed for this extrusion has a shape that is constricted along the extrusion direction, the polycrystalline material passing through the die is compressed. That is, in the extrusion method, the polycrystalline material is subjected to a perpendicular resistive force from the wall surfaces of the die, as a result of which it is reduced in diameter in the direction orthogonal to the extrusion direction.

This is an important concept indicating that extrusion should result in the production of a free erect alignment as described above within the polycrystalline material. Noting this aspect, further consideration lead to the concept that if the crystal alignment of the pre-molding and the alignment created by extrusion could be made to coincide, this would act to effectively control the alignment produced by extrusion. That is, "the direction of crystal alignment of the pre-molding and the extrusion direction should be made to coincide".

The first invention of the present invention seeks to solve the aforementioned problem based on the two concepts described above, namely, the concept of "applying pressure from at least three directions orthogonal to a single axis" and "making the crystal alignment of the pre-molding and the extrusion direction coincide".

Also, in order to achieve the above second object, a method of manufacturing a thermoelectric semiconductor material according to a second aspect of the present invention includes an extrusion step wherein C faces of crystals constituting a structure are aligned in the extrusion direction by forming an extrusion molding of rectangular solid shape by extrusion from an extrusion mold by applying pressure to a thermoelectric semiconductor material having a desired composition.

In a method of manufacturing a thermoelectric semiconductor material according to a third aspect of the invention, in order to achieve the third object, there is included an extrusion step wherein a rectangular prismatic molding is formed and C faces of crystals constituting a structure are aligned in a direction perpendicular to the direction in which deformation was applied by extruding from an extrusion mold with pressure applied to a thermoelectric semiconductor material having a desired composition, deformation in one axial direction of two axes perpendicular to the extrusion direction being restrained while deformation is effected in the other axial direction.

In a method of manufacturing a thermoelectric semiconductor material according to a fourth aspect of the invention, in order to achieve the fourth object, there are included:

a step of pressure application to form a compressed powder body or a sintered body of thermoelectric semiconductor material by applying pressure to a thermoelectric semiconductor material having a desired composition; and an extrusion step wherein C faces of crystals constituting a structure are aligned in a direction perpendicular to the direction in which deformation is applied, by forming a rectangular solid extrusion molding by extrusion from a extrusion mold with pressure applied to said compressed powder body or said sintered body while restraining deformation in one axial direction of two axes perpendicular with respect to the extrusion direction and effecting deformation in an axial direction coincident with the direction of pressure application in said pressure application step.

A method of manufacturing thermoelectric semiconductor material according to a fifth aspect of the present invention, in a third aspect or fourth aspect of the present invention, further includes a step of consolidation in which the C faces of crystals constituting the structure are aligned in a direction perpendicular to the direction of pressure application and the density of said extrusion molding is raised by pressure application in an axial direction coincident with the axial direction in which deformation is applied in said extrusion step.

A method of manufacturing a thermoelectric element according to a sixth aspect of the present invention, in order to achieve the above second object, includes:

an extrusion step in which C faces of crystals constituting a structure are aligned in the extrusion direction by forming a rectangular solid extrusion molding by extruding from an extrusion mold by application of pressure with respect to a thermoelectric semiconductor material having a desired structure; and a thermoelectric element formation step wherein a rectangular solid thermoelectric element is formed wherein current flows in said extrusion direction from said rectangular solid extrusion molding.

A method of manufacturing a thermoelectric element according to a seventh aspect of the present invention, in order to achieve the above third object, includes:

an extrusion step wherein C faces of crystals constituting a structure are aligned in a direction perpendicular to the direction in which deformation is applied by forming a rectangular solid extrusion molding by extruding from an extrusion mold with pressure applied to a thermoelectric semiconductor material having a desired composition with deformation restrained in one axial direction of two axes perpendicular with respect to the extrusion direction, deformation being effected in the other axial direction; and a thermoelectric element formation step wherein a
rectangular solid thermoelectric element is formed wherein current flows in a direction perpendicular to the direction in which said deformation was applied from said rectangular solid molding.

A method of manufacturing a thermoelectric element according to an eighth aspect of the present invention, in order to solve the above fourth problem, includes:

a compression step of forming a compressed powder body or sintered body of thermoelectric semiconductor material by application of pressure to a thermoelectric semiconductor material having a desired composition;

an extrusion step wherein C faces of crystals constituting a structure are aligned in a direction perpendicular to that in which deformation was applied by forming a rectangular solid molding by extruding from an extrusion mold with pressure applied to said compressed powder or said sintered body with deformation restrained in one axial direction of two axes perpendicular with respect to the extrusion direction, deformation being effected in an axial direction coincident with the direction of pressure application in said pressure application step; and a step of forming a thermoelectric element wherein a rectangular solid thermoelectric element is formed in which current flows from said rectangular solid extrusion molding in a direction perpendicular to the direction in which said deformation was applied.

A method of manufacturing a thermoelectric element according to a ninth aspect of the present invention, in the seventh aspect or eighth aspect of the invention, includes:

a consolidation step wherein the C faces of crystals constituting a structure are aligned in a direction perpendicular to the direction in which pressure was applied and the density of said extrusion molding is raised by applying pressure in an axial direction coincident with the axial direction in which deformation is applied in said extrusion step.

A thermoelectric semiconductor material according to a tenth aspect of the invention, in order to achieve the above second object, comprises:

a thermoelectric semiconductor material formed as an extrusion molding of rectangular solid shape in which C faces of crystals constituting a structure are aligned in the extrusion direction by extruding from an extrusion mold with application of pressure to a thermoelectric semiconductor material having a prescribed composition.

A thermoelectric semiconductor material according to an eleventh aspect of the present invention in order to solve the above third problem, comprises:

a thermoelectric semiconductor material formed as a rectangular solid extrusion molding such that C faces of crystals constituting a structure are aligned in a direction perpendicular to the direction in which deformation was applied, by extruding from an extrusion mold with pressure applied to a thermoelectric semiconductor material having a desired composition with deformation restrained in one axial direction of two axes perpendicular with respect to the extrusion direction, deformation being effected in another axial direction.

A thermoelectric semiconductor material according to a twelfth aspect of the present invention, in order to solve the above fourth problem, comprises:

a thermoelectric semiconductor material formed as an extrusion molding of rectangular solid shape with C faces of crystals constituting a structure aligned in a direction perpendicular to the direction in which deformation was applied, by forming a compressed powder body or sintered body of thermoelectric semiconductor material by applying pressure to thermoelectric semiconductor material having a prescribed composition, further applying pressure to said compressed powder body or said sintered body, and extruding from an extrusion mold with deformation restrained in one axial direction of two axes perpendicular with respect to the extrusion direction, deformation being effected in an axial direction coincident with the direction in which pressure was applied in said pressure application step.

A thermoelectric element according to a thirteenth aspect of the present invention, in order to solve the third problem above, comprises:

a thermoelectric element wherein an extrusion molding of rectangular solid shape is formed with C faces of crystals constituting a structure aligned in the extrusion direction and in rectangular solid shape such that current flows in said extrusion direction from said rectangular solid extrusion molding, by extrusion from an extrusion mold with application of pressure to a thermoelectric semiconductor material having a desired composition.

A thermoelectric element according to a fourteenth aspect of the present invention, in order to solve the above third problem, comprises:

a thermoelectric element formed in rectangular solid shape wherein an extrusion molding of rectangular solid shape is formed with C faces of crystals constituting a structure aligned in a direction perpendicular to the direction in which deformation was applied and such that current flows in a direction perpendicular to the direction of application of said deformation from said rectangular solid extrusion molding by extrusion from an extrusion mold by applying pressure to a thermoelectric semiconductor material having a desired composition with deformation of one of two axes perpendicular to the extrusion direction being restrained while deformation is effected in the other direction.

A thermoelectric element according to a fifteenth aspect of the present invention, in order to solve problem above, comprises:

a thermoelectric element formed in rectangular solid shape wherein an extrusion molding of rectangular solid shape is formed with C faces of crystals constituting a structure aligned in a direction perpendicular to the direction in which deformation was applied and such that current flows in a direction perpendicular to the direction of application of said deformation from said rectangular solid extrusion molding by extrusion from an extrusion mold by forming a compressed powder body or sintered body of thermoelectric semiconductor material by applying pressure to a thermoelectric semiconductor material having a desired composition, and further applying pressure to said compressed powder body or said sintered body with deformation of one of two axes perpendicular to the extrusion direction being restrained while deformation is effected in an axial direction coincident with the direction of application of pressure.

A manufacturing device for a thermoelectric semiconductor according to a sixteenth aspect of the present invention, in order to solve the third problem above, comprises:

means for pressure application that apply pressure to a thermoelectric semiconductor material having a desired composition; and an extrusion mold in which an extrusion molding of rectangular solid shape is extrusion-molded by restraining deformation in one axial direction of two axes perpendicular with respect to the direction in which pressure is applied by said means for pressure application, whilst deformation is effected in the other axial direction.

Specifically, according to the method of manufacture of a semiconductor material according to the second aspect of the present invention, the method of manufacture of a thermoelectric element according to the sixth aspect of the present invention, the thermoelectric semiconductor material of the tenth aspect of the present invention and the thermoelectric element of the thirteenth aspect of the present invention, as shown in FIG. 23, an extrusion molding 65' of rectangular solid shape of cross sectional is smaller than that before molding is formed by extrusion from a rectangular solid extrusion port 64a of a die (extrusion mold) 64 in which pressure is applied to a rectangular solid sintered body 65 of thermoelectric semiconductor material in extrusion direction D by a punch 63.

In this extrusion molding process, plastic deformation is effected whilst external force is applied from the side face direction E to the rectangular solid within extrusion mold 64. The external force that acts on the material within the metal mold is therefore larger than in the case of hot forging, and the force is more easily applied to the whole material. As shown in FIG. 23, diameter reducing deformation may be applied in only one axial direction to the side face of sintered body 65 or, as shown in FIG. 23, diameter reducing deformation may be applied in both axial directions E and F to the side face of sintered body 65.

Consequently, destruction due to plastic deformation and dynamic recrystallization during molding are performed satisfactorily and better fineness of the crystal grains is obtained than with hot forging. Thanks to the increased fineness of the crystal grains, the thermal conductivity κ becomes lower and the thermoelectric performance is improved.

Also, the extent to which external force is applied is better than in the case of hot forging, so it is easier to line up the C faces, increasing anisotropy and enabling thermoelectric performance to be improved.

Also, although, in the case of hot forging, since the deformation conditions of the various parts within the molding are different, there is variability of the thermoelectric characteristics, if extrusion molding is used, there is little variability of the thermoelectric characteristics within the molding. Thus, concomitantly with the very ability of the thermoelectric characteristics being small, the material strength is improved, thereby increasing the yield during manufacture.

Furthermore, since extrusion molding 65" is formed of rectangular solid shape, as shown in FIG. 28(e), rectangular solid elements 160 can be efficiently cut, making possible an enormous increase in the manufacturing yield. Also, since the surface of rectangular solid molding 65' is flat, the surface can be very easily ground. Also, since the extrusion moldings 65" are of solid shape, as shown in FIG. 28(d), consolidation can be achieved by insertion of the extrusion moldings in a metal mold.

As described above, with the present invention, by utilizing the advantages of extrusion moldings, thermoelectric performance etc. can be improved compared with hot forgings and in addition the problems that occurred with conventional extrusion moldings can be overcome and the yield when cutting out rectangular solid thermoelectric elements can be raised, and a surface grinding step and a consolidation step become possible.

Also, with the method of manufacture of thermoelectric semiconductor material according to the third aspect and fifth aspect of the present invention, the method of manufacture of thermoelectric elements seventh aspect and ninth aspect of the present invention, the thermoelectric semiconductor material of the eleventh aspect of the present invention, the thermoelectric elements of the fourteenth aspect of the present invention, and the manufacturing a device for thermoelectric semiconductor material according to the sixteenth aspect of the present invention, as shown in FIG. 23, extrusion moldings 65' of rectangular solid shape of smaller cross sectional area than before molding can be molded by extruding from a rectangular solid extrusion port 64a of a die (extrusion mold) 64 in which pressure is applied in extrusion direction D by means of a punch 63 with respect to a sintered body 65 of rectangular solid shape of thermoelectric semiconductor material.

With this extrusion molding processing, deformation of rectangular solid sintered body 65 is effected in the other axial direction E whilst restraining deformation in one axial direction F of the two axes E and F perpendicular with respect to extrusion direction D in extrusion mold 64. Consequently, as shown in FIG. 27(c), the C faces become easy to line up in the direction Cx perpendicular to the direction E in which deformation was applied as shown in FIG. 27(c). Also, surface cracks of extrusion molding 65' are reduced.

It should be noted that the concept "thermoelectric semiconductor material" constituting the subject of the extrusion molding processing in the extrusion steps of the second aspect of the invention, the third aspect of the invention, the sixth aspect of the invention, the seventh aspect of the invention, the tenth aspect of the invention, the eleventh aspect of the invention, the thirteenth aspect of the invention, the fourteenth aspect of the invention and the sixteenth aspect of the invention includes the case where the raw materials of the thermoelectric semiconductor material are simply mixed, ingots solidified by uniaxial solidification after melting the mixed raw materials by heating, ingot powder obtained by crushing ingots, compressed powder bodies solidified by sintering powder obtained by crushing ingots by pressure, hot pressed products (pressure-sintered bodies) obtained by performing pressurization and sintering simultaneously on powder obtained by crushing ingots using a hot press device, press-sintered products obtained by sintering after pressing (powder pressing), or hot forged products obtained by hot forging.

Also, with the method of manufacturing a thermoelectric material according to the fourth aspect of the invention and fifth aspect of the invention, the method of manufacturing a thermoelectric element according to the eighth aspect of the invention or ninth aspect of the invention, the thermoelectric semiconductor material of the twelfth aspect of the invention or thermoelectric element of the fifteenth aspect of the invention, as shown in FIGS. 27(a), (b) and (c), a sintered body 65 is molded by applying pressure in a direction B to the thermoelectric semiconductor material in a sintering step. It should be noted that a compressed powder body could be formed simply by applying pressure to a thermoelectric semiconductor material without heating. In the extrusion step, a rectangular solid extrusion molding 65 of smaller cross-sectional area than before molding is formed by extrusion from a rectangular solid extrusion port 64a of a die (extrusion mold) 64 by applying pressure to a rectangular solid sintered body 65 in extrusion direction D by means of a punch 63.

In this extrusion molding processing, deformation is effected in axial direction E coincident with direction B of pressure application in the sintering step while deformation of rectangular solid sintered body 65 in the direction of axis F of the two axes E and F perpendicular to extrusion direction D in extrusion mold 64 is restrained.

Consequently, in the sintering step and extrusion step, the directions of lining up of the C faces produced by compression become coincident with the result that lining up of the C faces is facilitated. The degree of alignment of the C faces is thereby enormously improved, and, by making the direction in which the C faces are more strongly aligned coincident with the direction K in which current flows, thermoelectric performance is further improved.

With the inventions as described above, during molding processing, the thermoelectric semiconductor material may be heated so that it is in an optimum temperature range. Preferably this is a lower temperature than the Ulster re-crystallization temperature such that alignment is not lost by growth of crystal grains and there is no performance deterioration due to a sublimation of constituents. Also, preferably, it should not be such a low temperature that sintering cannot be achieved so solidification does not occur.

As the thermoelectric semiconductor material of the present invention, in particular $Bi_2Te_3$ based semiconductor materials or BiSb based semiconductor materials may be employed.

$Bi_2Te_3$ based semiconductor materials may be represented by $Bi_{2-x}Sb_xTe_{3-y-z}Se_yS_x (0 \leq x \leq 2, 0 \leq y+z \leq 3)$. Impurities may also be present in the crystals. Likewise, BiSb based semiconductor materials may be represented by $Bi_{1-x}Sb_x(0<x<1)$ and impurities as dopants may also be present in the crystals.

BRIEF DESCRIPTION OF THE DRAWINGS

FIG. 14 is a step diagram showing the manufacturing process of a thermoelectric module according to a practical example;

FIGS. 28(a) and 28(b) are view given in explanation of a consolidation step and cutting step of an embodiment;

DESCRIPTION OF THE PREFERRED EMBODIMENTS

A feature of the present invention devised based on the concepts described above is that pressure application to the semiconductor material including crystal grains of layer-form structure chemical compound is conducted from at least three directions orthogonal to one axis. This one axis is an axis corresponding to the direction of current passage of the thermoelectric semiconductor element; by application of pressure from directions orthogonal to this axis, the C planes of the crystal grains are made to approach a condition parallel with the direction of current passage.

Also, by application of pressure from at least three directions, free erect alignment of the crystal grains in the semiconductor material is produced, lowering the resistivity ρ. This free erect alignment is alignment with a comparatively high degree of freedom, unlike the uniaxial alignment achieved by the conventional uniaxial press.

Since a material having a free erect alignment as described above has high anisotropy of thermoelectric performance, it is useful as a thermoelectric semiconductor material. In addition, since it possesses crystal alignment similar to the crystal alignment achieved by the extrusion method, it is also useful as a material for extrusion. The present invention, in which free erect alignment is generated, can also be represented by a multiaxial press in contrast to the conventional uniaxial press.

A second feature of the present invention lies in making the erection axis of the C faces of the pre-molding coincide with the extrusion direction of this pre-molding. Since the extrusion method has the characteristic of erecting the C faces of the crystal grains in the extrusion direction of the pre-molding, if the axis of erection of the C faces of the pre-molding and the extrusion direction are made to coincide, the force acting on the crystal grains during extrusion matches the alignment of the crystal grains of the pre-molding, so an improvement in the degree of alignment can be expected.

(First aspect)

A first aspect of the present invention consists in the manufacture of a thermoelectric semiconductor material or thermoelectric semiconductor element having free erect alignment. A construction according to the first aspect of the present invention will now be described with reference to FIG. 5 through FIG. 9. In the following description, a thermoelectric semiconductor material or thermoelectric semiconductor element manufactured according to this first aspect will be termed a "pre-molding".

Figure 5:
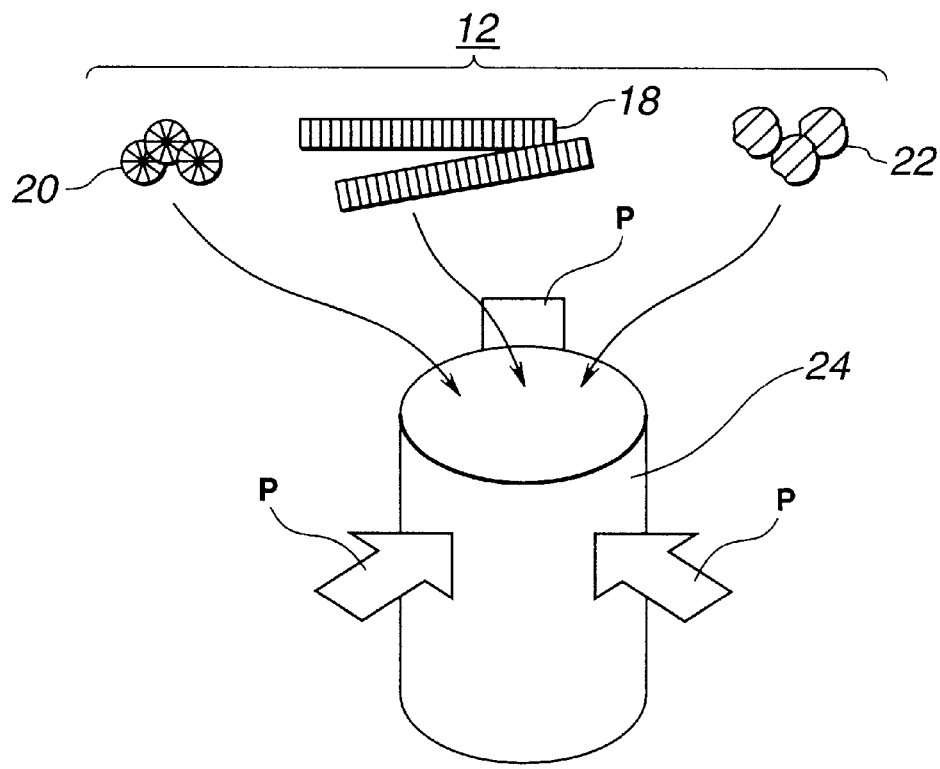
FIG. 5 is a diagrammatic perspective view showing the condition of execution of a step of forming a circular pre-molding.

FIG. 5 is a diagrammatic perspective view showing how a step in which a pre-molding of circular shape is formed is performed. As shown in this Figure, in the first aspect of the present invention, first of all, the semiconductor material 12 is subjected to pressure from at least three directions orthogonal with the one axis. It is assumed that the material periphery 24 of this semiconductor material 12 is of cylindrical shape. Specifically, the side walls of this cylindrical shape are subjected to pressure from at least three directions orthogonal to the central axis of this cylindrical shape.

This application of pressure may be performed with the upper surface and lower surface of the cylindrical shape in a free condition, or may be performed with movement in the vertical direction of semiconductor material 12 being restrained by the provision of supports at the upper face and lower face of the cylindrical shape. If application of pressure is performed with movement in the vertical direction restrained, the compression ratio is higher since elongation of the material due to compression is suppressed; a more rigid molding is therefore obtained.

As shown in this Figure, the concept of semiconductor material 12 includes: thin powder 18 manufactured by a quench rolling method, spherical-shaped powder 20 manufactured by a quench solidification method such as a centrifugal atomizing method, and crushed powder 22 manufactured by crushing an ingot obtained by a uniaxial solidification method.

These materials constitute laminar structure chemical compounds as described above: thin powder 18 consists of polycrystalline thin film in which the C faces of the crystal grains are aligned perpendicularly with respect to the film thickness; spherical powder 20 consists of polycrystalline grains in which the C faces of the crystal grains are aligned radially; and crushed powder 22 consists of polycrystalline powder in which the C faces of the crystal grains are aligned in a fixed direction. These polycrystalline materials are all materials that are well known in the field of thermoelectric semiconductors, so a detailed description of their methods of manufacture is omitted.

As shown in this Figure, preferably the directions P of pressure application to semiconductor material 12 are set radially with respect to the central axis of this cylindrical shape and even more preferably pressure is applied uniformly over the entire circumference of its side face. The "side face" means the face that surrounds the central axis. Methods whereby pressure may be applied uniformly over the entire circumference of the side face of the cylindrical shape are described in detail in the following practical examples.

Figure 6A:
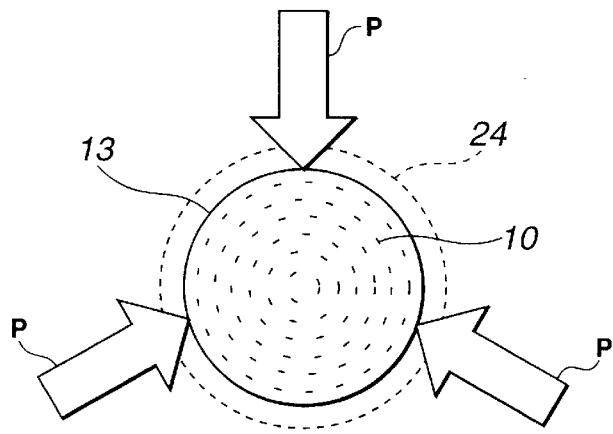
FIGS. 6(a) and 6(b) are diagrams showing the alignment condition of a pre-molding obtained by the step shown in FIG. 5.
Figure 6B:
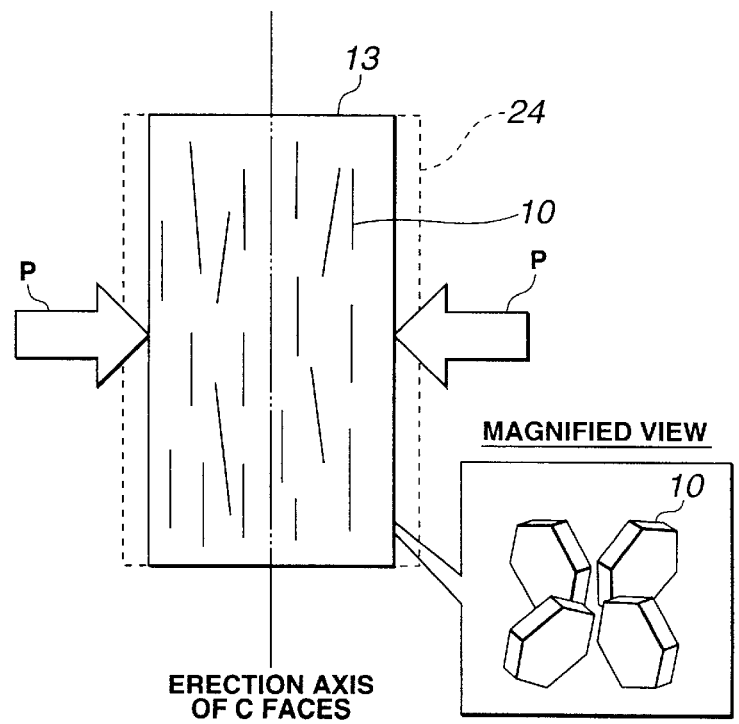

FIG. 6 is a diagram showing the alignment condition of a pre-molding obtained by the step shown in FIG. 5. FIG. 6(a) is a plan view of FIG. 5 and FIG. 6(b) is a side view of FIG. 5. As shown in FIGS. 6(a) and 6(b), in the pre-molding 13 obtained by the step of FIG. 5, the material outer edge 24 becomes a shape that is compressed by the application of pressure.

As a result, crystal grains 10 are erected in the direction orthogonal to the direction in which pressure is applied and the central axis of the cylindrical shape becomes the axis of erection of the C faces of the crystal grains 10. Thus, in the pre-molding 13 which is obtained, as shown in the view to a larger scale provided by FIG. 6(b), the crystal grains 10 assume a freely erected aligned condition.

If the above pressure application is performed whilst heating, pre-molding 13 becomes a sintered body and can be used without modification as a thermoelectric semiconductor element, performing cutting if necessary. Also, if a pre-molding 13 obtained in this step is used as an extrusion material, a thermoelectric semiconductor of a high degree of alignment can be obtained. Examples of this will be described later.

Figure 7:
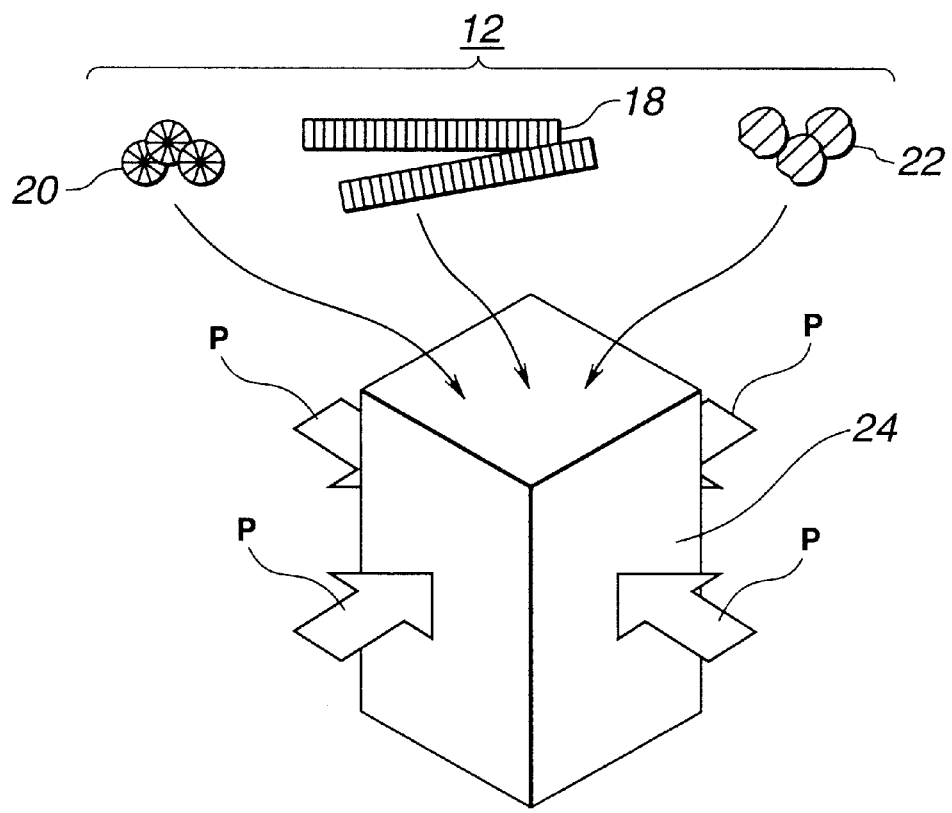
FIG. 7 is a diagrammatic perspective view showing how a step of forming a rectangular pre-molding is performed.

FIG. 7 is a diagrammatic perspective view showing how a step of forming a rectangular pre-molding is carried out. As shown in this Figure, the present invention can be applied also in the case where material periphery 24 of semiconductor material 12 is rectangular. In this case, the directions P of pressure application are set as all the side faces of the rectangle. For example, as shown in this Figure, if material periphery 24 of semiconductor material 12 is rectangular solid, the respective pressure application directions P are set at the four side faces of this rectangular prism. Likewise, if material periphery 24 is a polygonal prism such as a pentagonal prism or hexagonal prism, a free erect alignment of the crystal grains can be produced by setting respective pressure application directions P at the side faces of this polygonal prism.

Figure 8A:
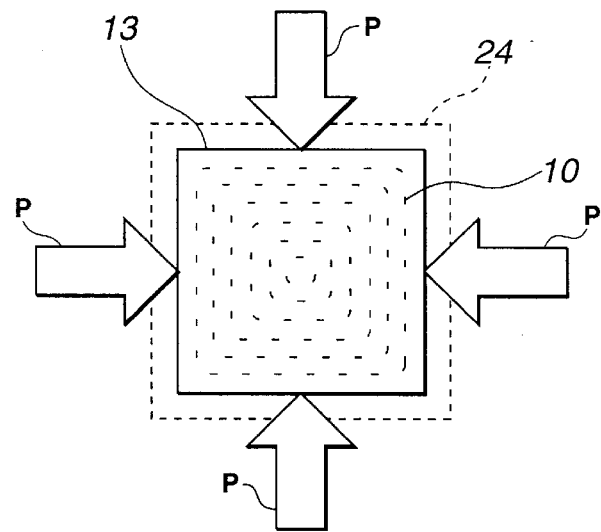
FIGS. 8(a) and 8(b) are diagrams showing the condition of alignment of a pre-molding obtained by the step shown in FIG. 7.
Figure 8B:
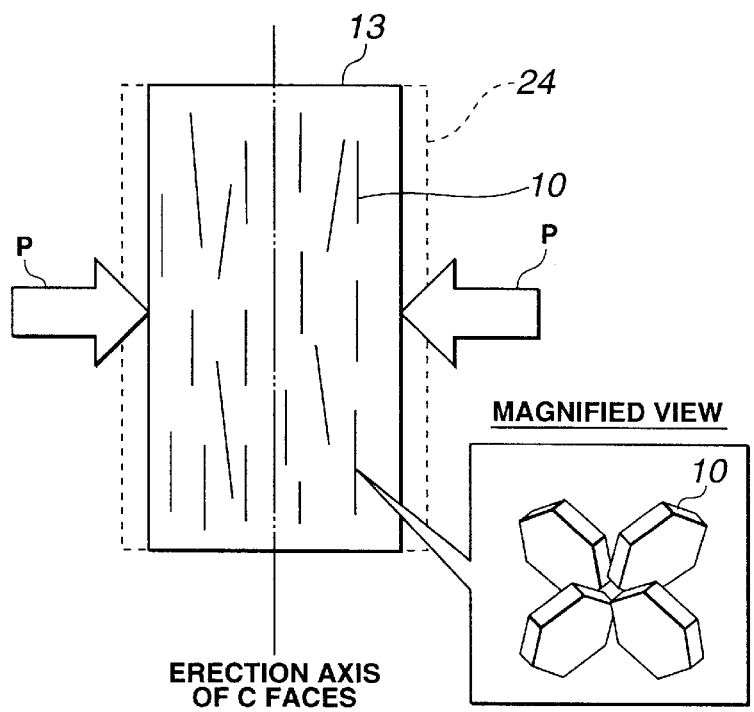

FIG. 8 is a diagram showing the alignment condition of a pre-molding obtained by the step shown in FIG. 7. FIG. 8(a) is a plan view of FIG. 7 and FIG. 8(b) is a side view of FIG. 7. Like the circular pre-molding described above, the pre-molding 13 obtained by the step of FIG. 7 is of a shape in which material periphery 24 is compressed by application of pressure.

As a result, crystal grains 10 are erected in the direction orthogonal to the direction of pressure application and the central axis of the rectangular prism becomes the axis of erection of the C faces of the crystal grains 10. Thus, as shown by the view to a larger scale of FIG. 8(b), in the pre-molding 13 which is obtained, crystal grains 10 are in a freely erected aligned condition.

Figure 9:
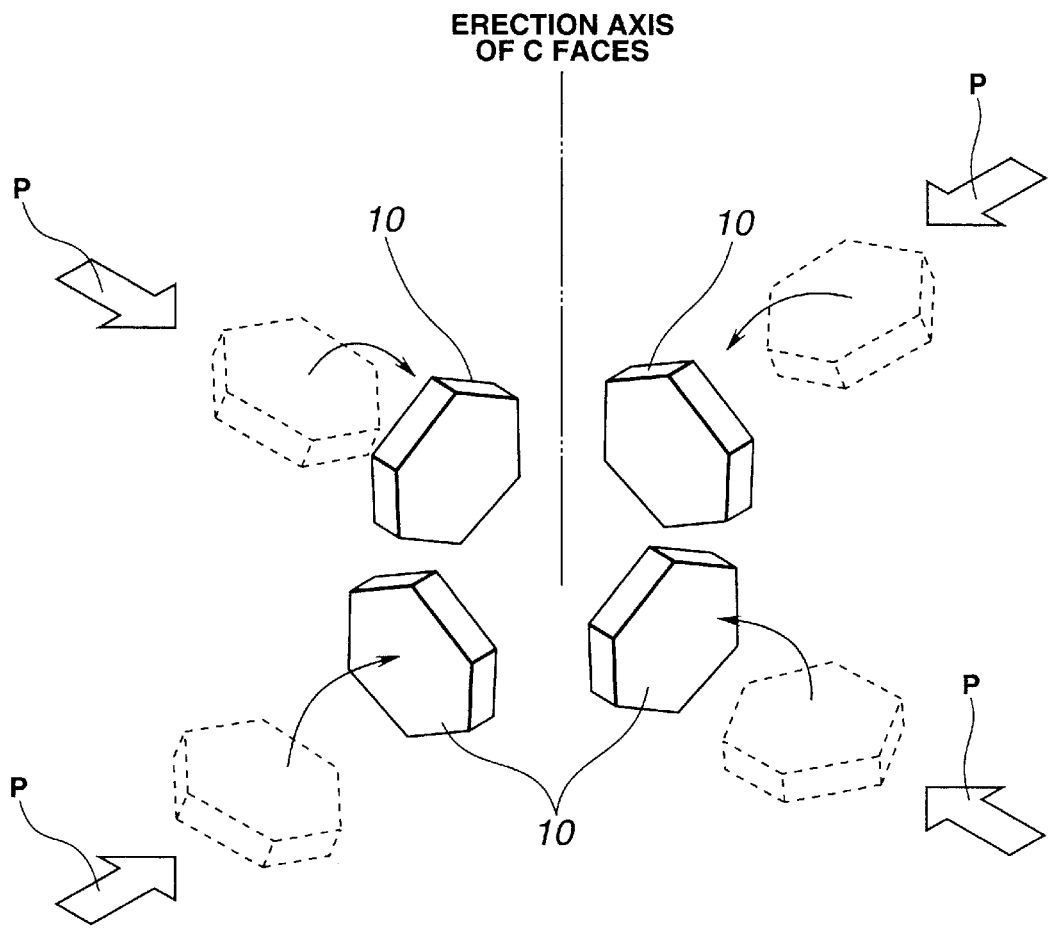
FIG. 9 is a diagrammatic perspective view showing conceptually the phenomena that occur within a pre-molding as a result of the steps shown in FIG. 5 and FIG. 7.

FIG. 9 is a diagrammatic perspective view showing conceptually the phenomena that occur within the interior of the pre-molding as a result of the steps of FIG. 5 and FIG. 7. As shown in this Figure, although the C faces of crystal grains 10 included in semiconductor material 12 initially have random orientations, they are forcibly erected by pressure application from the side faces, with the result that the C faces become parallel with respect to one axis i.e. the axis of erection of the C faces.

In this process, since crystal grains 10 are subjected to pressure such as to produce a reduction in diameter from the directions surrounding the axis of erection of the C faces, the crystal alignment of the pre-molding becomes a free erection alignment. Consequently, if the axis of erection of these C faces is set to the current passage direction, a thermoelectric semiconductor element of low resistivity ρ can be manufactured.

As described above, with the first aspect of the present invention, since the semiconductor material consisting of a laminar structure chemical compound is subjected to multi-axial pressing, free erection alignment can be produced within this semiconductor material. As a result, a thermoelectric semiconductor material of low resistivity ρ is obtained, as a result of which improved thermoelectric performance can be expected.

Also, since this free erection alignment is similar to the crystal alignment produced by the extrusion method, a pre-molding manufactured by the first aspect of the present invention is ideal as an extrusion material. This point will be described in detail under the following second aspect.

(Second aspect)

A second aspect of the present invention consists in an invention providing a method of extrusion that is beneficial in improving the degree of alignment. Constituent elements that are in accordance with the first aspect described above are given the same reference symbols in the following description and further description thereof is omitted.

Figure 10:
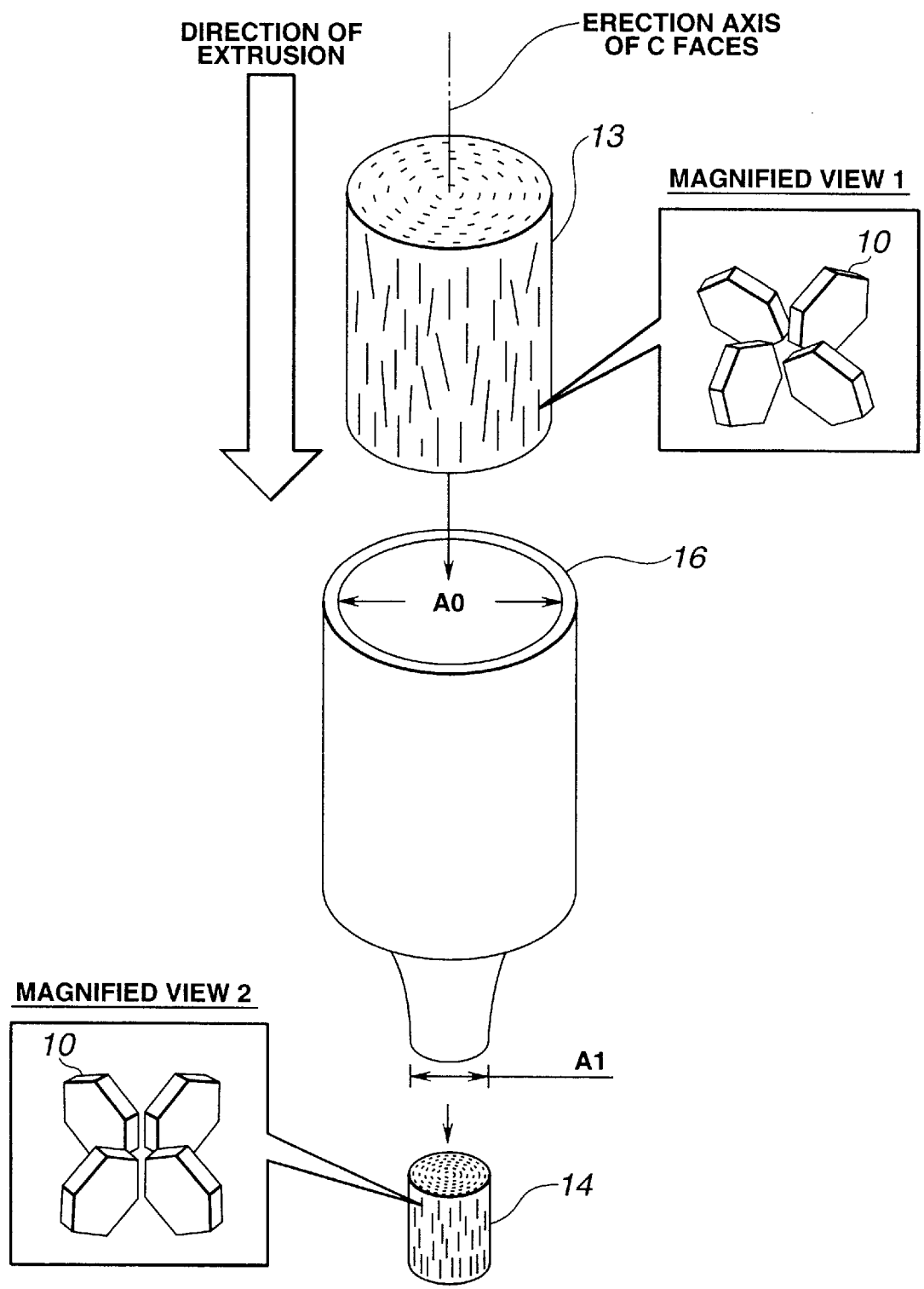
FIG. 10 is a perspective view showing how a circular shape extrusion step is performed according to a second embodiment of the present invention.

FIG. 10 is a perspective view showing how a circular extrusion step according to a second aspect of the present invention is performed. As shown in this Figure, in the second aspect of the present invention, an extrusion molding 14 is formed in which pre-molding 13 is further compressed by extrusion of a pre-molding 13 in which the C faces are in erect alignment from die 16.

The important point here is that the erection axis of the C faces of pre-molding 13 and the extrusion direction of this pre-molding 13 are made to coincide. This is for the following reasons.

First of all, the extrusion method is a method whereby a pre-molding 13 that is introduced with diameter A0 is compressed to diameter A1 by extruding in a fixed direction. During this extrusion, the crystal grains 10 in the pre-molding 13 are deformed by being subjected to perpendicular resistive force from the entire circumference of the side walls of die 16. As a result, the C faces of the crystal grains 10 in the extrusion molding 14 obtained are erected parallel to the extrusion direction. That is, in the extrusion method, the direction of extrusion becomes the erection axis of the C faces.

Consequently, when the crystal alignments of the pre-molding 13 are lined up and the erection axis of the C faces and the extrusion direction are made to coincide, the crystal alignment of the molding 13 acts in the direction in which further lining up is achieved by the extrusion, and the degree of alignment is thereby increased. According to the present invention, since pre-molding 13 having an erect alignment is extruded along this erection axis, an extrusion molding 14 is obtained having excellent crystal alignment.

Next, the case where the crystal alignment of molding 13 is a free erection alignment as shown by magnified view 1 in FIG. 10 will be considered. Specifically, this pre-molding 13 is formed by the first aspect described above. As shown in this magnified view 1, at the stage of this pre-molding 13, a perfect erected condition is not yet achieved, but, when compression is performed by extrusion from die 16, a much better erected condition, as shown in magnified view 2 in FIG. 10 is produced. That is, this extrusion acts in a direction such as to further line up the crystal alignments of pre-molding 13.

In contrast, considering the case where the crystal alignment of pre-molding 13 is random, an enormous amount of energy would be necessary in order to convert this random alignment into an erect condition, so in many cases an ideal erect alignment cannot be achieved simply by extrusion. Likewise, when there is a large angular difference between the erection axis of the C faces and the extrusion direction, this angular difference cannot be fully submerged simply by extrusion, so increase in the degree of alignment is not particularly desirable. That is, an extrusion molding 14 is produced in which unerected crystal grains are still left in this condition. This is a point that was previously not well recognized.

This should be easily understood by considering the following condition, for example. That is, imagining the case of a crystal grain whose C face is in a condition inclined at 90° with respect to the extrusion direction, during the process of continuation of extrusion, this crystal grain is gradually erected from the 90° inclined condition, so that its C face will come to be directed in a condition parallel with the extrusion direction. Consequently, since more energy is necessary to erect a crystal grain as the angle difference between the direction of alignment of the C face and the direction of extrusion becomes larger, crystal grains which have not been fully erected will be left behind in the extrusion process.

Accordingly, in the present invention, by conferring a certain degree of alignment from the stage of pre-molding 13, which is the starting material for extrusion, and making the direction of alignment of this pre-molding 13 and the extrusion direction coincide, a condition is produced in which the crystal grains are easy to erect. It is therefore desirable that the pre-moldings 13 that are used in the second aspect of the present invention are pre-moldings in which a high degree of alignment is obtained by the first aspect described above.

Figure 11:
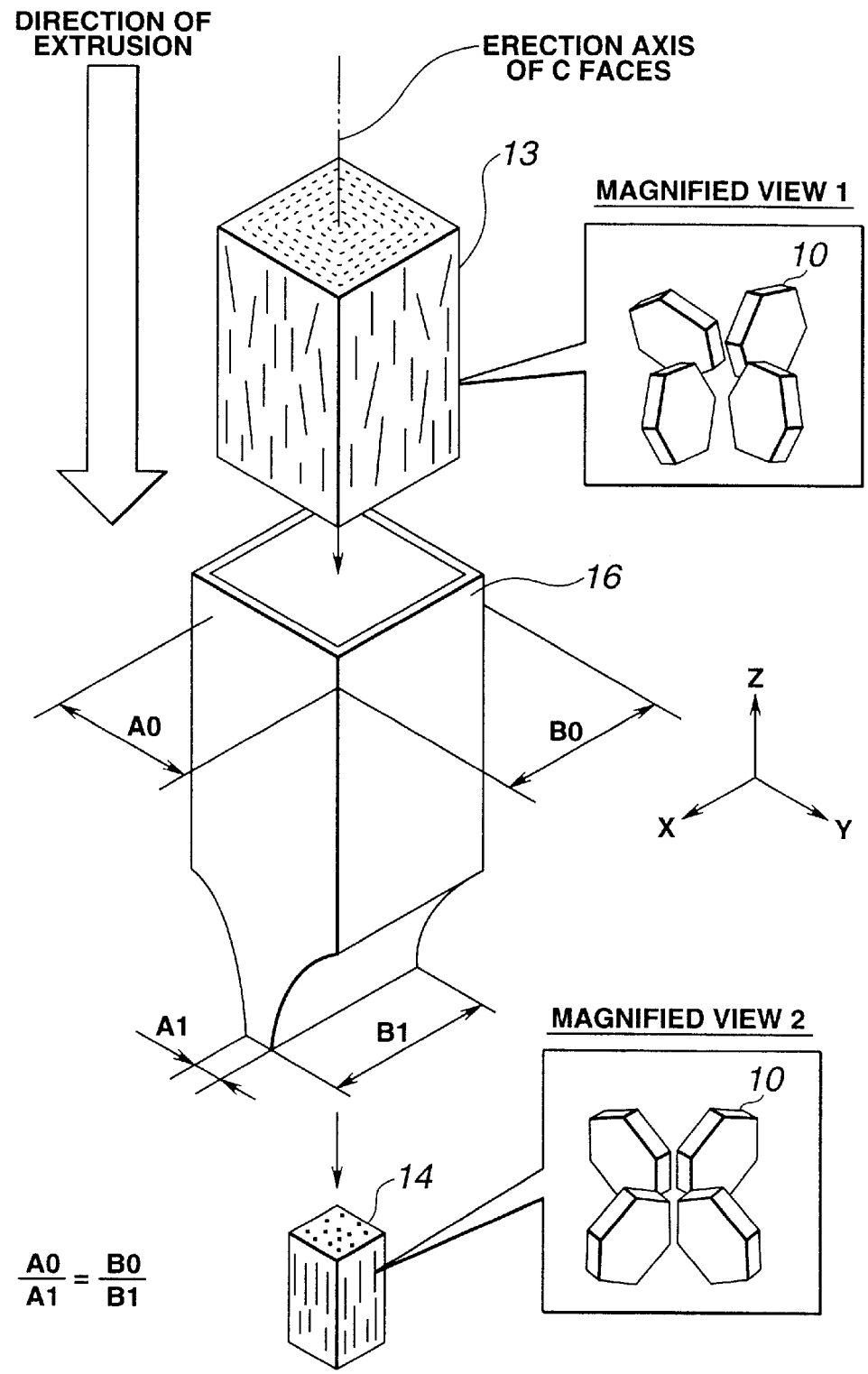
FIG. 11 is a perspective view showing how a rectangular molding step is performed according to a second embodiment of the present invention.

FIG. 11 is a perspective view showing the way in which a rectangular extrusion step according to the second aspect of the present invention is performed. As shown in this Figure, the concept of making the erection axis of the C faces of pre-molding 13 and the extrusion direction coincide is not restricted to the case where a cylindrical pre-molding is extruded using a cylindrical die 16, but could also be applied to the case where a rectangular pre-molding 13 is extruded using a rectangular die 16.

Figure 1:
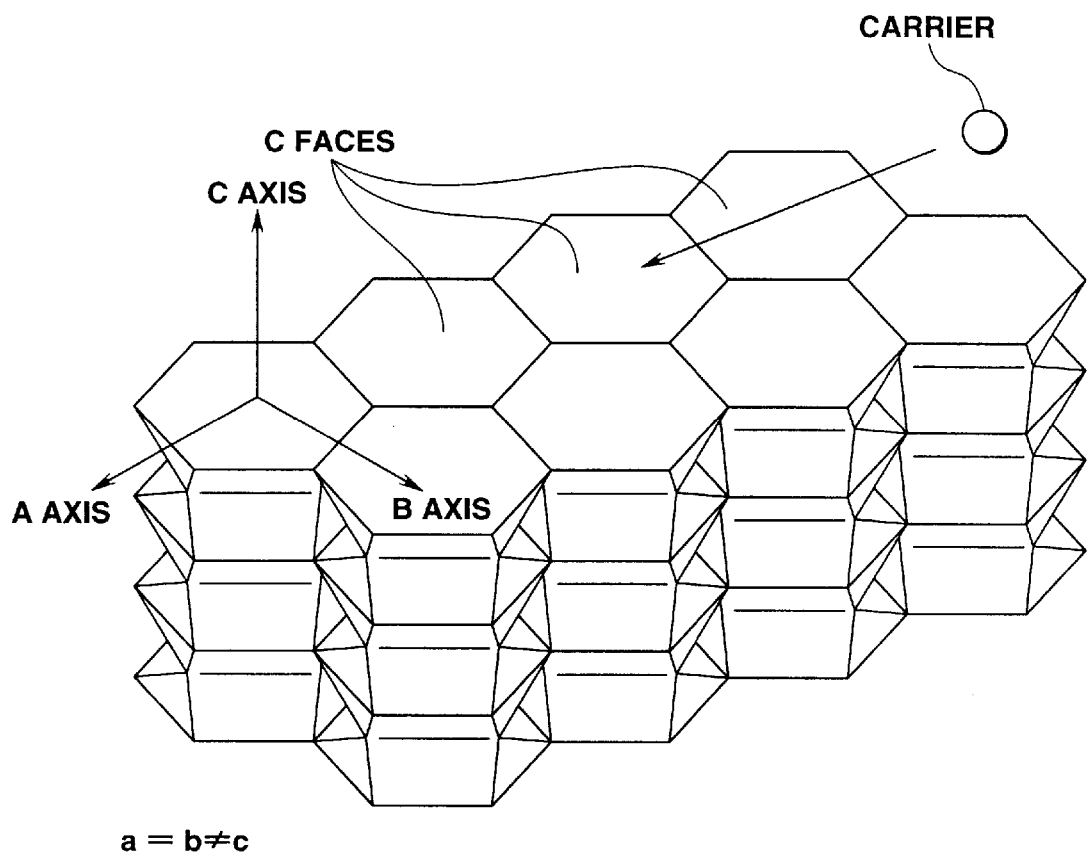
FIG. 1 is a diagrammatic perspective view showing the crystal structure of a laminar structure chemical compound.
Figure 2:
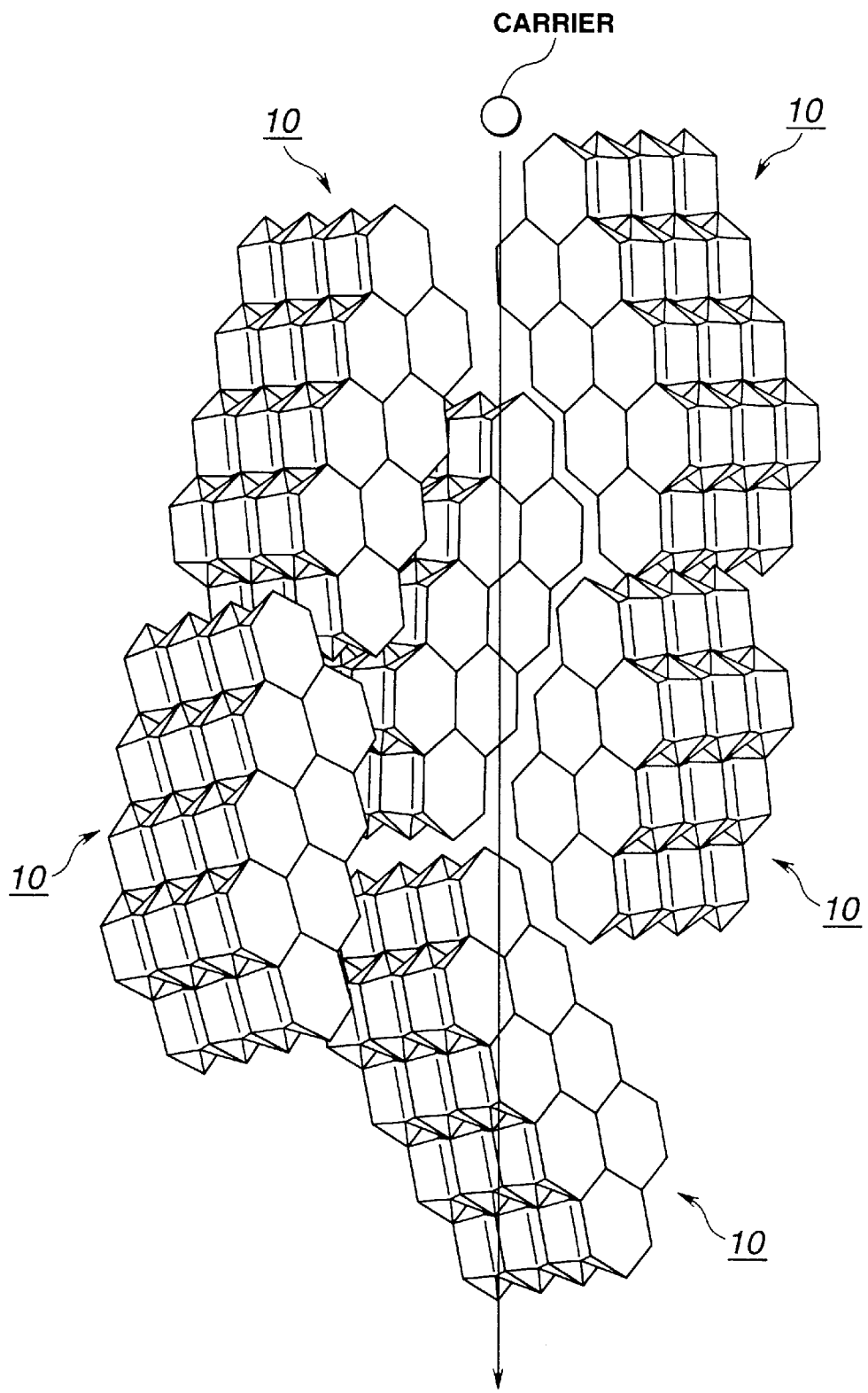
FIG. 2 is a diagrammatic perspective view showing the structure of a polycrystal of a laminar structure chemical compound.
Figure 3:
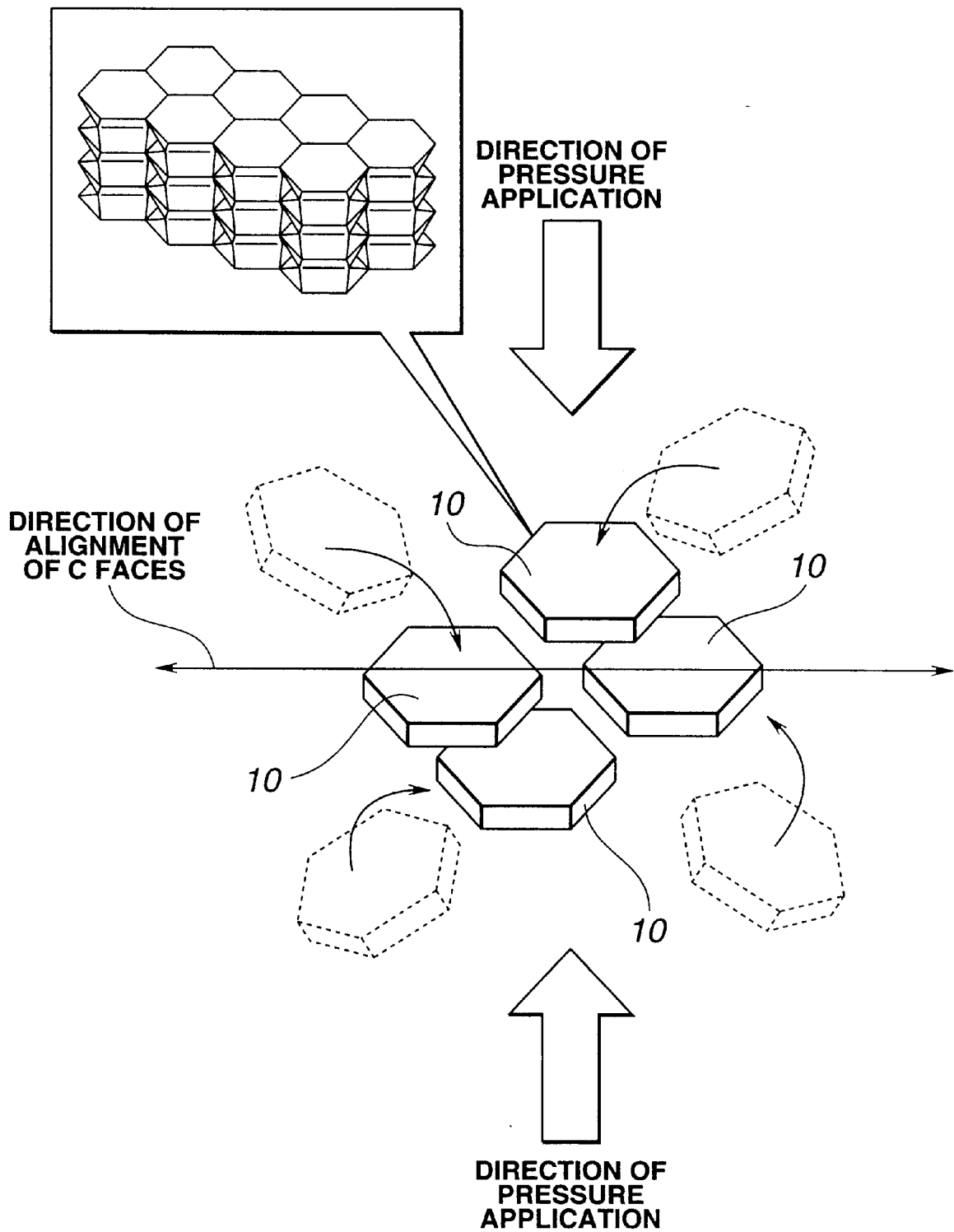
FIG. 3 is a diagrammatic perspective view showing the general tendency of alignment of crystal grains produced by uniaxial pressing.
Figure 4:
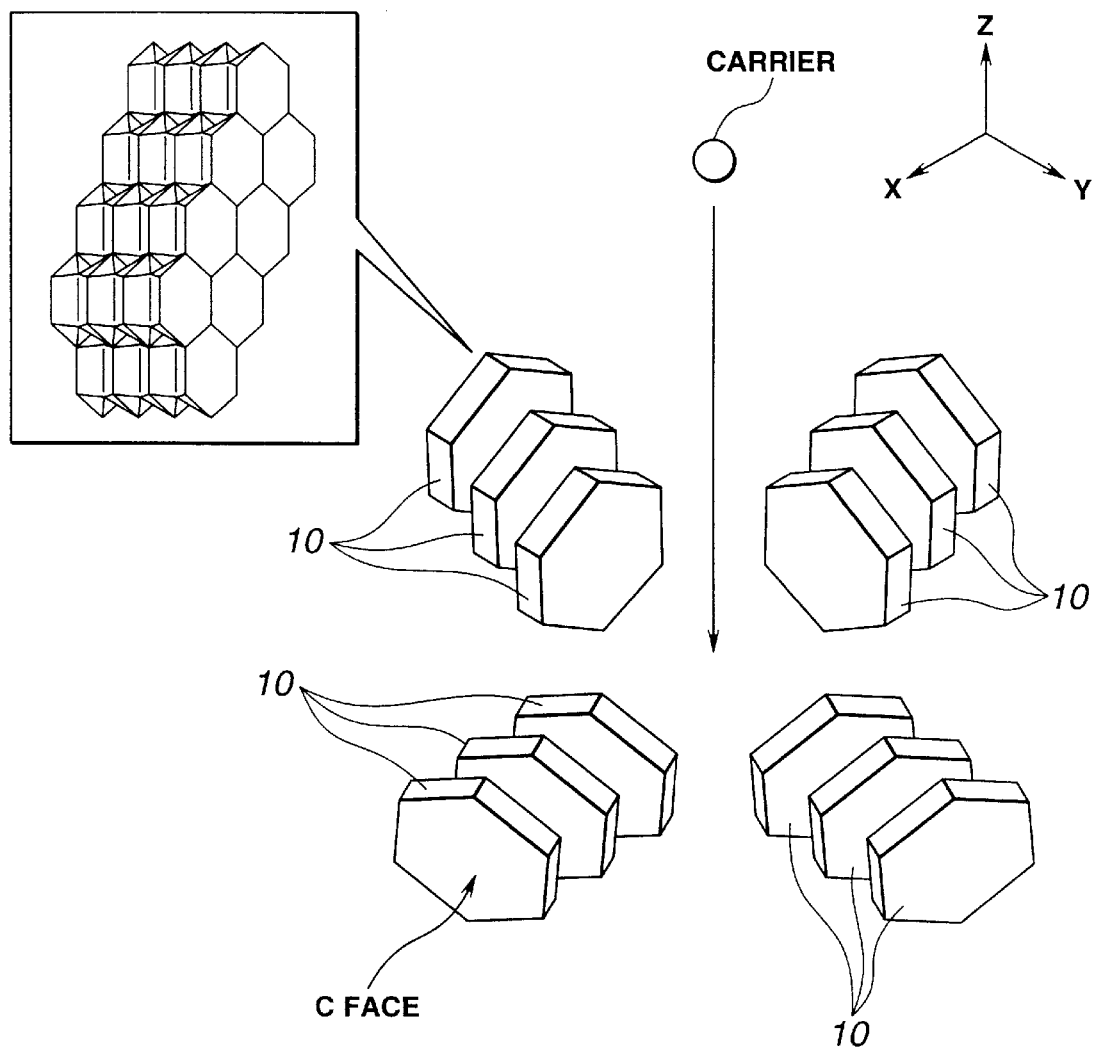
FIG. 4 is a diagrammatic perspective view showing the condition of crystal grains in free erect alignment.
Figure 12:
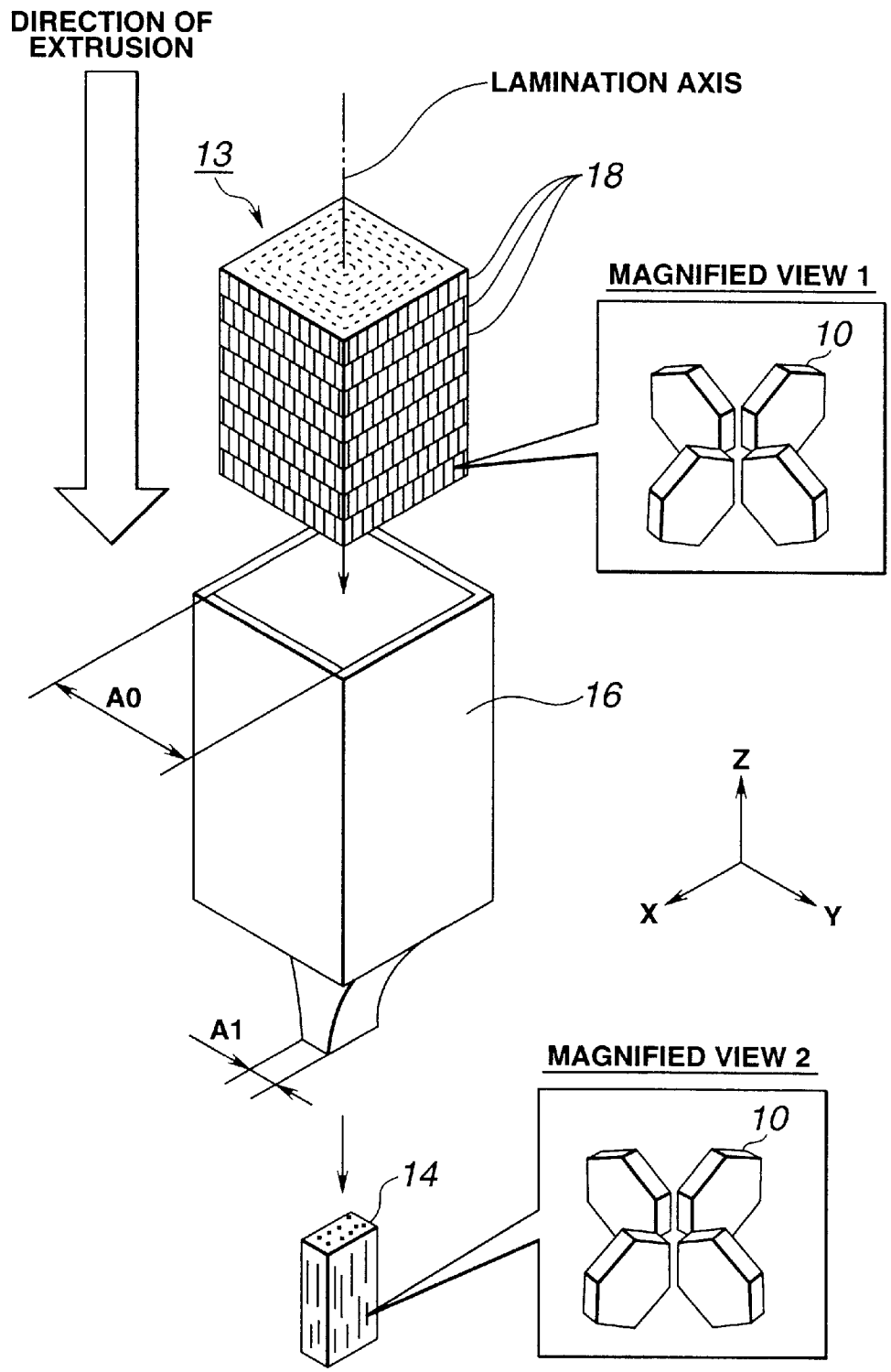
FIG. 12 is a perspective view showing how an extrusion step using laminated material is performed according to a second embodiment of the present invention.

In this case also, the incomplete freely erected alignment shown in magnified view FIG. 1 becomes an ideal condition as shown by magnified view FIG. 2. Although, in the case of the rectangular die 16 shown in this Figure, a premolding 13 is compressed in the Y axis direction and an extrusion molding 14 elongated in the Z axis direction is formed, it is also possible to employ a die 16 of a shape such as to effect compression in both the X axis and Y axis directions, as shown in FIG. 12. In this case, the compression ratio in the X axis direction and Y axis direction may be made the same (i.e. A0/A1=B0/B1).

FIG. 12 is a perspective view showing how an extrusion step is performed using a laminated material according to a second aspect of the present invention. As shown in this Figure, thin powder 18 manufactured by quench rolling is employed for pre-molding 13. In this case, extrusion is performed with the lamination direction of the thin powder 18 and the extrusion direction made to coincide.

As shown in magnified view of FIG. 1, the crystal alignment of the thin powder 18 is ideal compared with that obtained by simple press forming, so, using a premolding 13 obtained by laminating thin powder 18, extrusion can be performed with this ideal crystal alignment maintained. As a result, as shown in magnified view of FIG. 2, an extrusion molding 14 is obtained having ideal free erection alignment. Although, in the case of the rectangular die 16 shown in this Figure, the pre-molding 13 is compressed in both the X axis and Y axis directions, it would be possible to employ a die 16 of a shape such that compression is only effected in the Y axis direction, as shown in FIG. 11.

Figure 13:
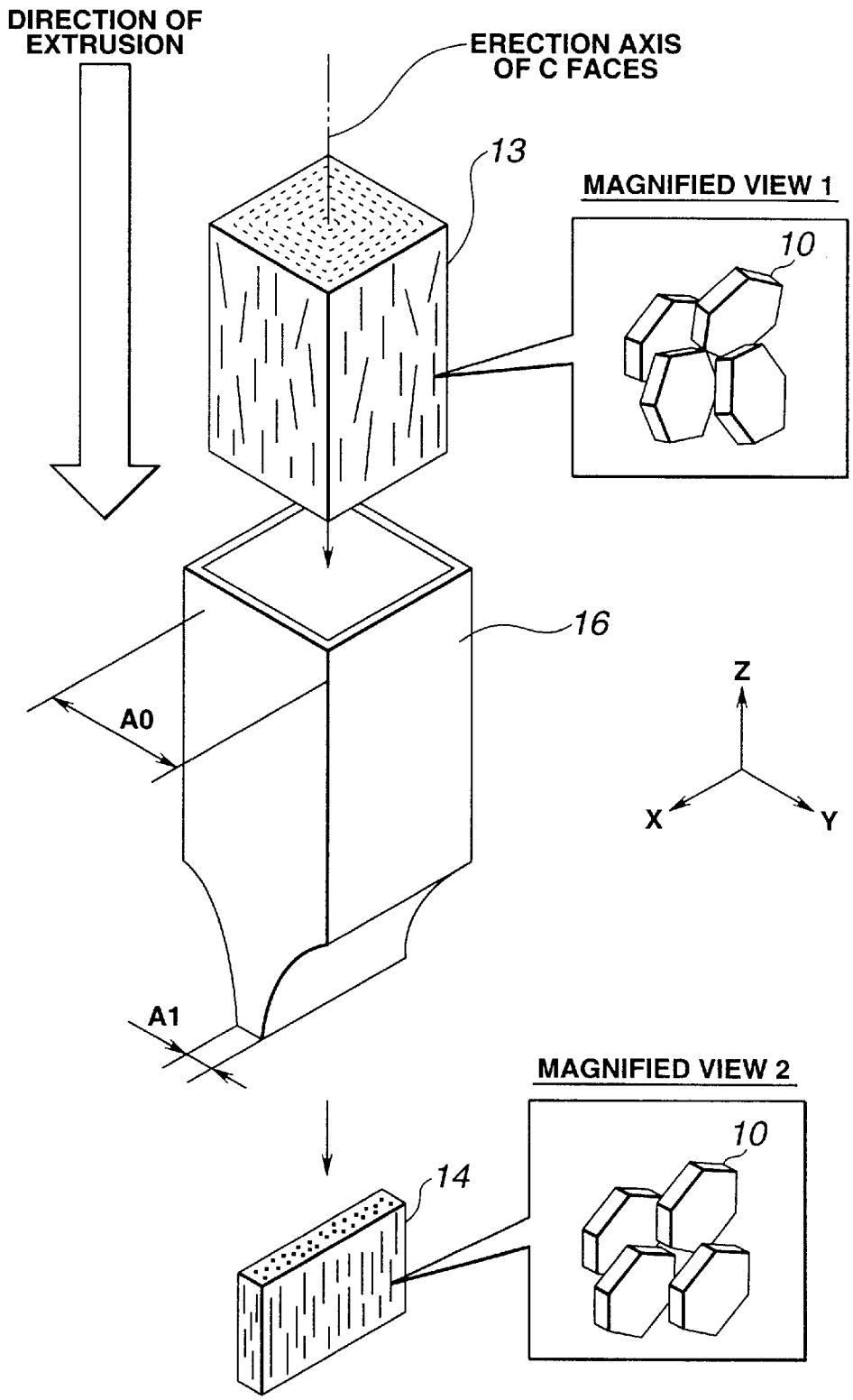
FIG. 13 is a perspective view showing a step of extruding a pre-molding formed by uniaxial pressing.

FIG. 13 is a perspective view showing a step of extrusion of a pre-molding formed by uniaxial pressing. As shown in this Figure, a pre-molding 13 may be employed that is formed by a uniaxial press such as a hot press or cold press. Since, in a pre-molding formed by a uniaxial press, the direction orthogonal to the pressing direction constitutes the erection axis of the C faces, if this erection axis is made to coincide with the extrusion direction, an extrusion molding 14 having excellent crystal alignment is obtained.

However, the point of difference in regard to the pre-molding 13 formed by the first aspect described above is that, whereas pre-molding 13 formed by the first aspect has a free erection alignment, a pre-molding 13 formed by a uniaxial press has a uniaxial alignment, as shown by the magnified view in FIG. 1.

Consequently, paying attention to this point, if a pre-molding 13 in which the C faces are directed in the Y axis direction thanks to uniaxial pressing is employed, it would appear desirable to employ a die 16 such as to effect compression of this pre-molding 13 only in the Y axis direction. The reasons for this are as follows.

Specifically, if force is applied from the X axis direction with respect to a crystal grain 10 whose C face is directed towards the Y axis direction as shown in magnified view in FIG. 1, a tendency for the C axis to face the X axis direction is produced. Although there is no problem at all in the C faces being in an erect condition in which they face the X axis direction, since the energy that is applied to the crystal grains by extrusion is limited, when the energy is allocated to the operation whereby the C faces are directed in the X axis direction, it appears that the energy allocation to the operation of C face erection becomes small.

In order to improve thermoelectric performance, it is important to erect the C faces though it is not an especial problem whether the alignment is uniaxial or freely erected alignment. Consequently, supply of energy in a direction that confers erection on the C faces so that as far as possible no wasted energy allocation occurs is associated with improvement in the degree of alignment.

Specifically, by effecting extrusion with the erection axis of the C faces of pre-molding 13 and the extrusion direction of this pre-molding 13 made to coincide and the direction of the C faces of this pre-molding 13 and the direction of compression of this pre-molding 13 made to coincide, as shown in magnified view of FIG. 2, uniaxial alignment is obtained in which erection in a more ideal fashion is achieved.

As described above, with the second aspect of the present invention, extrusion is performed along the erection axis of the C faces, so an extrusion molding 14 of a high degree of alignment can be obtained.

(Summary)

Semiconductor material powder and solvent are packed into a rubber tube 42 and both ends of rubber 42 are fixed by fixing rings 44 in a condition sealed in the vertical direction by an upper cover 38 and bottom cover 40. After this, rubber tube 42 is immersed in an oil bath 46, and the semiconductor material within this rubber tube 42 is uniformly extruded from the side face by using hydraulic pressure (see FIG. 19).

The concept of "applying pressure from at least three directions orthogonal to one axis" and the technical concept mentioned above of "making the crystal alignment of the pre-molding and the extrusion direction coincide" are extraordinarily useful concepts in improving thermoelectric performance. Examples embodying these characteristic technical concepts in modes believed to be industrially preferable will now be indicated. Of the constructional elements described above, those which are not thought to need further explanation will be given the same names and the same reference symbols and further detailed description thereof will be omitted. Also, the embodiments below are only examples embodying the present invention and do not restrict the present invention.

FIG. 14 is a step diagram illustrating the manufacturing process of a thermoelectric module according to this embodiment. What this manufacturing process consists in will be described below with reference to this Figure.

First of all, as shown in this Figure, the raw materials of the semiconductor material, namely, bismuth (Bi), tellurium (Te), selenium (Se) and antimony (Sb) as well as the impurities used as dopant are weighed out (step S10) and these are introduced into crucible 30.

Next, crucible 30 into which this raw material has been introduced is heated, melting the raw material, to produce a melt i.e. molten raw material liquid (step S12).

Next, using the melt in this crucible 30, spherical powder 20 or thin powder 18, or crushed powder 22 obtained by crushing after solidification of the melt, or a powder material consisting of a combination of these is manufactured (step S14). Hereinbelow, the methods of manufacturing spherical powder 20, crushed powder 22 and thin powder 18 will be respectively separately described.

Figure 15:
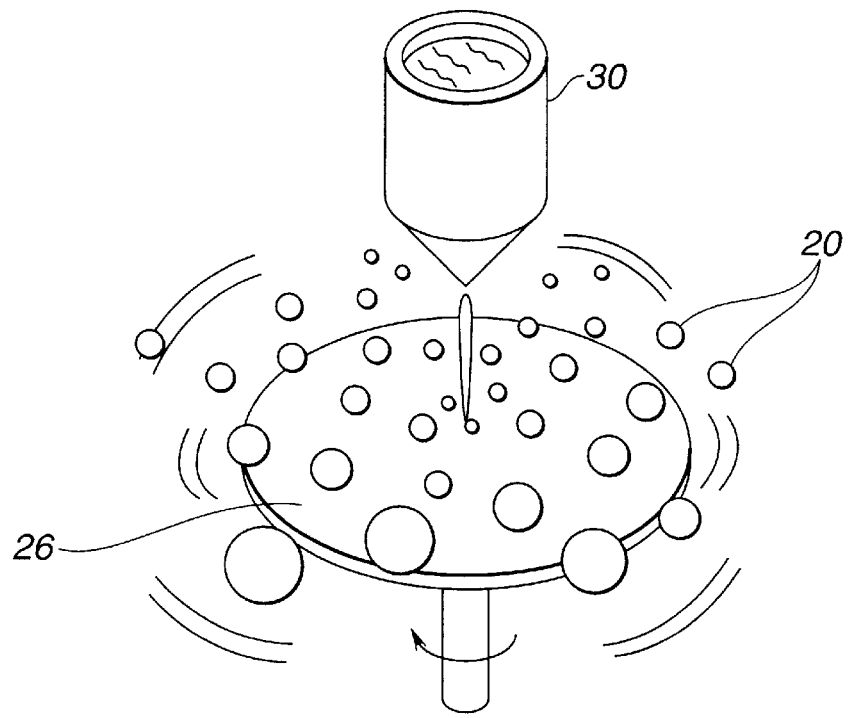
FIG. 15 is a perspective view showing a method of manufacturing spherical powder 20.

FIG. 15 is a perspective view showing a method of manufacturing spherical powder 20. As shown in this Figure, to manufacture spherical powder 20, the melt in a crucible 30 is dropped on to a rotating disc 26 rotating at high speed, so that this melt is thrown off by the centrifugal force and rapidly solidified. As a result, spherical powder 20 of fine grain size is obtained. After this, the spherical powder obtained is classified to obtain uniform grain size and this is used for the raw material of the pre-molding.

Figure 16:
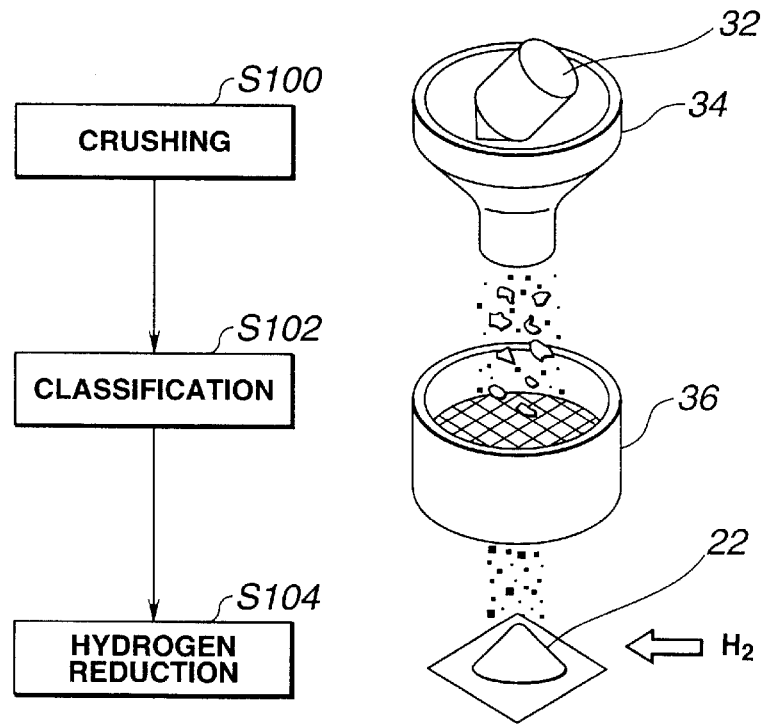
FIG. 16 is a step diagram showing a method of manufacturing crushed powder 22.

FIG. 16 is a process diagram showing a method of manufacturing crushed powder 22. As shown in this Figure, to manufacture crushed powder 22, the melt in crucible 30 is solidified to manufacture an ingot 32 and this is crushed by being introduced into a mill 34 (step S100).

Next, the powder raw material discharged from mill 34 is screened to powder of about 34 to 108 μm by classifying using a filter 36 (step 102).

After this, the screened powder is introduced into a glass ampoule under vacuum evacuation, and hydrogen is introduced into this glass ampoule, setting the pressure within this glass ampoule to 0.9 atmosphere. This glass ampoule is then placed in a heating furnace, where it is heated for 10 hours at 350° C., to perform hydrogen reduction of the powder (step S104).

The thus-obtained crushed powder 22 is used as the material of the pre-molding.

Figure 17:
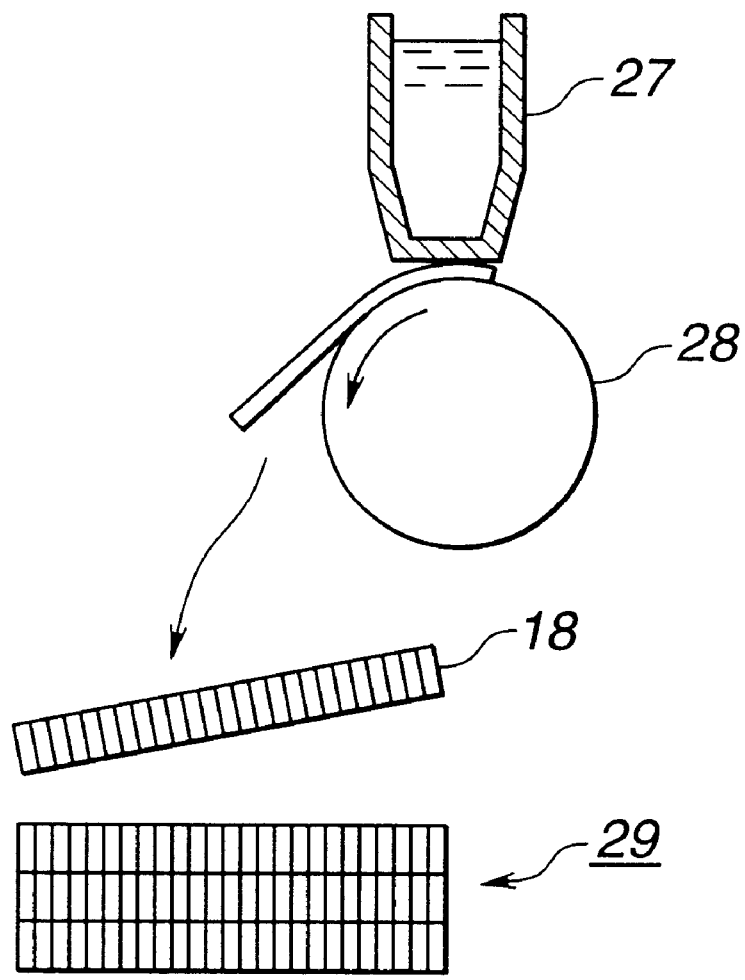
FIG. 17 is a partial cross-sectional view showing a method of manufacturing thin powder 18.

FIG. 17 is a partial cross-sectional view showing a method of manufacturing thin powder 18. As shown in this Figure, to manufacture thin powder 18, the melt in crucible 30 is supplied to a nozzle 27, and is thence dropped on to the surface of a rotating cooling roll 28, to manufacture thin powder 18 having submicron class crystal grains, by the quenched roll method. To use laminated thin powder 18 for the pre-molding, a plurality of thin powder particles 18 obtained by forming on the surface of cooling roll 28, then separating, are laminated in the film thickness direction to form a laminated body 29. Spherical powder 20, crushed powder 22 or thin powder 18 manufactured in this way or a combination of these is subjected to pressure by the procedure indicated below to form a pre-molding 13 (step S16 in FIG. 14).

Figure 18:
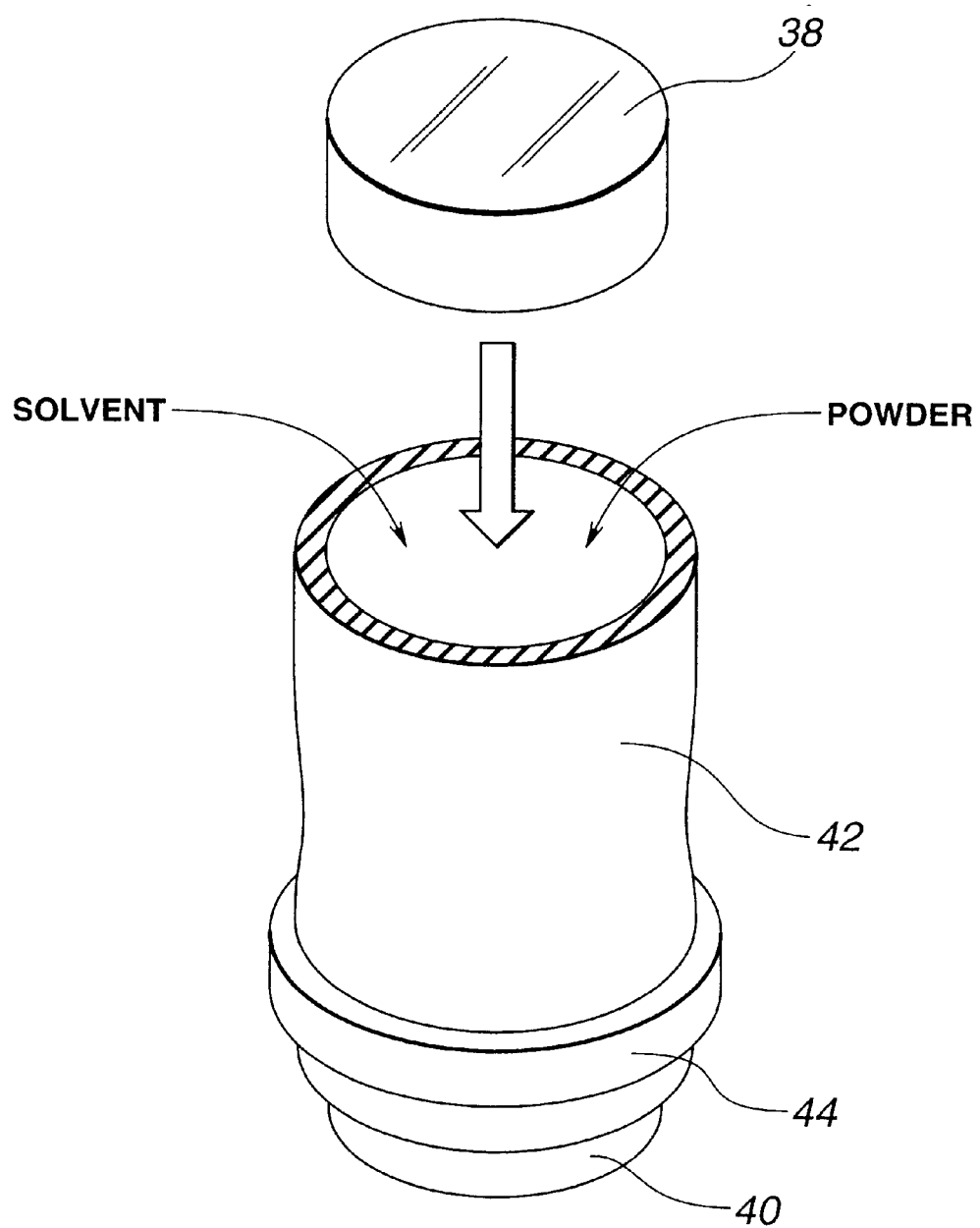
FIG. 18 is a perspective view showing a first procedure of a pre-molding formation step shown in FIG. 14.

FIG. 18 is a perspective view showing a first procedure of the step of forming a pre-molding shown in FIG. 14. For the formation of pre-molding 13, as shown in this Figure, first of all, the powder, after hydrogen reduction, is packed into a rubber tube 42 whose bottom end is sealed with a bottom cover 40. In this process, it is mixed with volatile solvent to serve as a lubricant. Then, the upper end of rubber tube 42 is sealed with upper cover 38, and the bottom end and top end of this rubber tube 42 are both sealed with fixing rings. Upper cover 38 and bottom cover 40 are both formed by rigid bodies to restrain vertical movement of the powder.

Figure 19:
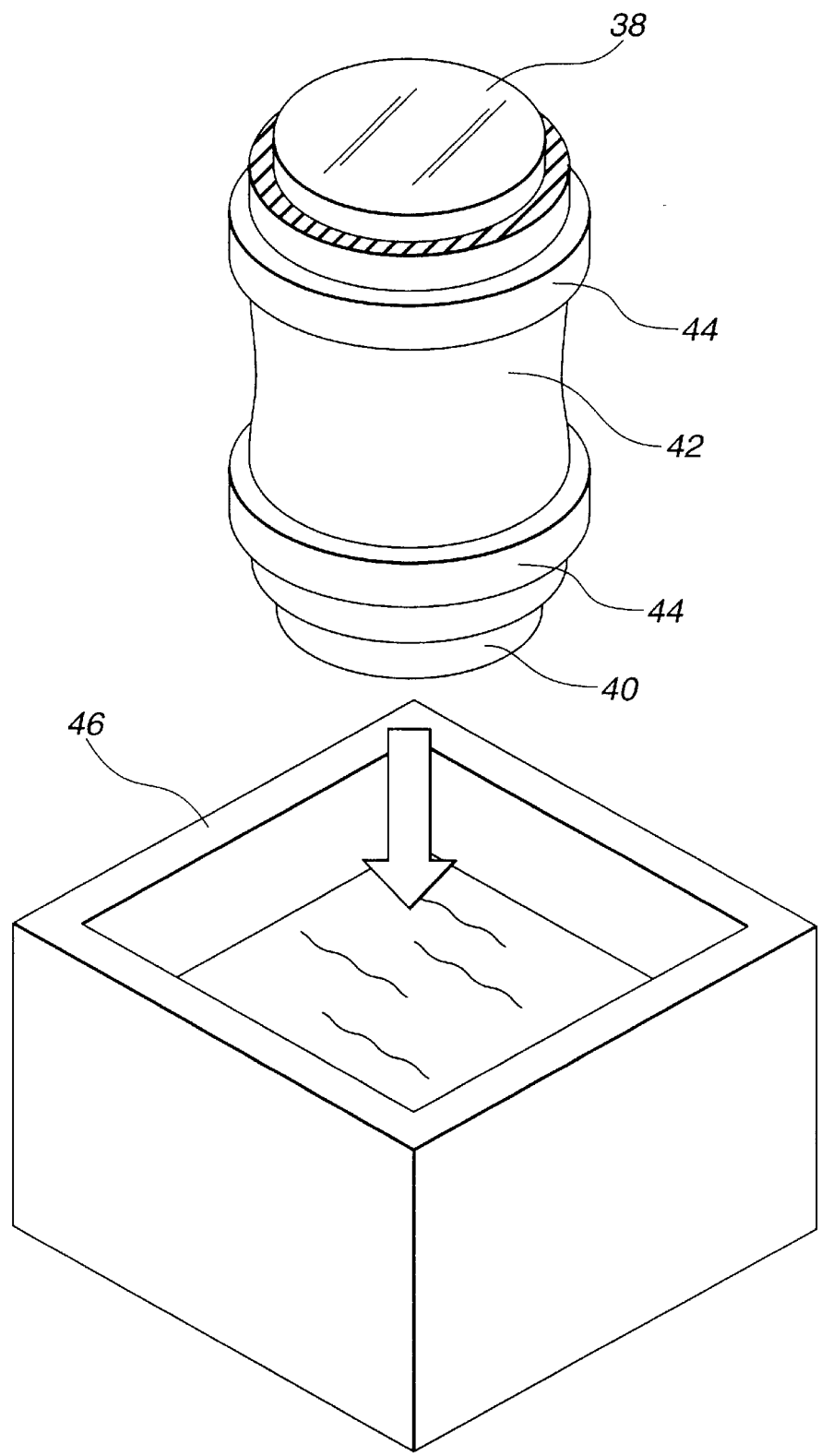
FIG. 19 is a perspective view showing a second procedure of a pre-molding formation step shown in FIG. 14.

FIG. 19 is a perspective view showing a second procedure of the step of forming a pre-molding shown in FIG. 14. As shown in this Figure, a powder consisting of spherical powder 20, crushed powder 22 or thin powder 18 or a combination of these is packed into a rubber tube 42 and the top end of this rubber tube 42 is sealed by a fixing ring 44 before it is introduced into an oil bath 46.

Figure 20:
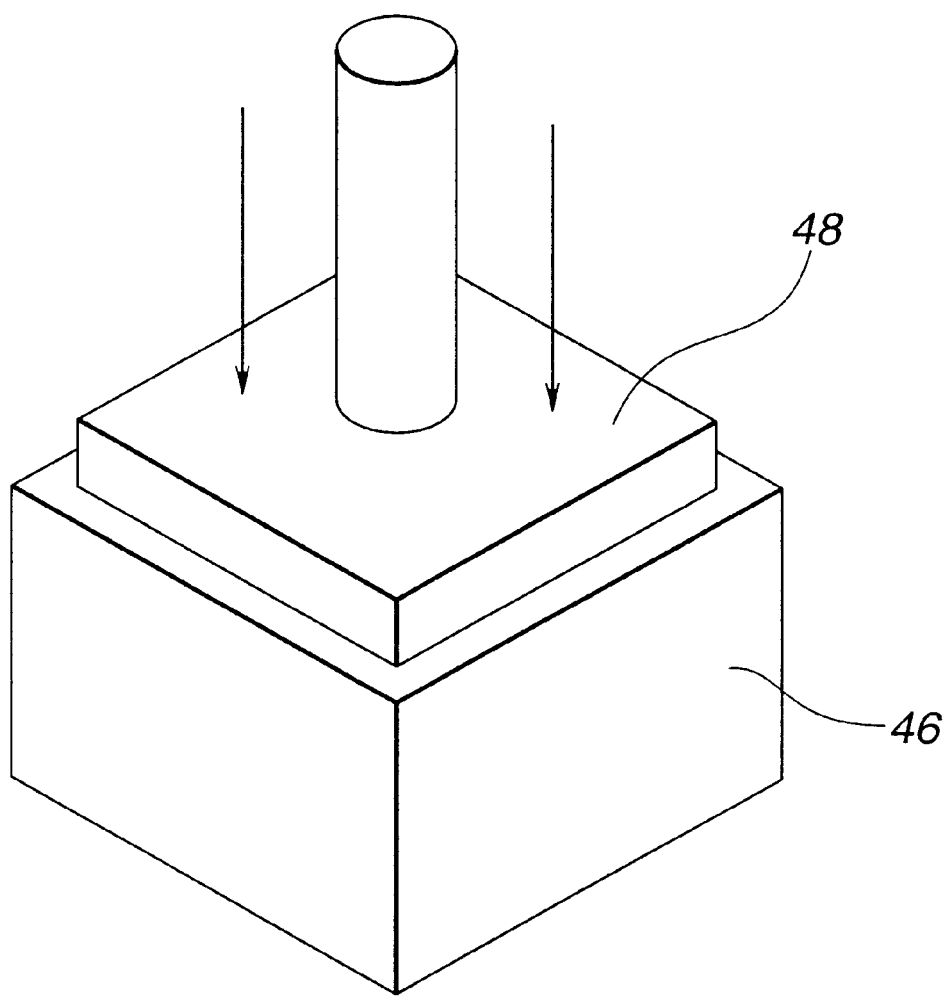
FIG. 20 is a perspective view showing a third procedure of a pre-molding formation step shown in FIG. 14.

FIG. 20 is a perspective view showing a third procedure of the pre-molding formation step shown in FIG. 14. As shown in this Figure, after rubber tube 42 has been introduced into oil bath 46, the oil within oil bath 46 is pressurized using a punch 48. As a result, the side face of rubber tube 42 is deformed by the oil pressure compressing the powder within this rubber tube 42. When this is done, smooth alignment of the C faces is produced by smooth movement of adjacent particles, the solvent that is admixed in rubber tube 42 serving as a lubricant with the powder.

After this, the compressed powder is removed from rubber tube 42 and the solvent contained in the powder is evaporated before it is used for pre-molding 13. An extrusion molding 14 is then formed (step S18 in FIG. 14) by extruding pre-molding 13 using a cylindrical or rectangular die 16 as shown in FIG. 10 to FIG. 12.

After this, the extrusion molding 14 obtained is cut to the required shape to obtain P type and N type thermoelectric semiconductor elements 15 (step S20), after which a thermoelectric module 10 is assembled using these thermoelectric semiconductor elements 15 (step S22).

Figure 21:
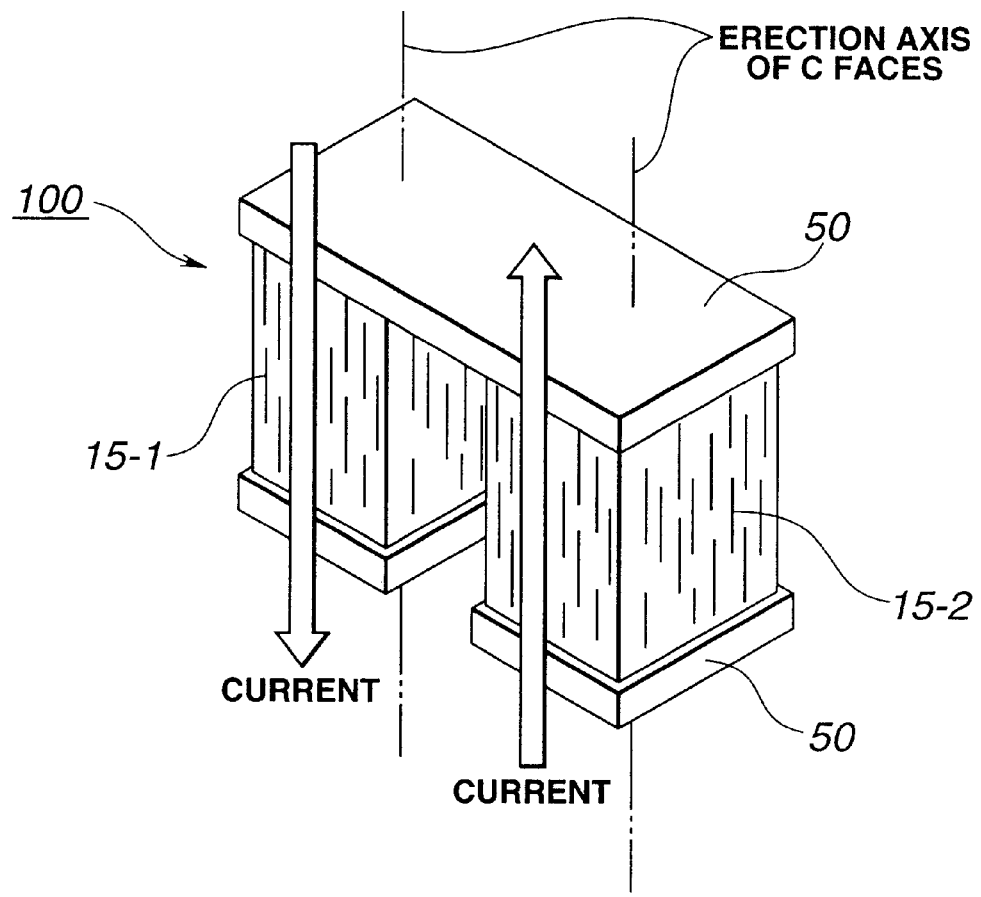
FIG. 21 is a perspective view showing the construction of a thermoelectric module 100 manufactured by the process shown in FIG. 14.

FIG. 21 is a perspective view showing the construction of a thermoelectric module 100 manufactured by the process shown in FIG. 14. As shown in this Figure, a thermoelectric module 100 is manufactured by fixing a pair of electrodes 50 to the upper face and lower face of P type thermoelectric semiconductor element 15-1 and N type thermoelectric semiconductor element 15-2.

At this point, these electrodes 50 are arranged in positions such that they are passed through by the erection axes of the C faces of P type thermoelectric semiconductor element 15-1 and N type thermoelectric semiconductor element 15-2. Thanks to this arrangement of electrode 50, the current that is supplied through these electrodes 50 flows in a direction parallel to the erection axis of the C faces i.e. in the direction of low resistivity ρ.

Although in the above embodiment spherical powder 20, crushed powder 22 or thin powder 18 or powder consisting of a combination of these was used as the material of pre-molding 13, use of spherical powder 20 to form the pre-molding is preferable. It is believed that this is due to the shape of spherical powder 20.

Specifically, since spherical powder 20 is a powder having a minute spherical form, it has the property of moving easily when subjected to pressure. Consequently, when spherical powder 20 is pressed, first of all, it produces a condition of high density with this spherical powder 20 packed tightly without gaps. Then, when it is subjected to pressure from this high-density condition, it is believed that the crystal grains undergo repeated destruction and recrystallization, as a result of which a pre-molding consisting of fine crystal grains of a high degree of alignment is obtained. A more detailed description of spherical powder 20 is as follows.

Since spherical powder 20 is not subject to admixture of contamination in the powder formation step, and consists of powder which is clean, spherically shaped and of small relative surface area, it has excellent sintering properties and even though it is a powder of small grain size can be used to manufacture easily sintered bodies or cold compressed powder bodies. Furthermore, since the powder itself is manufactured by quench solidification, it has a fine structure. Accordingly, it provides fine crystal grains for the crystal structure of the pre-moldings.

Also, since there is no segregation within the powder and its grain size distribution is narrow, in plastic processing of the pre-molding uniform deformation occurs enabling a molding of uniform quality to be obtained. Also, being a spherical powder, adjacent powder particles make point contact. Consequently, in the steps of sintering and plastic processing, stress concentration occurs at these contact points, so crystal destruction and alignment (rotation) due to the driving force generated at these points are strongly promoted, enabling high-performance elements to be formed.

N type and P type sintered bodies were therefore formed using spherical powder manufactured by the rotating disc method and their photoelectric performance was measured; the method of measurement and measurement results are given below.

(Test 1)

0.08 wt. % of $HgBr_3$ was mixed with $Bi_2Te$ 2.7 Se 0.3, and N type spherical powder of 10 μm and 110 μm were manufactured by the rotating disc method. After this, pre-moldings were formed from this spherical powder by cold pressing and hot pressing. An extrusion molding is then formed by extruding this pre-molding using a rectangular die of extrusion ratio 6. The extrusion temperatures employed were 480° C. and 350° C., the extrusion rates being 0.5 mm/min and 2.5 mm/min. The results of these tests were as follows.

TABLE 1

Characteristics of N-type thermoelectric semiconductor element

| Mean Grain Size of Powder (μm) | Method of Forming Pre-molding | Temperature (° C.) | Speed (mm/min) | Figure of Merit Z (×10⁻³/K) |
| --- | --- | --- | --- | --- |
| 50 | Cold pressing | 480 | 0.5 | 3.2 |
| 10 | Cold pressing | 350 | 2.5 | 3.4 |
| 50 | Hot pressing | 480 | 0.5 | 3.0 |
| 10 | Hot pressing | 350 | 2.5 | 3.3 |

As can be seen from Table 1 above, an N-type thermoelectric semiconductor element of high figure of merit was obtained.

(Test 2)

A melt of $Bi_{1.5}Sb_{0.5}Te_3$ was prepared and P-type spherical powder of 10μ and 110μ was manufactured by the rotating disc method. After this, pre-moldings were formed from these spherical powders by cold pressing and hot pressing. Then, extrusion moldings were formed by extruding these pre-moldings using a rectangular die of extrusion ratio 6. The extrusion temperatures used were 480° C. and 350° C., with extrusion rates of 0.5 mm/min and 2.5 mm/min. The results of this test were as follows.

TABLE 2

Characteristics of P-type thermoelectric semiconductor element

| Mean Grain Size of Powder (μm) | Method of Forming Pre-molding | Temperature (° C.) | Speed (mm/min) | Figure of Merit Z (×10⁻³/K) |
| --- | --- | --- | --- | --- |
| 50 | Cold pressing | 480 | 0.5 | 3.5 |
| 10 | Cold pressing | 350 | 2.5 | 3.7 |

TABLE 2-continued

Characteristics of P-type thermoelectric semiconductor element

| Mean Grain Size of Powder (μm) | Method of Forming Pre-molding | Temperature (° C.) | Speed (mm/min) | Figure of Merit Z (×10⁻³/K) |
| --- | --- | --- | --- | --- |
| 50 | Hot pressing | 480 | 0.5 | 3.3 |
| 10 | Hot pressing | 350 | 2.5 | 3.6 |

As can be seen from Table 2, P-type thermoelectric semiconductor elements of high figure of merit were obtained. The figure of merit can be further raised by combination with annealing treatment of the extrusion molded product at a temperature about 0 to 100° C. lower than the extrusion temperature, as after-treatment.

Next, embodiments capable of achieving the above second object, third object and fourth object will be described in detail with reference to the drawings.

This embodiment is described assuming an N-type $Bi_2Te_3$ based semiconductor material. However, a BiSb based semiconductor material could also be applied in the present invention. Also a P-type material could be applied.

Figure 22:
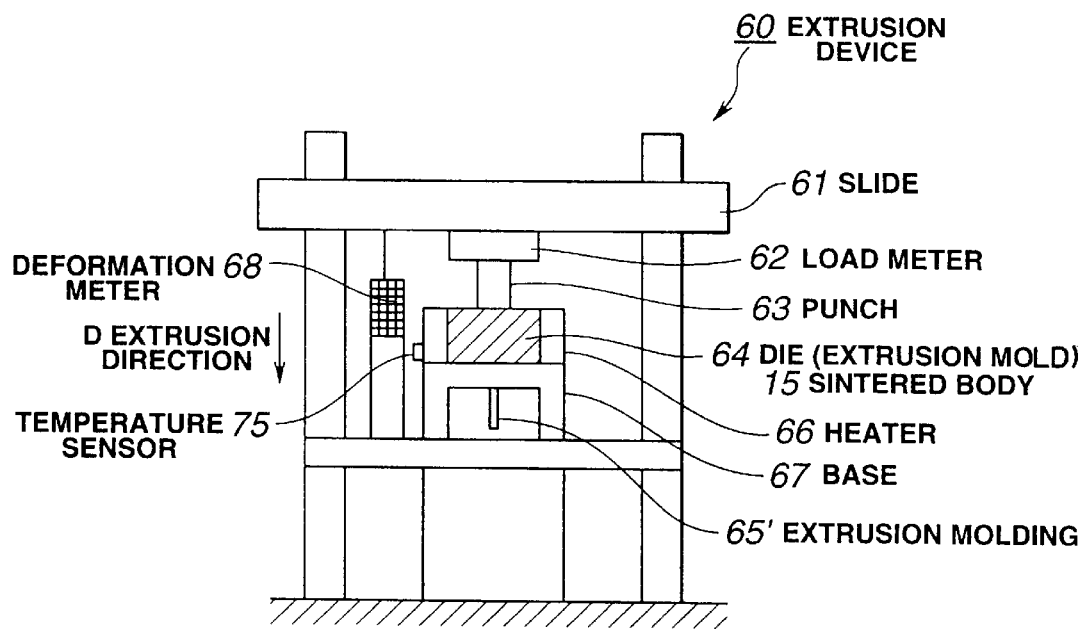
FIG. 22 is a view showing the external appearance of an extrusion molding device according to an embodiment.
Figure 23:
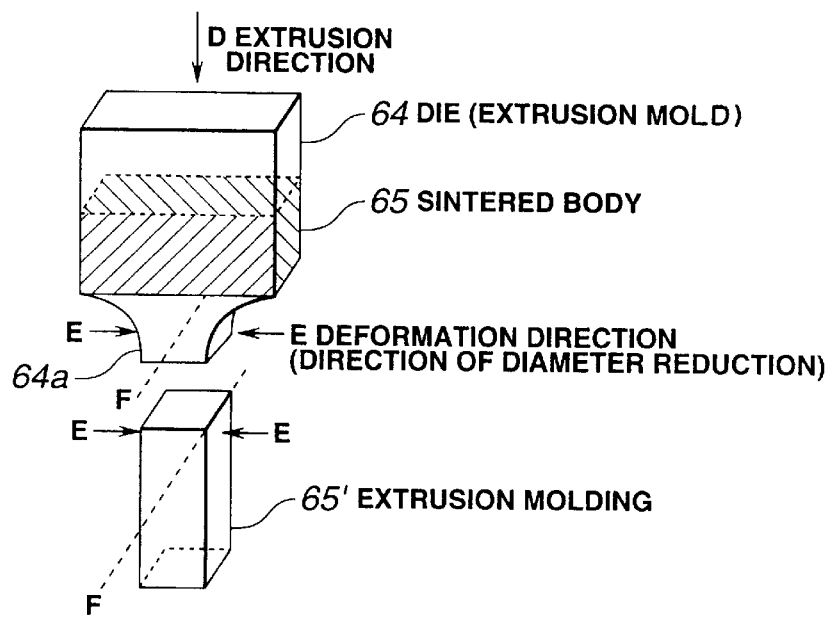
FIG. 23 is a perspective view showing the construction of an extrusion mold according to an embodiment.

A thermoelectric semiconductor material according to this embodiment is manufactured as follows. FIG. 22 is a view showing the external appearance of an extrusion molding device 60 according to the embodiment; FIG. 23 is a view showing the construction of the die (extrusion mold) in the extrusion molding device 60; and FIGS. 27(a), (b), and (c), and FIGS. 28(a) and (b) are views given in explanation of steps subsequent to the sintering step of the embodiment. In the explanation given below these drawings are to be referred to in combination as appropriate.

(Heating step)

First of all, the individual elements bismuth Bi, tellurium Te, and selenium Se constituting the raw materials of the thermoelectric semiconductor material were weighed out in the stoichiometric ratio $Bi_2Te_{2.5}Se_{0.30}$; in addition, suitable amounts of compounds to adjust the carrier density were admixed.

Next, the raw material mixture of this thermoelectric semiconductor material was melted by heating.

(Solidification step)

Next, this molten raw material mixture was solidified by uniaxial solidification to manufacture ingot material.

(Crushing step)

Next, this ingot was crushed using a stamping mill and ball mill etc. to form a powder of the ingot.

(Screening step)

Next, the grain size of the powder was made uniform by adjusting the grain size to powder of about 35 to 108 μm by supplying this ingot powder to 150 mesh and 400 mesh sieves and selecting the material left on the 400 mesh sieve.

(Hydrogen reduction step)

After screening, hydrogen reduction was performed by supplying a prescribed volume of powder into a glass ampoule of prescribed volume under vacuum evacuation, introducing hydrogen and sealing at 0.9 atmosphere, then conducting heat treatment for 10 hours in a 350° C. heating furnace. However, this hydrogen reduction step may be omitted.

(Sintering step)

Figure 27A:
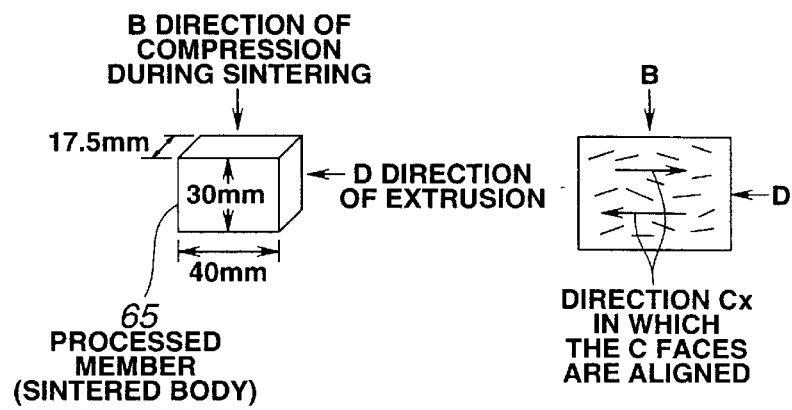
FIGS. 27(a), 27(b) and 27(c) are views used in explanation of the sintering step and extrusion step of an embodiment.

Next, pressurization and sintering were simultaneously performed using a hot pressing device on the above powdered raw material as shown in FIG. 27(a). Specifically, the powder raw material was introduced into a rectangular solid mold and this was compressed in the direction of arrow B to form a rectangular solid sintered body 65. The C faces constituting the basal faces of the hexagonal-structure crystals were then aligned in the perpendicular direction Cx with respect to the compression direction B.

Sintered body (pressure-sintered body) 65 is cut to a size of vertical, horizontal and depth dimensions of respectively 30 mm, 40 mm and 17.5 mm. in the drawing to match the size of the mold for insertion into the die (extrusion mold) 64 of extrusion molding device 60. It would also be possible to effect sintering using an extrusion mold of the same size as the die (extrusion mold) 64. In this case, the step of cutting to the size of the die (extrusion mold) 64 can be dispensed with.

Figure 27B:
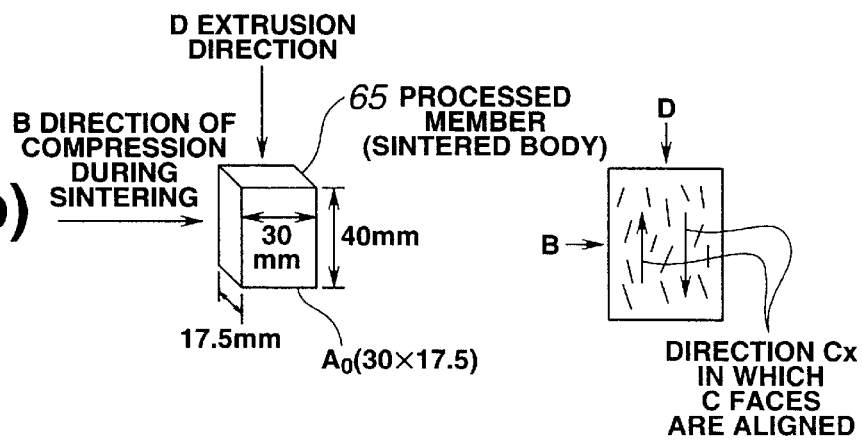

Next, as shown in FIG. 27(b), sintered body 65 is inverted by 90' so that it is in an attitude when sintering in which the compression direction B is the horizontal direction and the direction D in which extrusion is to be effected is the vertical direction.

In this attitude sintered body 65 is inserted in die (extrusion mold) 64 of extrusion molding device 10.

(Extrusion step)

The construction of the extrusion molding device 60 used in this extrusion step will now be described.

In general terms, as shown in FIG. 22, extrusion molding device 60 comprises: a punch 63 constituting a metal mold whereby a rectangular solid sintered body 65 of thermoelectric semiconductor material is molded and extruded into a rectangular solid shape of smaller cross-sectional area; a die 64 (hereinbelow called an extrusion mold); a base 67 that supports extrusion mold 64 and whereby an extrusion molded product 65' extruded from extrusion mold 64 can be extracted; and a slide 61 whereby punch 63 is moved vertically.

Slide 61 is driven for example by a hydraulic actuator (hydraulic cylinder). The amount of hydraulic pressure supplied to the hydraulic actuator is changed by controlling the degree of opening of a flow rate control valve, thereby changing the speed of vertical movement of slide 61 and consequently changing the speed of vertical movement of punch 63. In this embodiment, by lowering slide 61 in the direction of arrow D, punch 63 is lowered, thereby causing the sintered body 65 within extrusion mold 64 to be extruded. It would alternatively be possible to have an arrangement whereby sintered body 65 was extruded by vertical movement of the slide. The extrusion pressure created by punch 63 is measured load meter 62 and the extrusion displacement (descending displacement) produced by punch 63 is measured by displacement meter 68. A controller, not shown, inputs the measured value of load meter 62 and the measured value of displacement meter 68 and displays the relationship of displacement and load on a monitor screen.

Also, the controller monitors the relationship between the amount of change of the measured value of displacement meter 68 and lapsed time and the degree of opening of the flow rate control valve is controlled in accordance with the results of this monitoring such that punch 63 extrudes an extrusion molding 65' at a fixed extrusion rate. It would alternatively be possible to arrange that the relationship between the measured value of the displacement meter 68 and lapsed time was displayed on the monitor screen, the degree of opening of the flow rate control valve being adjusted by a manual operation by an operator such that punch 63 extrudes an extrusion molding 65' at a fixed extrusion rate.

This extrusion molding device 60 also serves as a heating device.

Extrusion mold 64 is a metal mold that surrounds the periphery of sintered body 65; further at the periphery of extrusion mold 64, there is arranged a heater 66 that heats sintered body 65 to a desired set temperature. Within extrusion mold 64, there is arranged a temperature sensor 75 (for example a thermocouple may be employed) that detects the temperature of sintered body 65. A controller, not shown, sets the temperature of sintered body 65 to a desired temperature by controlling the power supplied to heater 66 using the detected temperature of temperature sensor 75 as feedback signal.

Figure 27C:
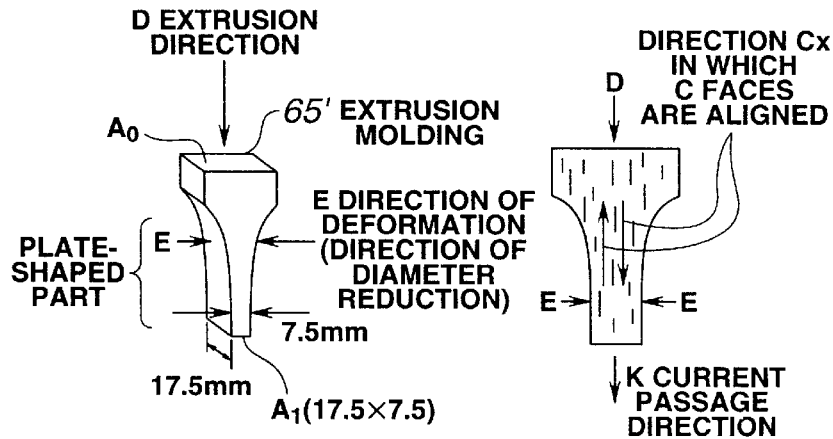
Figure 29:
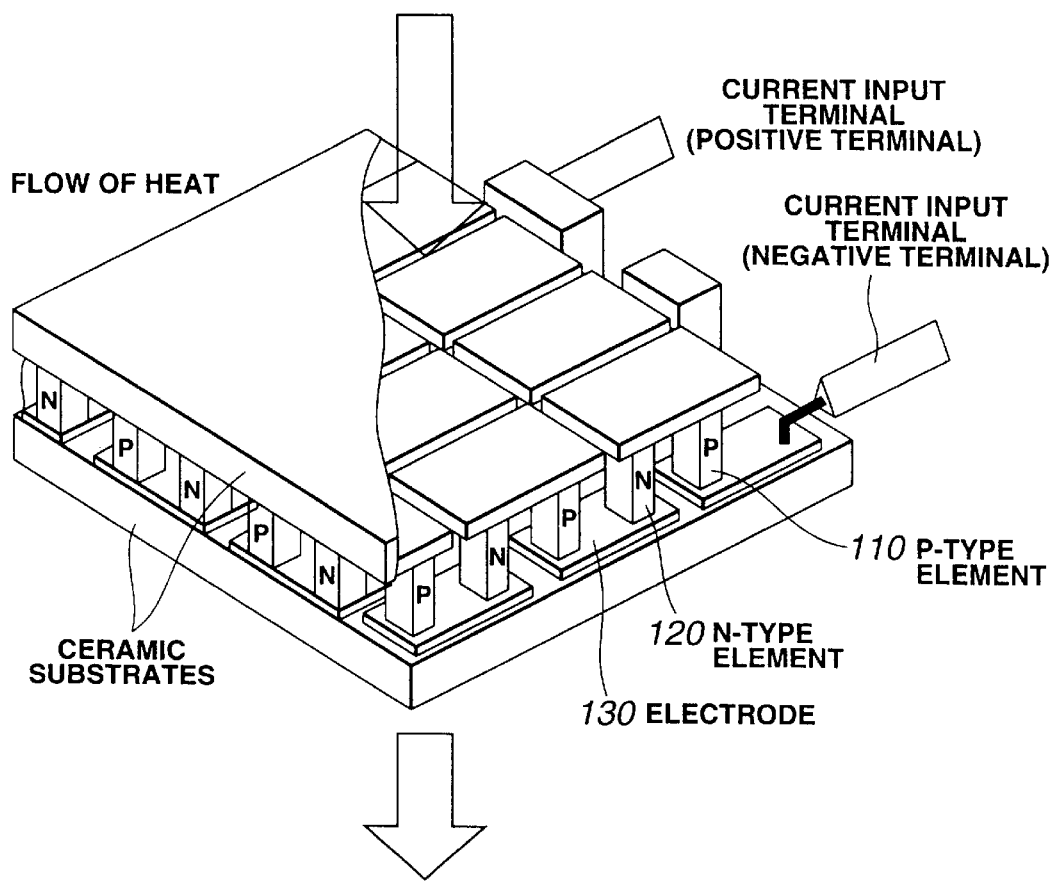
FIG. 29 is a perspective view showing the external appearance of a thermoelectric element (thermoelectric module)

Extrusion mold 64 is designed for example such that the die semi-angle is 15° and the extrusion ratio is 4. As shown in FIG. 27(c), the extrusion ratio here referred to is the ratio A0/A1(=4) of the cross-sectional area A0 of sintered body 65 prior to extrusion (30 mm×17.5 mm) and the cross-sectional area A1 (17.5 mm×7.5 mm) of the extrusion molding 65' after extrusion. The cross-sectional area means the area of the cross-section perpendicular to the extrusion direction D.

Extrusion mold 64 is of rectangular solid shape corresponding to rectangular solid sintered body 65 as shown in FIG. 23 and is provided with an extrusion port 64a of rectangular solid shape but whose cross-sectional area gradually decreases towards the outlet.

Figure 25:
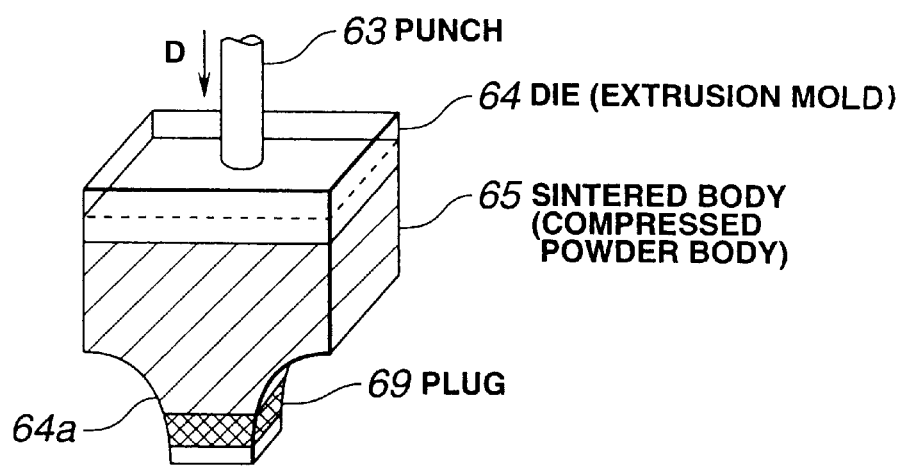
FIG. 25 is a perspective view showing an example of the construction of an extrusion molding device wherein the extrusion mold is plugged.

Punch 63 is a metal mold that abuts the head of cross-sectional area 0 (30 mm×17.5 mm) of sintered body 65 (see FIG. 25 and FIG. 27(b)).

Hereinbelow the way in which an extrusion molding 65' is manufactured by extrusion from a sintered body 65 by operation of extrusion molding device 60 will be described referring chiefly to FIG. 23 and FIG. 27(c).

Specifically, when rectangular solid sintered body 65 is introduced into extrusion mold 64, the power supplied to heater 66 is controlled so that it is raised in temperature to a set temperature (for example 40° C.). After the set temperature has been reached, punch 63 is inserted into extrusion mold 64 and held for example for 5 minutes in this condition until punch 63 has been raised in temperature to the set temperature. It should be noted that the set temperature in the extrusion step and the set temperature in the sintering step can be made the same or can be made somewhat different.

After this, descent of punch 63 is commenced, the degree of opening of the flow rate control valve being controlled such that extrusion molding 65' is extruded from extrusion mold 64 with a fixed extrusion rate (for example 0.5 mm/min).

In this way, extrusion force is applied in the extrusion direction D by punch 63 with respect to extrusion body 65 so that it is extruded from extrusion port 64a of extrusion mold 64, an extrusion molding 65' of rectangular solid shape with a cross-sectional area A1 of ¼ the cross-sectional area A0 prior to molding being thereby formed.

In this extrusion molding process, as shown in FIG. 23, rectangular solid sintered body 65, of the two axes E, F perpendicular to the extrusion direction D, is deformed in the direction of axis E coincident with compression direction B during sintering, whilst deformation in the direction of one axis F is restrained. That is, it is deformed from 30 mm to 7.5 mm in the transverse direction E of sintered body 65 whilst remaining at 17.5 mm in the depth direction F of sintered body 65, without being deformed.

In this way, for the extrusion molding of this embodiment, the method of "planar strain extrusion" is adopted. Planar strain extrusion means a method of extrusion molding in which, of two axes in directions perpendicular to the direction of extrusion, deformation of one axis if restrained and deformation takes place only on the other axis.

With this planar strain extrusion, as shown in FIG. 27(c) the C faces become more easily lined up in the direction Cx perpendicular to the direction E in which deformation is applied. The degree of alignment of the C faces is thereby enormously increased. Consequently, by making the direction in which the C faces are strongly aligned coincide with the direction in which current flows, the thermoelectric performance is enormously increased. Also, cracks etc. formed in the surface of extrusion molding 65' can be reduced by planar strain extrusion.

In addition, in this embodiment, sintered body 65 is deformed in the direction of axis E coincident with the compression direction B during the sintering step.

Consequently, the direction of lining up Cx of the C faces produced by compression in the sintering step of FIG. 27(a) and the extrusion step of FIG. 27(c) are coincident so, as a result, the C faces become even easier to line up. Consequently, the degree of alignment of the C faces is further improved. Thermoelectric performance is therefore further improved by making the direction in which the C faces are even more strongly aligned coincident with the direction K in which the current flows.

Although in this embodiment a sintering step was performed as the previous step to the extrusion step so that extrusion molding was performed on a sintered body 65, it is not necessarily essential that a sintered body 65 should be employed as the "thermoelectric semiconductor material" that is the substrate of the extrusion molding process in the extrusion step. It would be possible to perform sintering and extrusion concurrently by performing extrusion molding processing on a compressed powder body obtained by compressing a powder of thermoelectric semiconductor material without sintering it.

In this case, if deformation is applied by extrusion molding processing of a compressed powder body in the direction of axis E coincident with the direction of pressurization when forming the compressed powder body, an equivalent effect can be obtained to that obtained when deforming a sintered body 65 in the direction of axis E coincident with the direction of compression B during a sintering step.

However, the density ratio of the extrusion molding obtained by extrusion molding of compressed powder is smaller than that obtained by extrusion molding of a sintered body, with the result that cracks etc. easily form in the surface. Also the degree of alignment of the C faces is lower. It is therefore desirable to perform a consolidation step, to be described, in a subsequent step to the extrusion step, in order to raise the density of the extrusion molding and to increase the degree of alignment of the C faces.

Furthermore, it is possible to perform extrusion molding processing on a material obtained by mixing the raw materials of the thermoelectric semiconductor material, an ingot solidified by uniaxial solidification after heating and melting the mixed raw materials, ingot powder obtained by crushing an ingot, a press-sintered product obtained by pressing (powder compression) followed by sintering, or a hot forged product obtained by hot forging.

Next, a constructional example of an extrusion molding device that is ideal when an unsintered compressed powder body or thermoelectric semiconductor material powder is processed by extrusion molding without applying heat as a prior step to the extrusion step is illustrated in FIG. 25. In this case, a plug 69 is fitted into extrusion port 64a of extrusion mold 64. After this, the compressed powder body or powder of thermoelectric semiconductor material is introduced into extrusion mold 64. The provision of plug 69 prevents leakage of powder to the outside from extrusion port 64a. The extrusion molding is extruded together with plug 69 as punch 63 descends in the extrusion direction D.

It should be noted that a material that is deformed under the temperature in the extrusion step (for example aluminum material) could be used for plug 69. Also, it could be made of the same material as the compressed powder body etc. that is to be extruded.

Also, leakage of powder from extrusion port 64a may be prevented by sealing the compressed powder body etc. into a capsule before insertion into extrusion mold 64.

Also, this plug 69 may still be used when there is no risk of leakage of powder to the outside from extrusion port 64a, as when extruding a sintered body 65. In this case, extrusion molding 65' is extruded with plug 69 making contact with the under surface in the drawing of sintered body 65 as punch 63 descends in the extrusion direction D. As a result of plug 69 abutting the under surface of sintered body 65 in this way, the benefits are obtained that production of cracks in the surface of the leading face of extrusion molding 65' that is extruded is reduced to a minimum and the density ratio in the leading end part can be increased.

Also, instead of a plug 69 pressing against the under surface of sintered body 65, as shown in FIG. 26, a piston 70 could be used to positively push the under surface of sintered body 65 in the upwards direction.

Figure 26A:
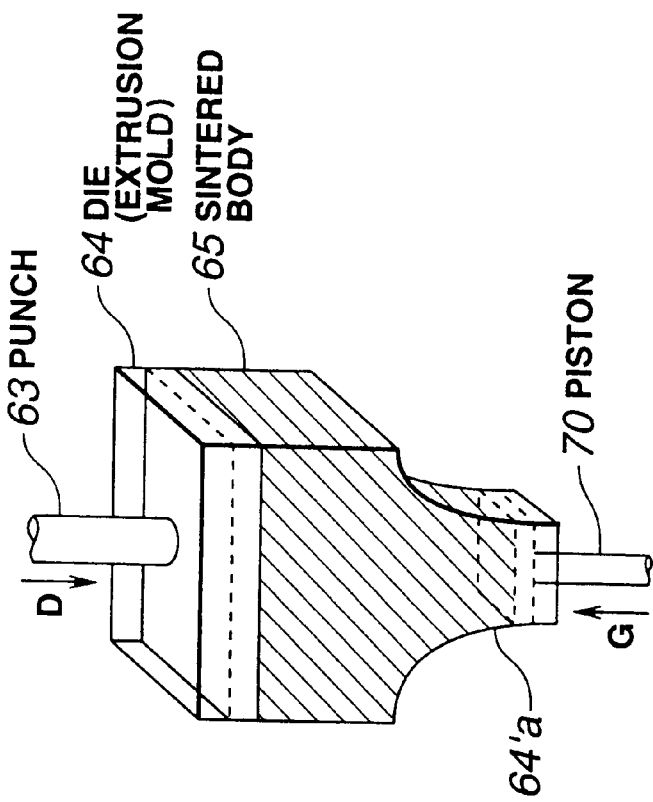
FIGS. 26(a) and 26(b) are perspective diagrams respectively showing constructional examples of an extrusion molding device in which a piston is inserted into the extrusion mold.

In the extrusion molding device shown in FIG. 26(a), piston 70 is freely slidably inserted within extrusion port 64'a of extrusion mold 64. In this case it is desirable that extrusion port 64'a should be long enough to permit sliding of piston 70.

Figure 26B:
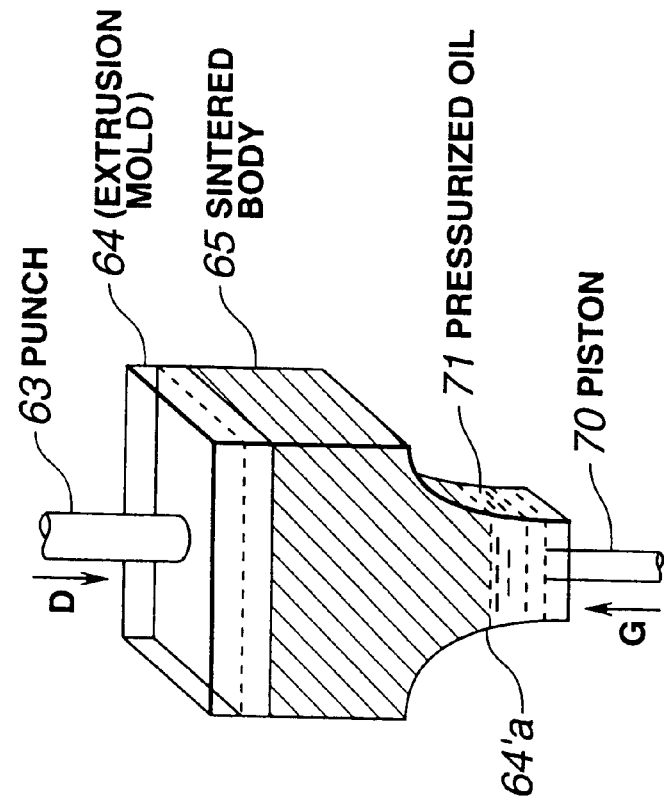

Downwards force D is then applied to sintered body 65 by punch 63. Simultaneously, by driving piston 70 by hydraulic pressure etc., upwards force G of a degree such as not to cause the sintered body 65 to rise is applied to sintered body 65. In this way, sintered body 65 descends and extrusion molding 65' is extruded whilst upwards force G is applied to sintered body 65 by the end face of piston 70. As a result, production of cracks in the surface of the end face of extrusion molding 65' when it is extruded is reduced to a minimum and the density ratio at the leading end part is raised. As shown in FIG. 26(a), the force generated by piston 70 may be applied directly to sintered body 65 or, as shown in FIG. 26(b), by providing pressurized oil 71 between piston 70 and sintered body 65, the force generated by piston 70 may be applied to the sintered body 65 through pressurized oil 71.

Figure 24:
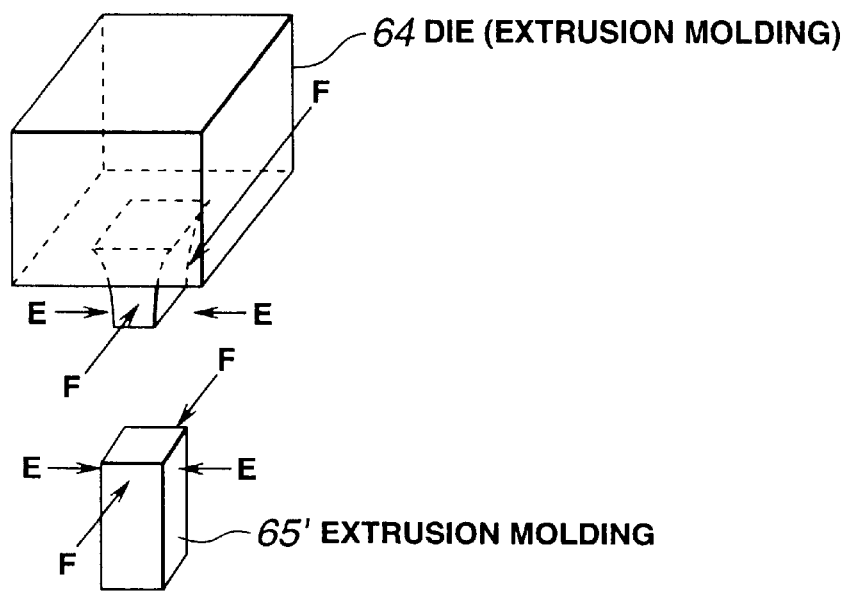
FIG. 24 is a perspective view showing the construction of an extrusion molding according to another embodiment.

Although in the embodiment described above the side faces of sintered body 65 were subjected to "planar strain extrusion" producing diameter reduction and deformation in only one axial direction E, as shown in FIG. 24, it would be possible to subject the side faces of sintered body 65 to diameter reduction and deformation in both of the two axial directions E and F.

Within the extrusion mold 64 shown in FIG. 24, rectangular solid sintered body 65 is subjected to plastic deformation whilst being subjected to external-force from both axial directions E and F. That is, an extrusion molding 65' whose cross-sectional area is uniformly reduced is formed whilst undergoing deformation in the transverse direction E and depth direction F of sintered body 65.

When extrusion is performed as shown in FIG. 24, just as in the case when planar strain extrusion is performed as shown in FIG. 23, the external force that is applied to the material 65 within metal mold 64 is greater than in the case of hot forging, and force can be easily applied to the entire material 65.

Consequently, destruction due to plastic deformation and dynamic recrystallization during molding occur satisfactorily, enabling finer crystal grains to be obtained than in the case of hot forging. Due to the increased fineness of the crystal grains, the thermal conductivity κ is lowered, improving the thermoelectric performance.

Also, the degree of application of external force is better than in the case of hot forging, making it easier to line up the C faces and so increasing anisotropy and making it possible to improve thermoelectric performance.

Also, in the case of hot forging, the deformation conditions are different at each location within the molding, producing variability in the distribution of thermoelectric properties, but, if extrusion molding is employed, there is little variability of the distribution of thermoelectric properties within the molding. Concomitantly with the reduction in variability of thermoelectric properties, the strength of the material is improved, as a result of which the yield in manufacture is improved.

Furthermore, since extrusion molding 65' is formed into rectangular solid shape, as shown in FIG. 28(b), it can be efficiently cut into rectangular solid thermoelectric elements 160. The yield on manufacture of thermoelectric elements 160 is therefore enormously improved. Also, since the surface of rectangular solid extrusion molding 65' is flat, the surface can very easily be ground by mechanical processing. Also, since extrusion molding 65 is a rectangular prism, as shown in 28(a), the extrusion molding can be inserted into a metal mold 73a for consolidation processing and consolidated.

Figure 30:
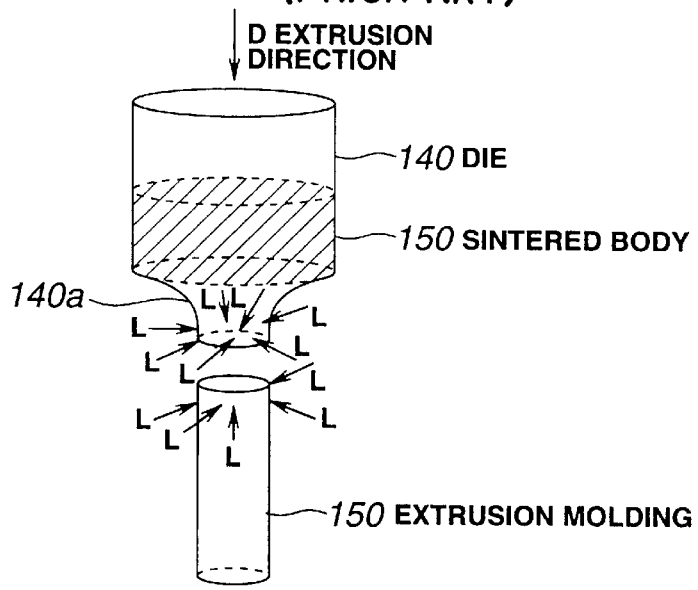
FIG. 30 is a perspective view showing the construction of a prior art extrusion mold.
Figure 31A:
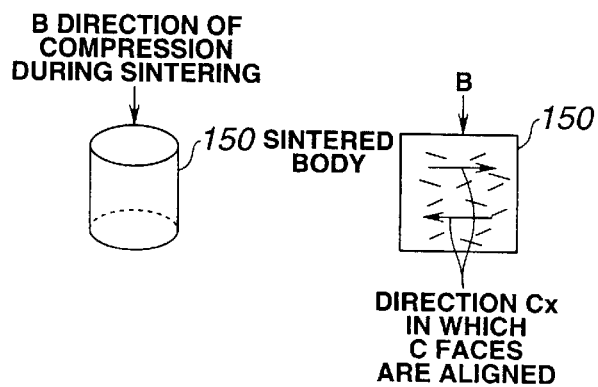
FIGS. 31(a) and 31(b) are views used in explanation of the sintering step and extrusion step of prior art extrusion molding processing.
Figure 31B:
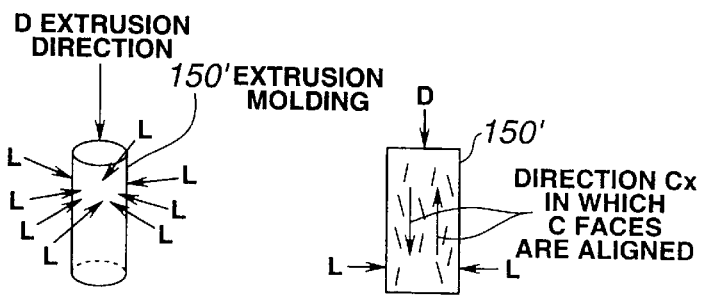

Thus, not only in the case of planar strain extrusion as shown in FIG. 23 but also in the case of extrusion as shown in FIG. 24, thermoelectric performance etc. can be improved compared with hot forging by making use of the advantages of extrusion molding. Furthermore, the problem that occurred with the prior art extrusion molding method (see FIG. 30), in which a cylindrical extrusion molding 150' was formed, is solved, enabling the yield when cutting out rectangular solid thermoelectric elements 160 to be increased, and making possible the provision of a surface grinding step and consolidation step.

(Consolidation step)

However, it is said that the density of extrusion moldings obtained by extrusion molding is not high.

Accordingly, density may be raised by performing a consolidation step as shown in FIG. 28(a) on the extrusion molding 65' obtained by the extrusion step. However, if the density of the extrusion molding 65' obtained in the extrusion step is sufficiently high, for a molding in which no cracks are generated at the surface and no gaps are found in the interior, such a consolidation step need not be performed.

As shown in FIG. 28(d) a consolidation step is a step in which an extrusion molding 65' is inserted into a die 73 and density is increased by compressing to some degree by sealed forging.

First of all, prior to the consolidation step, as shown in FIG. 27(c), from an extrusion molding 65' obtained by extrusion, plate-shaped portions of practically fixed cross-sectional area A1 (17.5 mm×7.5 mm) are cut out. Then, as shown in FIG. 28(a), an extrusion molding 65' that has been cut out as this plate shaped part is inserted into die 73.

Extrusion molding 65' is inserted into die 73 in an attitude with the deformation direction E during the extrusion step made to coincide with the compression direction H during the consolidation step.

As shown by the view in the direction of arrow I from above of die 73, if the size of mold 73a of die 73 and the size of extrusion molding 65' do not coincide, insertion can be effected into mold 73a with the insertion of spacers 74 at the periphery of extrusion molding 65'. In this way, deformation of extrusion molding 65' in the perpendicular direction with respect to the direction of compression H during compression can be prevented. Discarded sintered bodies 65 can be employed as spacers 74.

Extrusion molding 65' is compressed in mold 73a by pushing a punch 22 of the same shape as mold 73a downwards in the H direction. In the consolidation step of this embodiment, compression and heating are performed simultaneously. Extrusion molding 65' is thereby subjected to hot sealed forging processing.

The compression pressure was gradually increased from for example an initial pressure of 250 kgf/cm$^2$ to a final value of 500 kgf/cm$^2$. The temperature was set at 450° C.

By this hot sealed forging, gaps in the extrusion molding 65' are eliminated and cracks formed in the surface of extrusion molding 65' are reduced. Also, in this embodiment, extrusion molding 65' is compressed in a direction H coincident with the direction of deformation E during the extrusion step, Consequently, the directions Cx in which the C faces come to be lined up by compression in the consolidation step of FIG. 28(a) and the extrusion step of FIG. 27(c) come to be coincident and, as a result, the C faces are further lined up compared with prior to the consolidation step. The degree of alignment of the C faces is thereby further increased. Thus, as shown in FIG. 28(b), thermoelectric performance is further improved by making the direction in which the C faces are more strongly aligned and the direction K in which current flows coincide.

In this way, density is raised by a consolidation step of extrusion molding 65' causing cracks to be reduced, and an extrusion molding 65" can be obtained in which the C faces are more strongly aligned.

(Cutting step)

Next, as shown in FIG. 28(b), a rectangular solid thermoelectric element 160 is cut out from rectangular solid extrusion molding 65" after consolidation.

Thermoelectric element 160 is cut out to a rectangular solid shape of transverse, depth and vertical dimension in the Figure of respectively 4 mm, 3 mm and 2 mm. The transverse direction dimension of 4 mm of thermoelectric element 160 corresponds to extrusion direction D and the vertical direction dimension of 2 mm corresponds to the deformation direction E (diameter reduction direction). Ten thermoelectric elements 160 are cut out in each of τa, τb and τc of extrusion molding 65". Thermoelectric elements 160 are cut out at intervals S from tip 65"a of extrusion molding 65".

The density ratio, Seebeck coefficient α, resistivity τ, power factor and anisotropy of the resistivity τ of these rectangular solid elements 160 were then measured. In order to determine the thermoelectric performance, the current flowing in element 160 was taken as a direction K (=extrusion direction D) perpendicular to the direction of deformation E during the extrusion step and the direction of compression H during the consolidation step.

Here, the "density ratio" means the ratio between the density (compressed powder density) of the thermoelectric semiconductor material after consolidation and the true density (ideal density) of a single crystal of the same composition as the thermoelectric semiconductor material after consolidation. Also, the anisotropy ratio is a value indicating the directionality of the resistance; larger values of this indicate a marked effect of improvement of the crystal alignment. Also, the power factor is a value obtained by dividing the square of the Seebeck coefficient α by the resistivity τ and multiplying by 0.1. Large values of this indicate better thermoelectric performance.

Figure 32:
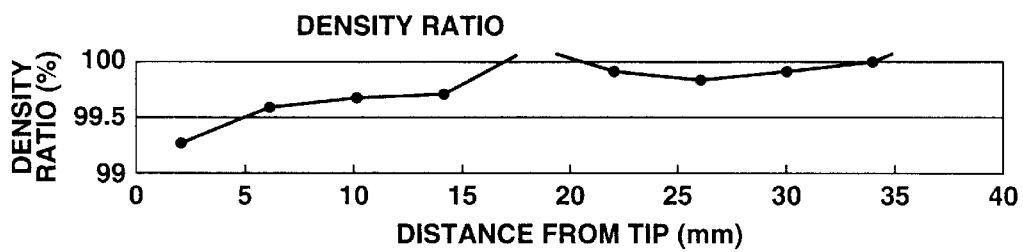
FIG. 32 is a graph showing the relationship between the distance from the tip and density ratio of an extrusion molded product.

FIG. 32 is a graph showing the relationship between density ratio and distance S (the thermoelectric elements 160 each being cut at distance intervals S) from the tip 65"a of extrusion molding 65". FIG. 32 shows the density ratio of thermoelectric elements 160 cut from τa of extrusion molding 65". FIG. 32 shows the density ratio of thermoelectric element 160 cut out from τa of extrusion molding 65".

Figure 33:
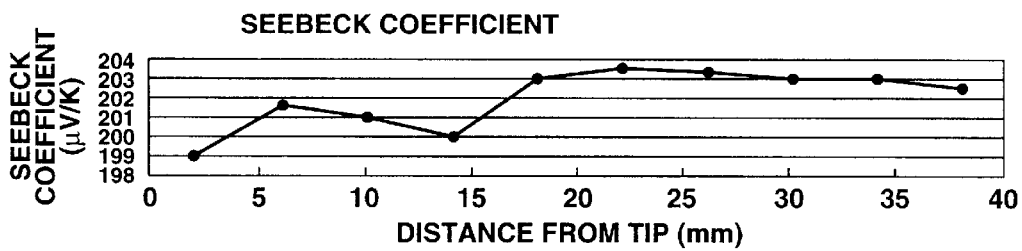
FIG. 33 is a graph showing the relationship between distance from the tip and Seebeck coefficient of an extrusion molded product.

Likewise, FIG. 33 is a graph showing the relationship between the distance S (thermoelectric elements 160 cut out at respective distance intervals S) from the tip 65"a of extrusion molding 65" and the Seebeck coefficient α. FIG. 33 shows the Seebeck coefficient α of a thermoelectric element 160 cut out from τa of extrusion molding 65".

Figure 34:
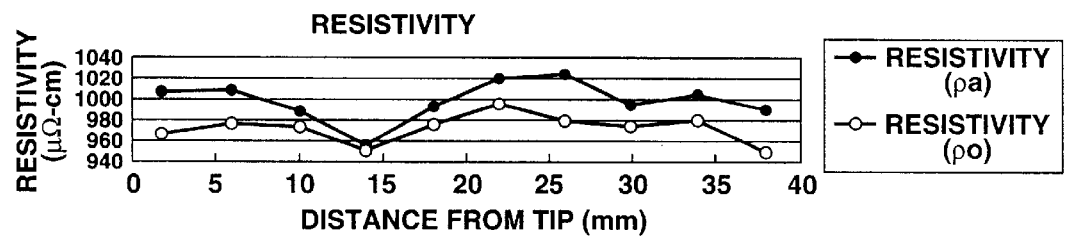
FIG. 34 is a graph showing the relationship between distance from the tip and resistivity of an extrusion molded product.

FIG. 34 is a graph showing the relationship between distance S (thermoelectric elements 160 cut out at respective distance intervals S) from the tip 65"a of extrusion molding 65" and the resistivity τ. FIG. 34 shows the resistivity τ (this is shown by black circles) of thermoelectric elements 160 cut out from τc of extrusion molding 65" and the resistivity τ (this is shown by white circles) of thermoelectric elements 160 cut out from τa of extrusion molding 65".

Figure 35:
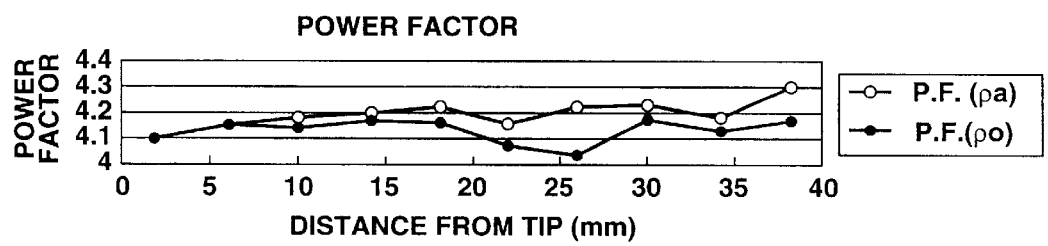
FIG. 35 is a graph showing the relationship between distance from the tip and power factor of an extrusion molded product.

Likewise, FIG. 35 is a graph showing the relationship between distance S (thermoelectric elements 160 cut out respective distance intervals S) from the tip 65"a of extrusion molding 65" and the power factor. FIG. 35 shows the power factor (this is indicated by black circles) of thermoelectric elements 160 cut out from τc of extrusion molding 65" and the power factor (this is indicated by white circles) of thermoelectric elements 150 cut out from rectangular extrusion molding 65".

Figure 36:
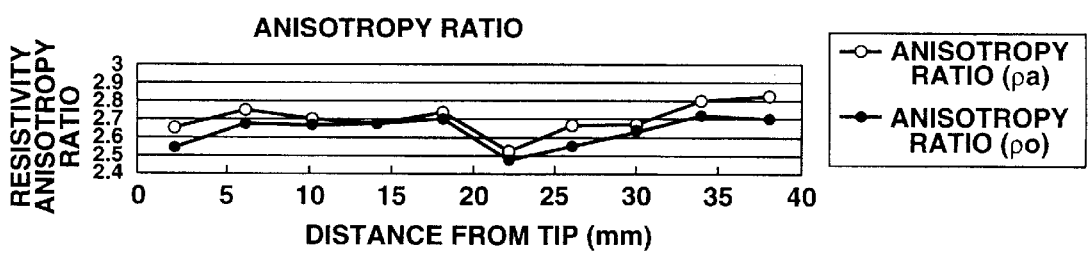
FIG. 36 is a graph showing the relationship between distance from the tip and the anisotropy ratio of the resistivity of an extrusion molded product.

Likewise FIG. 36 is a graph showing the relationship between distance S (thermoelectric elements 160 cut out at respective distance intervals S) from the tip 65"a of extrusion molding 65" and the anisotropy ratio of the resistivity τ. FIG. 15 shows the resistivity anisotropy ratio (this is shown by black circles) of thermoelectric elements 160 cut out from τc of extrusion molding 65" and the resistivity anisotropy ratio (this is indicated by white circles) of thermoelectric elements 160 cut out from τa of extrusion molding 65".

These FIGS. 32 to 36 are described below.

Density ratio

The density of a thermoelectric element 160 is found from the ratio of mass and volume obtained from external dimensions, by measuring the mass and measuring the external dimensions of a cut-out element 160. The density ratio is found from the ratio of the thus-found density and the ideal density (true density) found by calculation.

A fully satisfactory density ratio (evaluation standard 99% or more) was obtained in the entire extrusion molding 65", the density ratio being an average of 99.7% and the variability between distance intervals S being the minimum. Specifically, in general, when the density ratio is low the thermal conductivity falls, but the thermoelectric performance falls because the electrical resistance increases. The material strength also falls. Thus, it is preferably for the density ratio to be high so that the thermoelectric performance is improved while the material strength is also not impaired. Regarding hot forged products, the present applicants obtained the result (Japanese patent application No. 2110624/1997) that material strength is ensured and thermoelectric performance is improved if the density ratio is 97% or more. The density ratio is at minimum 99.25%; not only does this satisfy the standard for hot forged products (97%) but it also satisfies the evaluation standard (99%).

Seebeck coefficient α

The Seebeck coefficient a was measured using a measurement device that measured the e.m.f generated when a temperature difference of 10° C. was applied to opposing faces of an element 160.

Resistivity τ

The resistance was measured with an AC 4-terminal resistance meter by soldering copper plate electrodes to opposing faces of an element 160. The resistivity τ was found from the element dimensions measured in order to find the density, and the measured resistance value.

Power factor

The power factor was calculated from the Seebeck coefficient α and resistivity τ measured as above.

Anisotropy ratio of resistivity τ

As shown in FIG. 28(e), the resistivity a obtained by passing current in the same direction K as the extrusion direction D was measured and the resistivity c obtained by passing current in the same direction J as the deformation direction E (diameter reduction direction) during extrusion molding; the anisotropy ratio was taken as the ratio of these resistivities.

Overall evaluation

The measured values (calculated values) of all of the density ratio, Seebeck coefficient α, power factor and resistivity anisotropy ratio show a tendency to fall as the vicinity of the end 65"a of extrusion molding 65" is approached.

However, if extrusion molding is performed with a prescribed member such as a plug or piston pressed against the leading end face of sintered body 65 during extrusion molding, as shown in FIG. 25, FIGS. 26(a) and (b), the drop of the density ratio and power factor etc. in the vicinity of leading end 65"a of extrusion molding 65" can be reduced to a minimum.

Next, FIG. 37 to FIG. 40 show the results of comparing for each temperature the thermoelectric characteristic of an extrusion molding 65" and the thermoelectric characteristic of a hot forged product.

Figure 37:
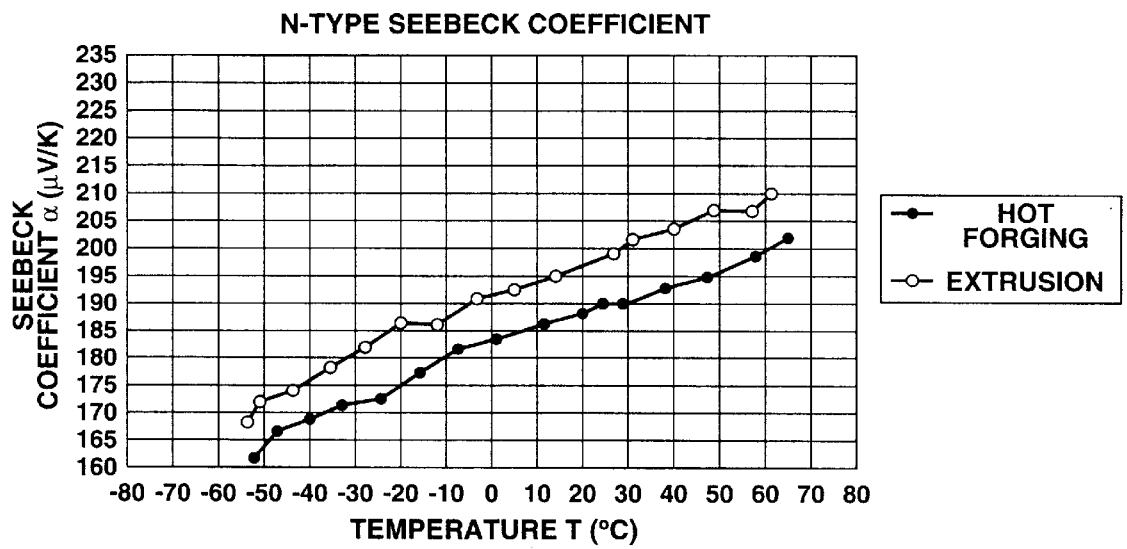
FIG. 37 is a graph showing the relationship between temperature and Seebeck coefficient and is a graph comparing an extrusion molded product and hot forged product.

FIG. 37 is a graph showing the relationship of temperature T and Seebeck coefficient α. The hot forged product is indicated by black circles and the extrusion molding is indicated by white circles.

Figure 38:
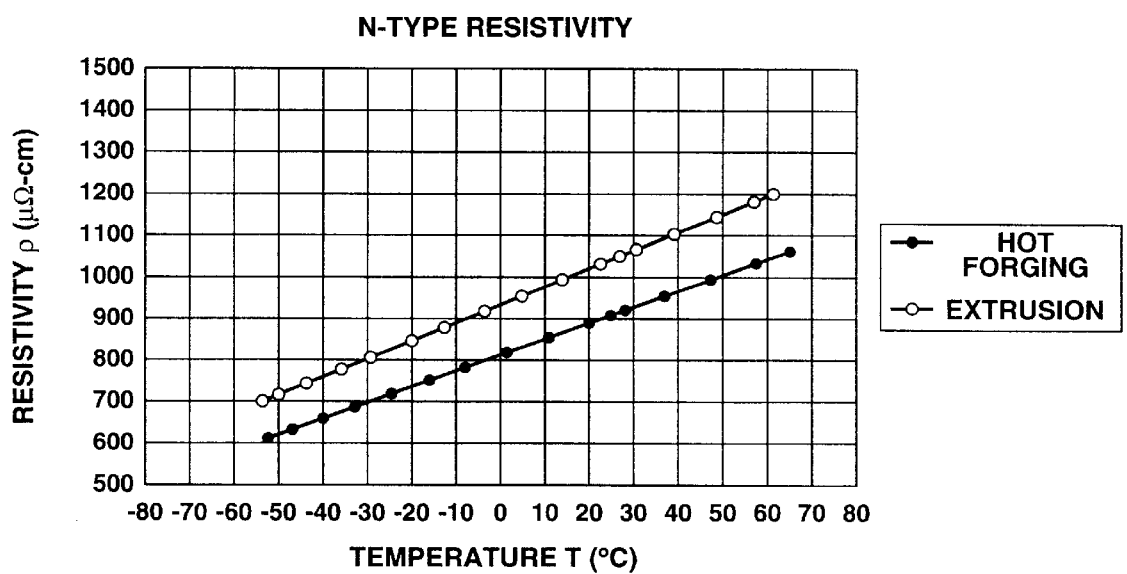
FIG. 38 is a graph showing the relationship between temperature and resistivity, and is a graph comparing an extrusion molded product and a hot forged product.
Figure 39:
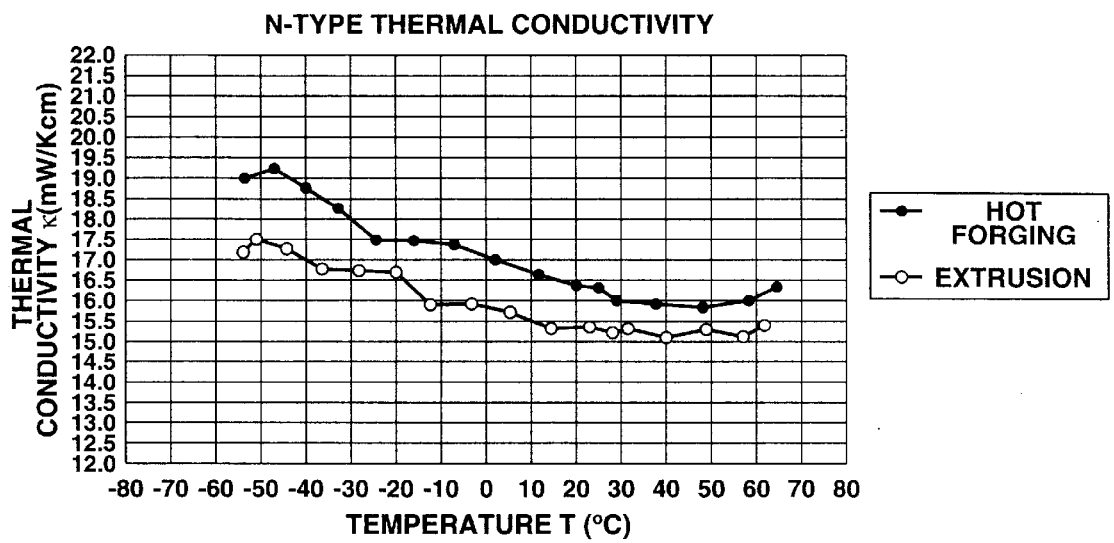
FIG. 39 is a graph showing the relationship between temperature and thermal conductivity and is a graph comparing an extrusion molded product and a hot forged product.
Figure 40:
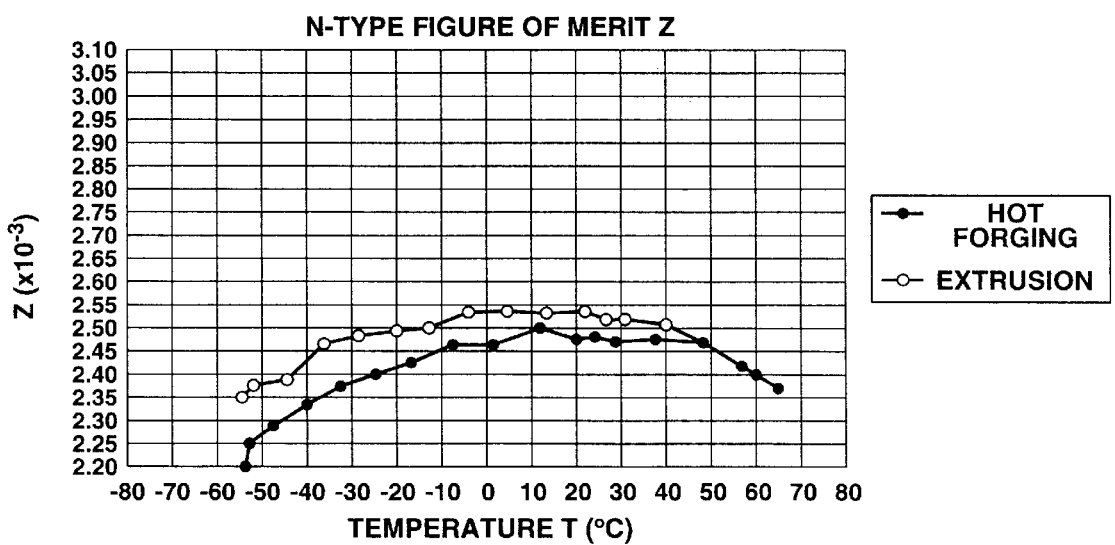
FIG. 40 is a graph showing the relationship between temperature and figure of merit and is a graph comparing an extrusion molded product and a hot forged product.

Likewise, FIG. 38 is a graph showing the relationship of temperature T and resistivity τ, FIG. 39 is a graph showing the relationship of temperature T and thermal conductivity κ, and FIG. 40 is a graph showing the relationship between temperature T and figure of merit Z.

The following Table shows the results of comparing the thermoelectric performances in the vicinity of room temperature of 27° C. of an extrusion molding 65" and hot forged product and pressure-sintered product (hot pressed product).

TABLE 3

Comparison of thermal electric characteristics
of the various methods of forming

| N-TYPE | Thermal Conductivity κ (mW/Kcm) | Anisotropy Ratio | Resistivity ρ ($\mu\Omega$-cm) | Seebeck Coefficient α ($\mu$V/K) | Figure of Merit Z ($\times 10^{-3}$/K) |
|---|---|---|---|---|---|
| Hot pressing | 15.01 | 1.78 | 1170 | 198.0 | 2.27 |
| Hot forging | 16.02 | 2.50 | 915 | 190.1 | 2.47 |
| Extrusion | 15.13 | 2.70 | 1048 | 199.8 | 2.52 |

The data are data in the vicinity of room temperature of 27° C.

The hot forged product (hot pressed product) and pressurized sintered product (hot forged product) were manufactured as follows.

Specifically, a pressurized sintered product that was hot pressed (pressure-sintered) was manufactured by a hot pressing device at a temperature of 500° C. and compression force of 100 Mpa, using crushed classified powder 64 of thermoelectric semiconductor material of the same composition as extrusion molding 65". This pressure-sintered product (hot pressed product) was cut into rectangular prisms and the thermal conductivity κ, anisotropy ratio of resistivity ρ, resistivity ρ, Seebeck coefficient α and figure of merit Z were measured and calculated. This was designated as the "hot pressing" in the Table above.

A hot forged product was manufactured by subjecting crushed classified powder 64 of thermoelectric semiconductor material of the same composition as above to hot pressing as described above, followed by hot forging at a temperature of 450° C. and a compressive force of 100 Mpa. This forged product was cut into rectangular prisms, and the thermal conductivity κ, anisotropy ratio of resistivity ρ, resistivity ρ, Seebeck coefficient α and figure of merit Z were measured and calculated. This was designated as the "hot forging" in the above Table.

For this hot-press molded product and hot forging molded product also, the direction of current flow in the element for purposes of measuring the thermoelectric performance was taken as the direction perpendicular to the direction of compression.

In the above Table "extrusion" refers to data for an element 160 cut from extrusion molding 65".

As is shown by these Figures and Table, the Seebeck coefficient α and anisotropy ratio of resistivity ρ of extrusion molding 65" show larger values than those of the pressure-sintered product (hot pressed product), and hot forged product (see FIG. 37). Also, the thermal conductivity κ of extrusion molding 65" shows a larger value than that of the hot forged product (see FIG. 39).

Also, the resistivity ρ of extrusion molding 65" shows a lower value than that of the pressure-sintered product.

In regard to the above, extrusion molding 65" shows superior thermoelectric performance to that of the conventional method of forming and, as a result, the figure of merit Z shows a value exceeding that of the pressure-sintered product (hot pressed product) or hot forged product (see FIG. 40).

It is desirable that the temperature characteristic of the figure of merit Z of a thermoelectric module of $Bi_2Te_3$ based thermoelectric semiconductor material should show a maximum value in the vicinity of room temperature (27° C.) and furthermore that this value should be a high value. The figure of merit Z of a thermoelectric element 160 obtained f tom the extrusion product 65" of this embodiment has a maximum value in the vicinity of room temperature and furthermore shows a high value (2.52) (see FIG. 40).

Figure 41:
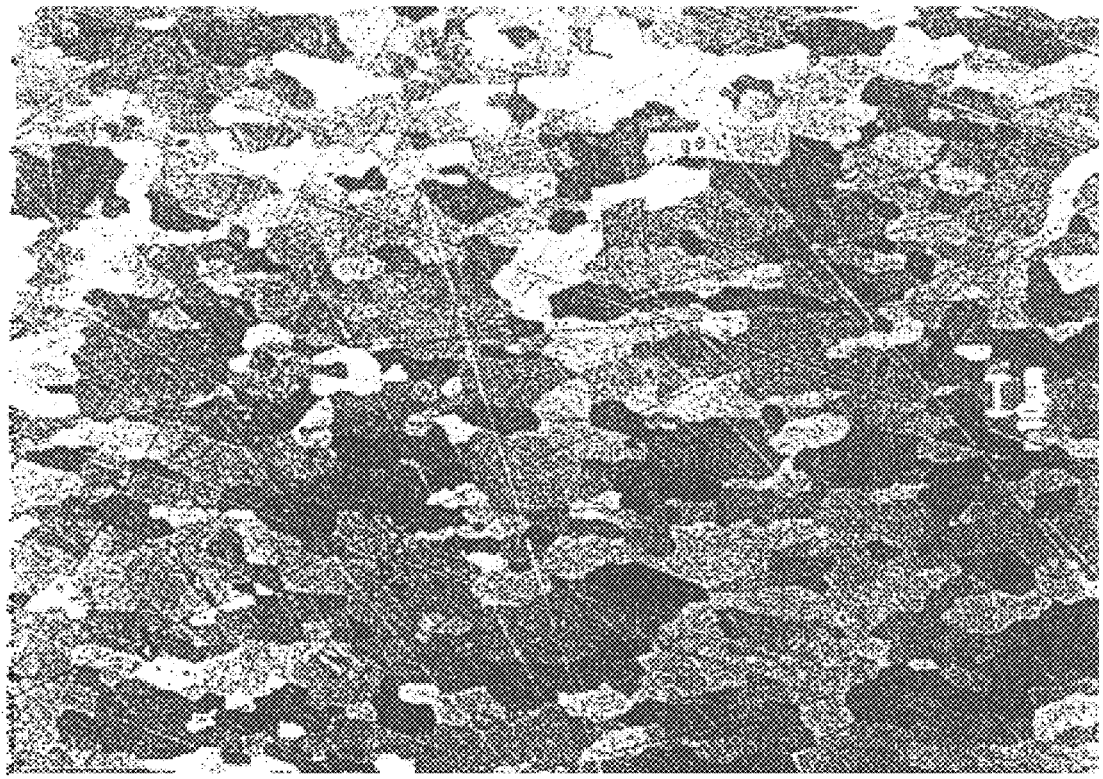
FIG. 41 is a photomicrograph taken at a magnification of about 400 times of the structure of a hot forged product.
Figure 42:
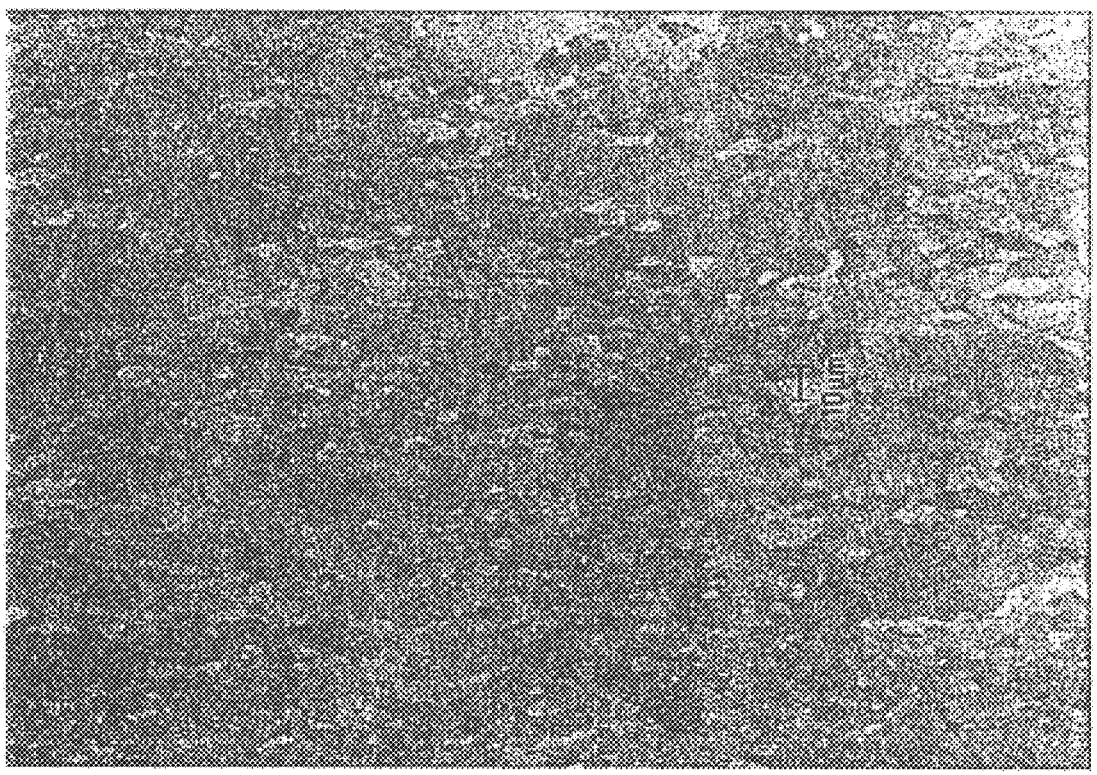
FIG. 42 is a photomicrograph taken at a magnification of about 400 times of the structure of an extrusion molded product.

FIG. 42 shows a photograph obtained by observing the structure of an extrusion molding 65" (N-type) using a polarizing microscope. For purposes of comparison, FIG. 41 shows a photograph (magnification 400 times) obtained by observing the structure of a hot forged product (N-type) using a polarizing microscope.

Comparing these photographs, it can be seen that, in the structure of the molding 65" produced by extrusion molding, the crystal grain size is much smaller than in the case of the structure of the forged product, being of the order 2 to 5 $\mu$m, which is extremely fine. It can be seen that this increased fineness of the structure increases the thermal conductivity κ. Also, owing to the fine structure, the mechanical strength is higher than that of the hot forged product.

Although in the present embodiment as $Bi_2Te_3$ based semiconductor material $Bi_2Te_{2.7}Se_{0.30}$ was assumed, the important point is that this is applicable to any composition that can be expressed by $Bi_{2-x}Sb_xTe_{3-y-z}Se_yS_x$ ($0 \leq x \leq 2$, $0 \leq y+z \leq 3$). Impurities may also be present in the crystals.

Likewise, application is also possible to BiSb based semiconductor materials, application being possible to any material that can be expressed by $Bi_{1-x}Sb_x$ ($0<x<1$). Impurities may also be present in the crystals as dopants.

Furthermore, isotropic thermoelectric materials (for example PbTe-based, Si—Ge-based, or $CoSb_3$-based thermoelectric materials) could also be used.

What is claimed is:

1. A method of manufacturing a thermoelectric semiconductor material or element by applying pressure to a semiconductor material including crystal grains of a laminar structure chemical compound, wherein said pressure application is performed from at least three directions orthogonal to one axis.

2. The method of manufacturing a thermoelectric semiconductor material or element according to claim 1, wherein the pressure application is performed simultaneously in respect of all of side faces of a material periphery of said semiconductor material.

3. The method of manufacturing a thermoelectric semiconductor material or element according to claim 1, wherein the pressure application causes a free erection alignment of said crystal grains.

4. The method of manufacturing a thermoelectric semiconductor material or element claim 1, wherein said semiconductor material is a spherical powder manufactured by quench solidification.

5. A method of manufacturing a thermoelectric semiconductor material or element comprising:
   a step of restraining a movement along one axis of the semiconductor material including crystal grains of a laminar structure chemical compound; and
   a step of applying pressure from at least three directions orthogonal to one axis.

6. A method of manufacturing a thermoelectric module comprising:
   a step of forming P type and N type thermoelectric elements by applying pressure to a semiconductor material including crystal grains of a laminar structure chemical compound from at least three directions orthogonal to one axis; and a step of forming a pair of electrodes located on the one axis at an upper surface and lower surface of said P type and N type thermoelectric semiconductor elements.

7. A method of manufacturing a thermoelectric semiconductor material or element in which a pre-molding containing crystal grains of a laminar structure chemical compound is extruded from a die, wherein:

said pre-molding comprises a plurality of crystal grains with their C faces in erect alignment along one axis; and said extrusion is performed with said one axis of said pre-molding and an extrusion direction of the pre-molding made to coincide.

8. The method of manufacturing a thermoelectric semiconductor material or element according to claim 7, wherein pressure is applied to said pre-molding from at least three directions orthogonal to said one axis.

9. The method of manufacturing a thermoelectric semiconductor material or element according to claim 7, wherein said pre-molding is formed by laminating thin powder manufactured by a quench rolling method and the extrusion is performed by making coincide a lamination axis of said thin powder and said extrusion direction.

10. The method of manufacturing a thermoelectric semiconductor material or element claim 7, wherein said pre-molding is formed by applying pressure to a spherical powder manufactured by a quench solidification method.

11. A method of manufacturing a thermoelectric semiconductor material or element by extruding a pre-molding containing crystal grains of a laminar structure chemical compound from a die, wherein:

said pre-molding comprises a plurality of crystal grains with their C faces in erect alignment along one axis and with these C faces directed along another axis orthogonal to this one axis; and said extrusion is performed with said one axis of said pre-molding made to be coincident with a extrusion direction of the pre-molding and pressure applied in a direction parallel with said other axis of the pre-molding.

12. A method of manufacturing a thermoelectric semiconductor material or element comprising:

a step of restraining movement along one axis of semiconductor material containing crystal grains of a laminar structure chemical compound;

a step of forming a pre-molding by applying pressure to said semiconductor material from at least three directions orthogonal to said one axis in a condition with said movement restrained; and a step of introducing said pre-molding into a die and extruding along said one axis.

13. A method of manufacturing a thermoelectric module comprising:

a step of forming a pre-molding by applying pressure to a semiconductor material containing laminar structure chemical compound crystals, from at least three directions orthogonal to one axis;

a step of forming P type and N type thermoelectric semiconductor elements by introducing said pre-molding into a die and extruding along said one-axis; and a step of forming a pair of electrodes positioned on said one axis oil an upper surface and a lower surface of said P type and N type thermoelectric semiconductor elements.

14. A method of manufacturing a thermoelectric semiconductor material including an extrusion step wherein C faces of crystals constituting a structure are aligned in an extrusion direction by forming a rectangular solid extrusion molding by extruding from an extrusion mold by the application of pressure to a thermoelectric semiconductor material having a desired structure.

15. A method of manufacturing a thermoelectric semiconductor material including an extrusion step wherein C faces of crystals constituting a structure are aligned in a direction in which deformation is applied by forming a rectangular solid extrusion molding by applying pressure to a thermoelectric semiconductor material having a desired composition and extruding from an extrusion mold with deformation in the direction of one of two axes perpendicular to the extrusion direction while restricting deformation in the direction of the other one of the two axes.

16. The method of manufacturing a thermoelectric semiconductor material according to claim 15 further comprising a step of consolidation in which the C faces of crystals constituting the structure are aligned in a direction perpendicular to the direction of pressure application and a density of said extrusion molding is raised by pressure application in an axial direction coincident with the axial direction in which deformation is applied in said extrusion step.

17. A method of manufacturing a thermoelectric semiconductor material including:

a step of pressure application to form a compressed powder body or a sintered body of the thermoelectric semiconductor material by applying pressure to the thermoelectric semiconductor material having a desired composition; and an extrusion step wherein C faces of crystals constituting a structure are aligned in a direction perpendicular to a direction in which deformation is applied, by forming a rectangular solid extrusion molding by extruding from an extrusion mold with pressure applied to said compressed powder body or said sintered body while restraining deformation in one axial direction of two axes perpendicular to the extrusion direction and effecting deformation in an axial direction coincident with the direction of pressure application in said pressure application step.

18. A method of manufacturing a thermoelectric element comprising:

an extrusion step in which C faces of crystals constituting a structure are aligned in an extrusion direction by forming a rectangular solid extrusion molding by extruding from an extrusion mold by application of pressure with respect to a thermoelectric semiconductor material having a desired structure; and a thermoelectric element formation step wherein a rectangular solid thermoelectric element is formed wherein current flows in said extrusion direction from said rectangular solid extrusion molding.

19. A method of manufacturing a thermoelectric element comprising:

an extrusion step wherein C faces of crystals constituting a structure are aligned in a direction perpendicular to a direction in which deformation is applied by forming a rectangular solid extrusion molding by extruding from an extrusion mold with pressure applied to a thermoelectric semiconductor material having a desired composition with deformation restrained in one axial direction of two axes perpendicular to the extrusion direction, deformation being effected in the other axial direction; and a thermoelectric element formation step wherein a rectangular solid thermoelectric element is formed wherein current flows in a direction perpendicular to the direction in which said deformation was applied from said rectangular solid molding.

20. The method of manufacturing a thermoelectric element according to claim 19 further comprising a consolidation step wherein the C faces of crystals constituting the structure are aligned in a direction perpendicular to the direction in which pressure was applied and the density of said extrusion molding is raised by applying pressure in an axial direction coincident with the axial direction in which deformation is applied in said extrusion step.

21. A method of manufacturing a thermoelectric element comprising:
   a compression step of forming a compressed powder body or sintered body of a thermoelectric semiconductor material by application of pressure to the thermoelectric semiconductor material having a desired composition;
   an extrusion step wherein C faces of crystals constituting a structure are aligned in a direction perpendicular to that in which deformation was applied by forming a rectangular solid molding by extruding from an extrusion mold with pressure applied to said compressed powder or said sintered body with deformation restrained in one axial direction of two axes perpendicular to the extrusion direction, deformation being effected in an axial direction coincident with the direction of pressure application in said pressure application step; and
   a step of forming a thermoelectric element wherein a rectangular solid thermoelectric element is formed in which current flows from said rectangular solid extrusion molding in a direction perpendicular to the direction in which said deformation was applied.

22. A thermoelectric semiconductor material formed as an extrusion molding of rectangular solid shape in which C faces of crystals constituting a structure are aligned in an extrusion direction by extruding from an extrusion mold with application of pressure to the thermoelectric semiconductor material having a prescribed composition.

23. A thermoelectric semiconductor material formed as an extrusion molding of rectangular solid extrusion in which C faces of crystals constituting a structure are aligned in a direction perpendicular to a direction in which deformation was applied, by extruding from an extrusion mold with pressure applied to the thermoelectric semiconductor material having a desired composition with deformation restrained in one axial direction of two axes perpendicular to the extrusion direction, deformation being effected in the other axial direction.

24. A thermoelectric semiconductor material formed as an extrusion molding of rectangular solid shape with C faces of crystals constituting a structure aligned in a direction perpendicular to a direction in which deformation was applied, by forming a compressed powder body or sintered body of the thermoelectric semiconductor material by applying pressure to the thermoelectric semiconductor material having a prescribed composition, further applying pressure to said compressed powder body or said sintered body, and extruding from an extrusion mold with deformation restrained in one axial direction of two axes perpendicular to the extrusion direction, deformation being effected in an axial direction coincident with a direction in which pressure was applied in said pressure application step.

25. A thermoelectric element wherein an extrusion molding of rectangular solid shape is formed with C faces of crystals constituting a structure aligned in an extrusion direction and in rectangular solid shape such that current flows in said extrusion direction from said rectangular solid extrusion molding, by extruding from an extrusion mold with application of pressure to the thermoelectric semiconductor material having a desired composition.

26. A thermoelectric element formed in rectangular solid shape wherein an extrusion molding of rectangular solid shape is formed with C faces of crystals constituting a structure aligned in a direction perpendicular to a direction in which deformation was applied and such that current flows in a direction perpendicular to the direction of application of said deformation from said rectangular solid extrusion molding by extruding from an extrusion mold by applying pressure to the thermoelectric semiconductor material having a desired composition with deformation of one of two axes perpendicular to the extrusion direction being restrained while deformation is effected in the other axial direction.

27. A thermoelectric element formed in rectangular solid shape wherein an extrusion molding of rectangular solid shape is formed with C faces of crystals constituting a structure aligned in a direction perpendicular to a direction in which deformation was applied and such that current flows in a direction perpendicular to the direction of application of said deformation from said rectangular solid extrusion molding by extruding from an extrusion mold by forming a compressed powder body or sintered body of a thermoelectric semiconductor material by applying pressure to the thermoelectric semiconductor material having a desired composition, and further applying pressure to said compressed powder body or said sintered body with deformation of one of two axes perpendicular to the extrusion direction being restrained while deformation is effected in an axial direction coincident with the direction of application of pressure.

28. A device for manufacturing a thermoelectric semiconductor material comprising:
   means for pressure application that applies pressure to the thermoelectric semiconductor material having a desired composition; and
   an extrusion mold in which an extrusion molding of rectangular solid shape is extrusion-molded by restraining deformation in one axial direction of two axes perpendicular to a direction in which pressure is applied by said means for pressure application, whilst deformation is effected in the other axial direction.

* * * * *